(12) United States Patent
Cheng et al.

(10) Patent No.: US 9,458,353 B1
(45) Date of Patent: Oct. 4, 2016

(54) ADDITIVES FOR ORIENTATION CONTROL OF BLOCK COPOLYMERS

(71) Applicant: International Business Machines Corporation, Armonk, NY (US)

(72) Inventors: Joy Cheng, Taipei (TW); Anindarupa Chunder, San Jose, CA (US); Daniel P. Sanders, San Jose, CA (US); Melia Tjio, San Jose, CA (US); Ankit Vora, San Jose, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/687,834

(22) Filed: Apr. 15, 2015

(51) Int. Cl.
| | |
|---|---|
| *C09D 169/00* | (2006.01) |
| *C09D 125/08* | (2006.01) |
| *C08L 69/00* | (2006.01) |
| *C08L 25/08* | (2006.01) |
| *C08G 64/18* | (2006.01) |
| *C08F 220/22* | (2006.01) |
| *H01L 21/3105* | (2006.01) |
| *H01L 21/308* | (2006.01) |
| *H01L 21/02* | (2006.01) |
| *C09D 133/16* | (2006.01) |
| *C09D 127/12* | (2006.01) |
| *B81C 1/00* | (2006.01) |

(52) U.S. Cl.
CPC ......... *C09D 169/00* (2013.01); *B81C 1/00523* (2013.01); *C08F 220/22* (2013.01); *C08G 64/18* (2013.01); *C08L 25/08* (2013.01); *C08L 69/00* (2013.01); *C09D 125/08* (2013.01); *C09D 127/12* (2013.01); *C09D 133/16* (2013.01); *H01L 21/02118* (2013.01); *H01L 21/3081* (2013.01); *H01L 21/31058* (2013.01); *B81C 2201/0149* (2013.01)

(58) Field of Classification Search
None
See application file for complete search history.

(56) References Cited

U.S. PATENT DOCUMENTS

| | | | | |
|---|---|---|---|---|
| 4,557,562 | A | * 12/1985 | Ohmori | ........ C08F 220/22 385/145 |
| 7,056,840 | B2 | 6/2006 | Miller et al. | |
| 8,034,365 | B2 | 10/2011 | Baluca | |
| 8,247,033 | B2 | 8/2012 | Russell et al. | |

(Continued)

OTHER PUBLICATIONS

Nederberg, Organocatalytic Ring Opening Polymerization of Trimethylene Carbonate; Biomacromolecules 2007 vol. 8 pp. 153-160.*

(Continued)

*Primary Examiner* — David Buttner
(74) *Attorney, Agent, or Firm* — Michael R. Roberts

(57) ABSTRACT

A film layer comprising a high-chi ($\chi$) block copolymer for self-assembly and a surface active polymer (SAP) was prepared on a substrate surface that was neutral wetting to the domains of the self-assembled block copolymer. The block copolymer comprises at least one polycarbonate block and at least one other block (e.g., a styrene-based block). The SAP comprises a hydrophobic fluorinated first repeat unit and a non-fluorinated second repeat unit bearing at least one pendent OH group present as an alcohol or acid (e.g., carboxylic acid). The film layer, whose top surface has contact with an atmosphere, self-assembles to form a lamellar or cylindrical domain pattern having perpendicular orientation with respect to the underlying surface. Other morphologies (e.g., islands and holes of height 1.0Lo) were obtained with films lacking the SAP. The SAP is preferentially miscible with, and lowers the surface energy of, the domain comprising the polycarbonate block.

34 Claims, 22 Drawing Sheets

(56) References Cited

U.S. PATENT DOCUMENTS

| | | |
|---|---|---|
| 8,314,181 B2 | 11/2012 | Lin et al. |
| 8,628,855 B2 | 1/2014 | Hao et al. |
| 8,734,904 B2 | 5/2014 | Cheng et al. |
| 2014/0273476 A1 | 9/2014 | Cheng et al. |

OTHER PUBLICATIONS

Zhou, et al., "Synthesis and properties of novel biodegradable triblock copolymers of poly(5-methyl-5-methoxycarbonyl-1,3-dioxan-2-one) and poly(ethylene glycol)", Polymer 45 (2004) 5459-5463.

* cited by examiner

1. Coat
2. Optional PAB

1. Coat
2. Optional PAB

Self-Assemble

Selective Domain Removal

Transfer

Selective Domain Removal

Transfer

Example 70

Example 71

Example 72

Example 73

Example 74

Example 75  Example 76

Example 77

Example 79

Example 86

Example 87

Example 88

Example 89

Example 93

Example 94         Example 95

ADDITIVES FOR ORIENTATION CONTROL OF BLOCK COPOLYMERS

BACKGROUND

The present invention relates to additives for orientation control of block copolymers used in directed self-assembly applications, and more specifically to random copolymer additives comprising non-fluorinated hydrogen-bond donating repeat units and fluorinated non-hydrogen-bond donating repeat units for top orientation-control of high-chi ($\chi$) block copolymers containing a polycarbonate block.

Block copolymers (BCPs) find many applications in solution, bulk and thin films. Thin film applications of BCPs are particularly attractive for nanolithography and patterning due to the ability of some BCPs to form periodic self-assembled structures ranging in feature size from 5 nm to 50 nm. The thin-film self-assembly property of BCPs can be utilized with existing photolithographic techniques to provide a unique approach to long range order for semiconductor applications. This approach, called directed self-assembly (DSA) of block copolymers, promises to extend the patterning capabilities of conventional lithography.

BCPs for directed self-assembly (DSA) applications comprise two or three polymer blocks that can phase separate into domains characterized by ordered nanoscopic arrays of spheres, cylinders, gyroids, and lamellae. The ability of a BCP to phase separate depends on the Flory Huggins interaction parameter chi ($\chi$). Poly(styrene)-block-poly (methyl methacrylate), abbreviated as PS-b-PMMA, is the most widely used block copolymer for DSA. For PS-b-PMMA, the poly(styrene) block (PS) and the poly(methyl methacrylate) block (PMMA) have similar surface energies at the polymer-air interface. In this instance, annealing a thin layer of the BCP, which is disposed on an orientation control layer, induces phase separation to produce BCP domains that are perpendicularly oriented to the orientation control layer. Typically, for PS-b-PMMA the orientation control layer is a crosslinkable or brush-type random copolymer formed with styrene and methyl methacrylate. The neutral wetting properties of the orientation control layer (underlayer) can be controlled by adjusting the composition of styrene and methyl methacrylate in order to enable perpendicular orientation of the BCP lamellar domains.

The minimum half-pitch of PS-b-PMMA is limited to about 10 nm because of the lower interaction and interaction parameter chi ($\chi$) between PS and PMMA. To enable further feature miniaturization, a block copolymer having a high interaction parameter between two blocks (high chi block copolymer) is desirable. Several block copolymers having higher interaction parameters between the two blocks have been studied to obtain smaller feature sizes. Of particular interest are block copolymers comprising a block derived from ring opening of a cyclic carbonyl monomer from a reactive end-group on the first polymer block. Block copolymers formed by ring opening polymerization (ROP) of cyclic monomers (e.g., lactides, lactones, ethylene oxide) have been used to generate sub-10 nm feature sizes for patterning applications.

As the interaction parameter between the two blocks of the block copolymer increases, neutral underlayer properties alone may not be sufficient for forming perpendicularly oriented block copolymer domains due to the increased mismatch between the polymer-air surface energies of the two blocks. This causes parallel orientation of the block copolymer domains with only the lower surface energy block present at the polymer-air interface, rendering the thin-film undesirable for lithographic applications. Top-coat based orientation control strategies have been employed to control the surface energy at the polymer-air interface of the blocks. However, these strategies introduce additional process complexity in the integration of high-chi block copolymers into standard lithography processes.

There exists a need to develop a top-coat free method for perpendicularly orienting block copolymer domains of a high-chi block copolymer with sub-10 nm half-pitch.

SUMMARY

A composition is disclosed, comprising:
i) a solvent;
ii) a block copolymer comprising:
a) a first block comprising a repeat unit of formula (B-1):

wherein I) $R^w$ is a monovalent radical selected from the group consisting of H, methyl, ethyl, and trifluoromethyl (*—$CF_3$) and II) $R^d$ is a monovalent radical comprising an aromatic ring linked to carbon 1, and
b) an aliphatic polycarbonate second block (polycarbonate block) linked to the first block; and
iii) a surface active polymer (SAP), comprising:
about 40 mol % to about 90 mol %, based on total moles of monomers used to prepare the SAP, of a fluorinated repeat unit (first repeat unit), wherein the first repeat unit has a chemical structure having no functionality capable of donating a hydrogen to form a hydrogen bond,
about 10 mol % to about 60 mol %, based on total moles of monomers used to prepare the SAP, of a non-fluorinated second repeat unit comprising a functional group selected from the group consisting of alcohols, carboxylic acids, phosphonic acids, and sulfonic acids;
wherein
the block copolymer and the SAP are dissolved in the solvent.

Also disclosed is a method, comprising:
providing a first layered structure comprising a top layer (underlayer);
disposing the composition of claim 1 on the underlayer and removing any solvent, thereby forming a second layered structure comprising a film layer disposed on the underlayer, wherein the film layer comprises the block copolymer and the SAP in non-covalent association, and the film layer has a top surface in contact with an atmosphere; and
allowing or inducing the block copolymer of the film layer to self-assemble, thereby forming a third layered structure comprising a phase separated domain pattern having a characteristic pitch Lo, the domain pattern comprising alternating domains comprising respective chemically distinct blocks of the block copolymer;
wherein
each of the domains has contact with the underlayer and the atmosphere, and
a domain comprising the polycarbonate block has a higher concentration of the SAP compared to a domain comprising the first block of the block copolymer.

Another method is disclosed, comprising:

providing a first layered structure comprising a top layer (underlayer);

forming a topographical resist pattern disposed on the underlayer, the resist pattern comprising features having recessed regions, the recessed regions having a bottom surface which is a portion of a surface of the underlayer;

disposing the composition of claim 1 substantially in the recessed regions of the resist pattern and removing any solvent, thereby forming a second layered structure comprising a film layer, the film layer comprising the block copolymer and the SAP, wherein the film layer is in contact with the bottom surface, the bottom surface is neutral wetting to the block copolymer, and the film layer has a top surface in contact with an atmosphere; and allowing or inducing the block copolymer to self-assemble, thereby forming a third layered structure comprising a pattern of phase separated domains (domain pattern) of the block copolymer in the recessed regions, wherein each of the domains is in contact with the bottom surface and the atmosphere, and each of domains is oriented perpendicular to a main plane of the underlayer.

Also disclosed is a surface active polymer (SAP) of formula (H-5):

$$E'\text{-}P'\text{-}E'' \qquad (H\text{-}5),$$

wherein

E' is a first end group,

E" is a second end group, and

P' is a polymer chain consisting essentially of:

i) first repeat units selected from the group consisting of:

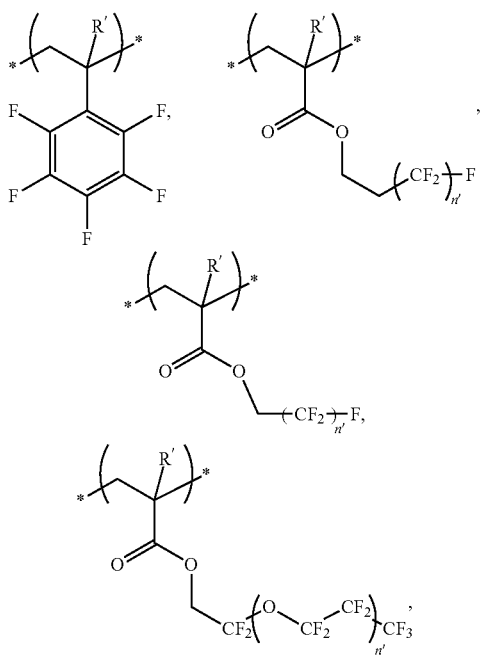

and combinations thereof, wherein each R' is independently selected from the group consisting of hydrogen (*—H), methyl (*-Me), ethyl (*-Et), and trifluormethyl (*—CF$_3$), and each n' is an independent integer having a value of 1 to 12, and ii) second repeat units selected from the group consisting of

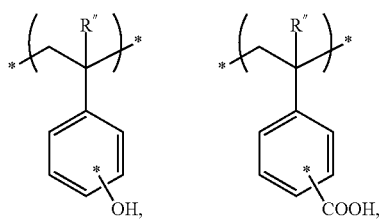

and combinations thereof, wherein each R" is independently selected from the group consisting of *—H, *-Me, *-Et.

The above-described and other features and advantages of the present invention will be appreciated and understood by those skilled in the art from the following detailed description, drawings, and appended claims.

DETAILED DESCRIPTION

Figure 1A:
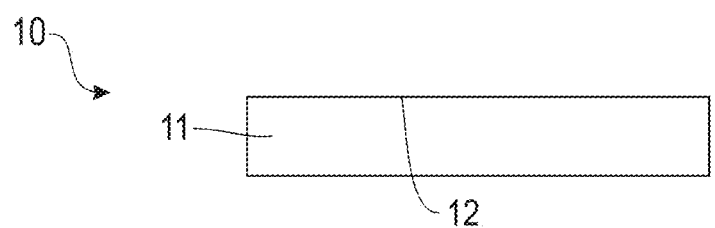
FIGS. 1A to 1F are cross-sectional layer diagrams showing a process of forming a perpendicularly oriented lamellar domain pattern using a self-assembly layer (SA layer) comprising a disclosed high-chi block copolymer comprising a polycarbonate block and a disclosed surface active polymer (SAP). The underlayer is neutral wetting to the block copolymer.
Figure 1B:
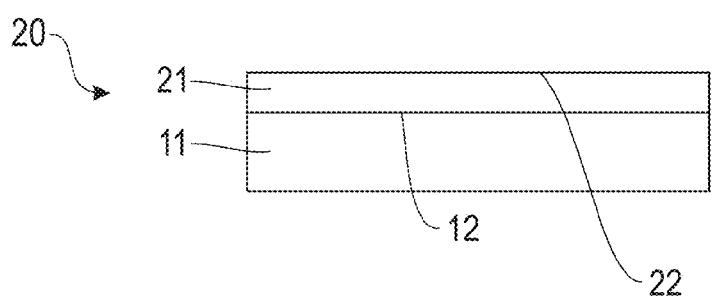

Disclosed are phase-selective and surface active polymers (SAPs) for lithographic processes utilizing self-assembly of block copolymers. The SAPs are also referred to below as "polymer additives". The SAPs provide orientation control of phase domains formed by self-assembly of high-chi block copolymers (BCPs) comprising a polycarbonate block. "High-chi" means the BCPs have a large Flory-Huggins interaction parameter chi ($\chi$). The higher the chi parameter, the poorer the miscibility of the different BCP blocks with one another, and the sharper the phase boundaries separating the phase domains containing the different blocks after self-assembly of the BCP. The SAPs are preferentially soluble in the polycarbonate domain formed by self-assembly (i.e., the domain comprising the polycarbonate block of the block copolymer). The SAPs also lower the surface energy of the polycarbonate domain compared to an otherwise identical polycarbonate domain lacking the SAP, thereby allowing the polycarbonate domain to wet the atmosphere interface resulting in lamellae and cylinders having a perpendicular orientation with respect to the main plane of the substrate.

Herein, an "atmosphere" is a gas, which can include air and/or one or more other gases at any suitable pressure in contact with the top surface of the SA layer.

Herein, "non-fluorinated" means the chemical formula of a referenced material contains no fluorine. The referenced material can be a sub-structure of a polymer such as a repeat unit. A material is "fluorinated" if the chemical formula of the material contains one or more fluorines. A material described as containing one or more "fluorines", "fluorine groups", or "fluoride groups" herein means the material has a chemical structure in which one or more monovalent fluorine atoms are covalently bound to carbon(s) of the chemical structure.

An "SA material" is a material capable of self-assembling into compositionally different phase-separated domains. Self-assembly (SA) refers to a process in which the SA material undergoes phase separation to produce a pattern of immiscible solid phase domains under suitable conditions. Self-assembly can occur spontaneously upon formation of the SA layer, or self-assembly can be induced (e.g., by annealing an SA layer comprising an SA material at an elevated temperature for a suitable period of time). The SA material is preferably a block copolymer (BCP).

A block copolymer for self-assembly comprises at least two blocks that are immiscible with each other. Non-limiting block copolymers include diblock and triblock copolymers. Self-assembly of the block copolymer occurs by phase separation of the blocks to form a pattern of segregated solid phase domains. Depending on the volume fraction of the blocks, the domains can have the form of lamellae, spheres, cylinders, and/or gyroids. As an example, self-assembly of a diblock copolymer can produce a domain pattern comprising a first lamellar domain containing substantially a first block A of the diblock copolymer and a second lamellar domain containing substantially a second block B of the diblock copolymer. In this instance, the first and second lamellar domains are linked by the covalent bond joining block A to block B of the block copolymer.

Herein, an "SA layer" is a layer comprising an SA material and an SAP. The SA layer is disposed on a top surface of a substrate. The SA layer can comprise other materials.

Herein, any material of the top surface of the substrate that has contact with the bottom of the SA layer is referred to generally as "underlayer material" or "orientation control material". A layer comprising underlayer material is an "underlayer" or "orientation control layer". The underlayer surface influences self-assembly of an SA material of the SA layer.

A surface is said to have a "preferential affinity for" or is "preferential to" a referenced domain of a self-assembled SA material if the referenced domain can wet the surface in preference to another domain of the self-assembled SA material. Otherwise, the surface is said to be "non-preferential" to the referenced domain.

The substrate is the layered structure on which the SA layer is disposed. The substrate has a main plane, which is parallel to the bottom-most layer of the substrate. The substrate can comprise one or more layers of materials arranged in a stack, more specifically materials used in the fabrication of semiconductor devices. As non-limiting examples, the substrate can include a bottom layer (e.g., silicon wafer, metal foil), hard mask layer, dielectric layer, metal oxide layer, silicon oxide layer, silicon nitride, titanium nitride, hafnium oxide, an anti-reflection layer (ARC), and/or an orientation control layer (underlayer) for self-assembly. The SA layer is disposed on the top surface of the substrate, which is typically the top surface of the orientation control layer. When a resist pattern is formed on the orientation control layer, the substrate includes the resist pattern. In this instance, the SA layer can be disposed in the trenches of the resist pattern.

The top surface of the substrate can be a "graphoepitaxial pre-pattern" or a "chemical pre-pattern" for self-assembly. Each type of pre-pattern can be composed of topographical features, such as in a resist pattern. A graphoepitaxial pre-pattern influences self-assembly by the topography and surface properties of the pre-pattern. A "chemical pre-pattern" influences self-assembly predominantly by way of the surface properties of different regions of the pre-pattern. No sharp dimensional limits exist between these two pre-pattern categories because the extent of topographical influence on self-assembly is also dependent on the thickness of the SA layer in relation to the underlying relief surface, as well as the annealing conditions (time and temperature) used for self-assembly. In general, however, when graphoepitaxial pre-patterns are used, the thickness of the SA layer is less than or equal to the height of the topographical features of the pre-pattern. For chemical pre-patterns, the SA layer thickness is greater than any height of the underlying topographical features of the pre-pattern.

The term "interface" refers to a contact boundary between two substantially immiscible phases. Each phase can, independently, be a solid, a liquid, or a gas.

A lamellar or cylindrical domain can be oriented parallel or perpendicular to the plane of the underlying orientation control layer (underlayer) or the main plane of the SA layer. A lamellar domain has a parallel orientation when the main plane or plate of the lamellar domain is oriented parallel to the main plane of the underlying surface (or SA layer). A lamellar domain has a perpendicular orientation when the main plane or plate of the lamellar domain is oriented perpendicular to the main plane of the underlying surface (or SA layer). A cylindrical domain has a parallel orientation when the cylinder axis is oriented parallel to the main plane of the underlying surface (or SA layer). A cylindrical domain has a perpendicular orientation when the cylinder axis is oriented perpendicular to the main plane of the underlying surface (or SA layer).

Domain orientation can also be expressed relative to the main plane of the substrate. A lamellar domain has a parallel orientation when the main plane or plate of the lamellar domain is oriented parallel to the main plane of the substrate. A lamellar domain has a perpendicular orientation when the main plane or plate of the lamellar domain is oriented perpendicular to the main plane of the substrate. A cylindrical domain has a parallel orientation when the cylinder axis is oriented parallel to the main plane of the substrate. A cylindrical domain has a perpendicular orientation when the cylinder axis is oriented perpendicular to the main plane of the substrate.

Perpendicular orientation of lamellar domains is desirable for forming high resolution line patterns by selective etching of a given lamellar domain. Parallel orientation is not desirable for forming high resolution line patterns.

The term "disposed" refers to a layer in contact with a surface of another layer. "Disposing" or "applying" refer to forming a layer to be in contact with a surface of another layer, without limitation as to the method employed unless otherwise stated, with the proviso that the desirable characteristics of the disposed or applied layer are obtained, such as uniformity and thickness.

The term "casting" refers to forming a layer of a material by disposing on a surface a solution of the material dissolved in a solvent, and removing the solvent.

Random copolymers are indicated by "-co-", or "-r-" in the name. Block copolymers are indicated by "-b-" or "-block-" in the name. Alternating block copolymers are indicated by "-alt-" in the name.

Herein, "symmetrical wetting" means the underlayer surface and the atmosphere interface are wetted by the same domain(s) of the self-assembled SA material. "Non-symmetrical" wetting means the underlayer surface and the atmosphere interface are wetted by different domain(s) of the self-assembled SA material.

Herein, a surface or an atmosphere interface is said to be "neutral" to an SA material, or "neutral wetting" with respect to an SA material if each domain of the self-assembled SA material has contact with the surface or the atmosphere interface after self-assembly. Otherwise, the surface or atmosphere interface is said to be "non-neutral" to the SA material. For example, an underlayer surface is "neutral wetting" to a block copolymer if after self-assembly each domain of the self-assembled block copolymer has contact with the underlayer surface. It should be understood that each domain of the self-assembled SA material can comprise SAP, and each domain can have a different concentration of SAP after self-assembly. A neutral underlayer surface allows orientation control but does not guide the lateral spatial arrangement of the self-assembled domains. A non-neutral underlayer surface can guide self-assembly. For purposes of the invention, it is desirable for the underlayer and the atmosphere to be neutral wetting to the domains formed by self-assembly of the SA layer comprising the SA material and the SAP.

For commercial purposes, the underlayer surface and the atmosphere interface must be non-preferential (neutral) to the SA material in order to obtain perpendicularly oriented lamellar domains when no other chemical or topographical features are available to influence self-assembly of the block copolymer. If only one interface is neutral to the SA material, the lamellar domains orient parallel to the underlayer surface to form an island/hole morphology having 0.5Lo ("L nought") step height. "Step height" refers to height difference relative to the surrounding SA material and Lo is the characteristic pitch (bulk periodicity) of the domains of the self-assembled SA material. The higher the chi parameter of the SA material, the smaller the potential Lo (pitch) of the domain pattern.

Figure 30:
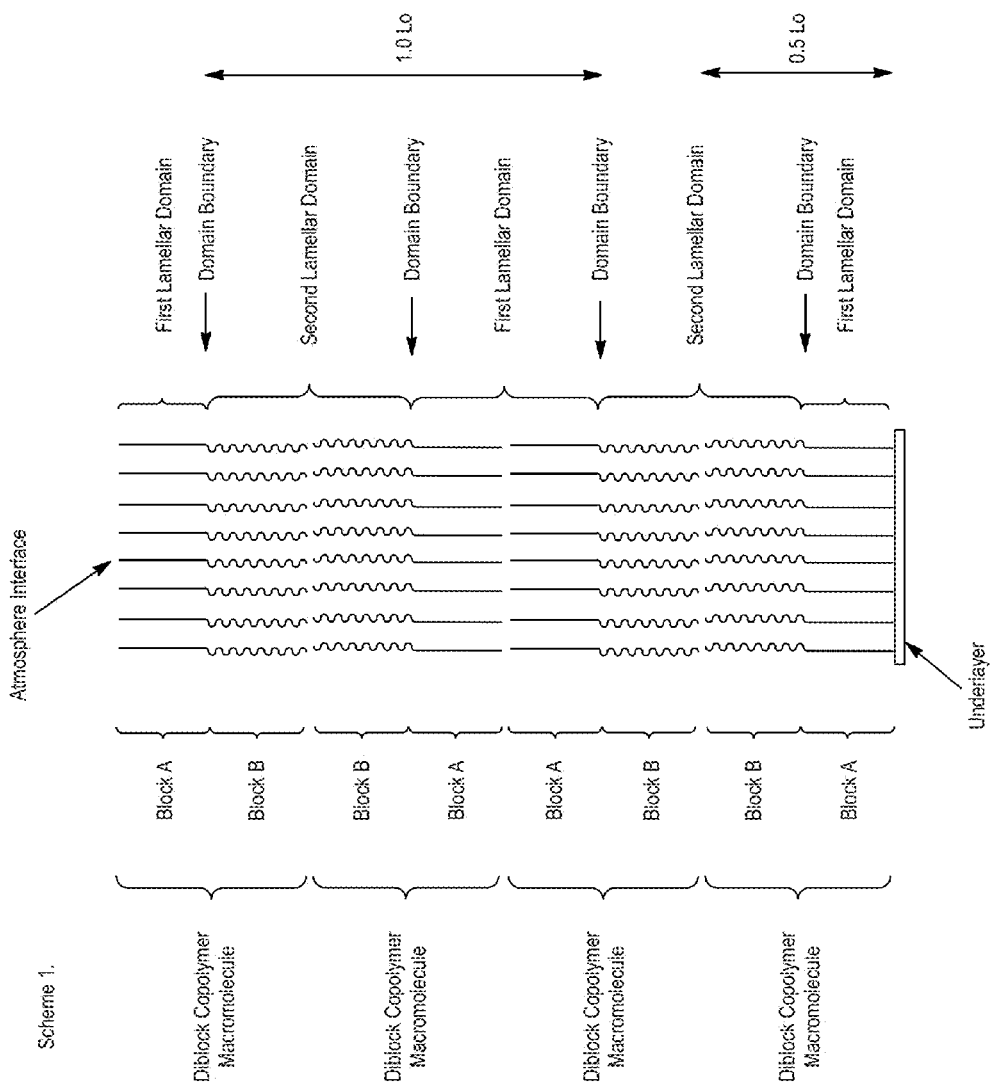
FIG. 30 is a schematic cross-sectional representation (Scheme 1) of parallel oriented lamellar domains of a self-assembled diblock copolymer. The main plane of each lamellar domain is parallel to the plane of the underlayer surface.
Figure 31:
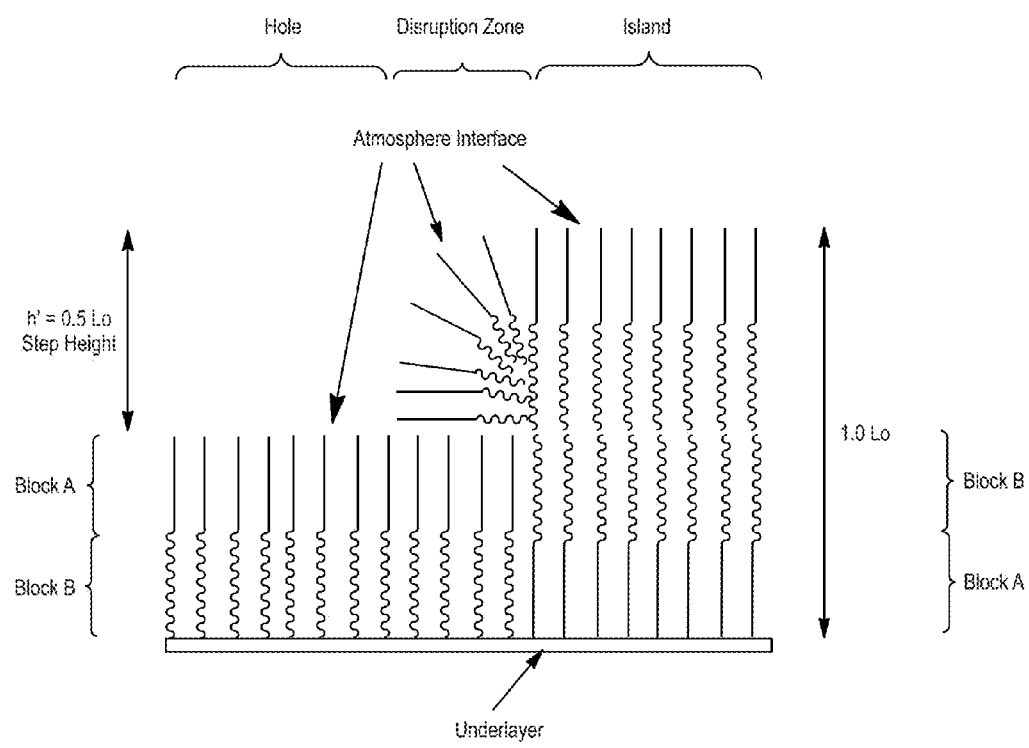
FIG. 31 is a schematic cross-sectional representation (Scheme 2) of parallel oriented lamellar domains of a self-assembled BCP when the atmosphere is non-neutral to the BCP, and the self-assembly process forms islands and holes on a neutral underlayer surface.
Figure 32:
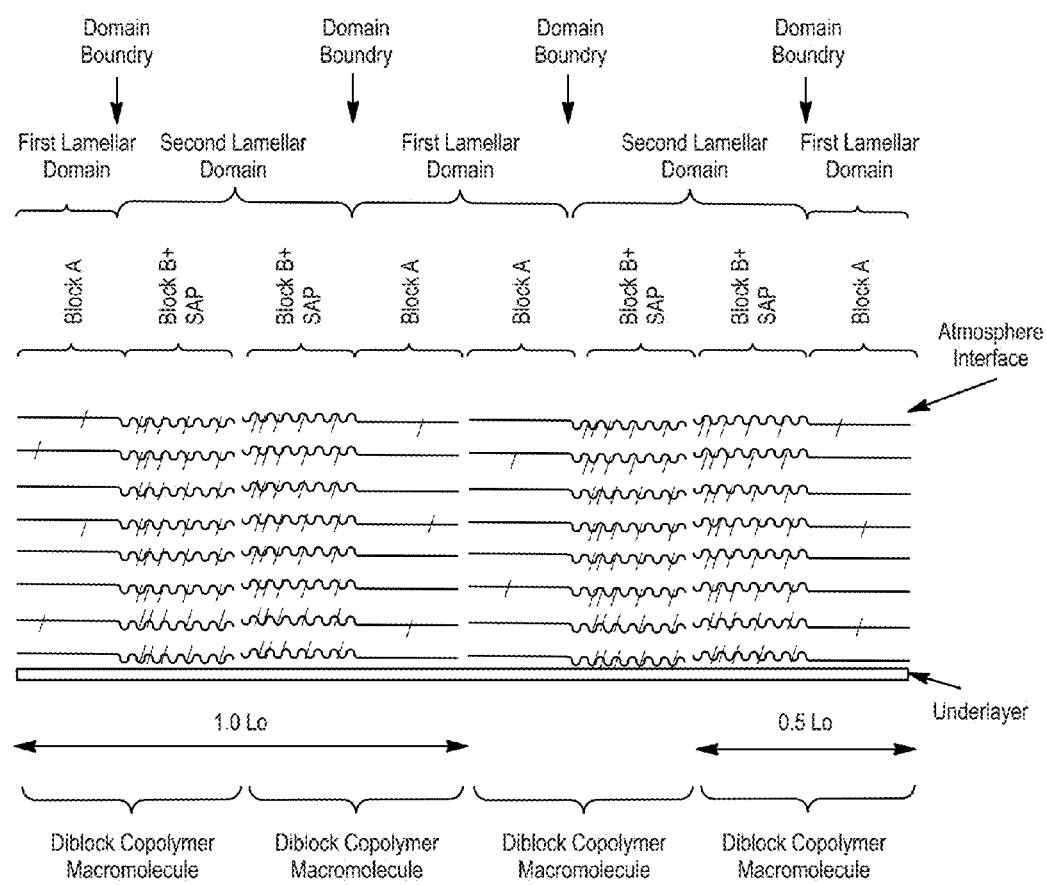
FIG. 32 is a schematic cross-sectional representation (Scheme 3) of perpendicularly oriented lamellar domains of a self-assembled BCP in which the SA layer comprises an SAP that is preferentially soluble in the domain comprising block B.

These parameters are illustrated in the diagrams of Schemes 1-3 (FIGS. 30-32) described further below. If only the underlayer surface is neutral, both block copolymer (BCP) domains initially wet the underlayer surface with 0.5Lo perpendicular lamellae, but eventually form parallel morphology as the atmosphere (e.g., air) is non-neutral, resulting in island/holes with parallel lamellae having 0.5Lo step height.

For purposes of demonstrating the present invention, the substrate comprises an orientation control layer (underlayer) disposed on a silicon wafer. The underlayer surface can be a planar surface having uniform surface properties (i.e., the underlayer surface has no topographical or chemical patterning). Most of the examples further below utilize a planar underlayer. Other examples utilize a substrate having a topographic resist pattern on the underlayer for graphoepitaxy. The SA layer is disposed on the underlayer and has a top surface in contact with an atmosphere. It is desirable that self-assembly of the SA layer comprising the SA material and the SAP forms a lamellar domain pattern comprising alternating perpendicularly oriented lamellae of each domain that are in contact with the underlayer and the atmosphere. The underlayer material can be any material having suitable neutral wetting properties to the domains of the given SA material.

The SA layer has the following characteristics. The SA layer comprises a high-chi BCP comprising an aliphatic polycarbonate block. Additionally, the BCP has a structure favoring formation of lamellar domains or cylindrical domains during self-assembly. That is, the volume fractions of the blocks of the block copolymer are in a range favorable to lamellar domain or cylindrical domain formation. Also, the SA layer is disposed on the underlayer surface, which is neutral wetting to the domains of the self-assembled BCP. Lastly, the SA layer has a top surface in contact with an atmosphere. The atmosphere interface, which is typically air, is not neutral to the BCP, meaning less than all domains at the top surface of the self-assembled SA layer are in contact with the atmosphere when the SA layer consists essentially of BCP. Under these conditions, typically only one domain of the self-assembled BCP has contact with the atmosphere (lamellae have a parallel orientation). In general, the higher the chi parameter of the BCP, the greater the mismatch in surface properties between the underlayer surface and the atmosphere, causing parallel orientation of lamellar domains.

Given the foregoing characteristics of the SA layer, an SA layer that contains no SAP self-assembles to form parallel oriented lamellar domains, due to less than all domains being capable of "wetting" the atmosphere. Parallel oriented lamellar domains are characterized by the appearance of islands and holes in atomic force microscopy (AFM) height images (Scheme 2, FIG. 31). It is desirable that self-assembly of the SA layer comprising the SA material and the SAP forms a lamellar domain pattern wherein each domain is in contact with the underlayer and the atmosphere. The underlayer material can be any material having suitable neutral wetting properties to the domains of the given SA material.

The following discussion is focused on lamellar domain patterns formed by self-assembly of a diblock copolymer, but is applicable to other block copolymers (e.g., triblock copolymers) and other domain morphologies (e.g., cylindrical domains). It should be understood that the layer diagrams are not drawn to scale or meant to be limiting with respect to the possible structures that can be produced using the below-described processes. The diagrams are intended for illustration purposes.

Without being bound by theory, Scheme 1 (FIG. 30) is a schematic cross-sectional representation of parallel oriented lamellar domains of a self-assembled diblock copolymer. The main plane of each lamellar domain is parallel to the plane of the underlayer surface.

Scheme 1 shows the arrangement of blocks A and B of a diblock copolymer after self-assembly of the diblock copolymer on an underlayer surface that is preferential to the domain containing block A. In this example, the underlayer and atmosphere interface have preferential affinity to the domain containing block A. The first lamellar domain comprises block A and the second lamellar domain comprises block B. The bulk periodicity Lo of the domains is indicated by 1.0Lo (1.0 times Lo). The individual diblock copolymer macromolecules, domain boundaries, and 0.5Lo are also indicated. It should be understood that within a given lamellar domain (e.g., the second lamellar domain of Scheme 1) blocks from different polymer macromolecules (e.g., B blocks) can be arranged end-to-end (shown) and/or interwoven (not shown). Each block can have a backbone that is rigid, non-rigid, or of intermediate rigidity. Each block can have any suitable coiling, rotational and/or flexural capability.

For purposes of the present invention, the atmosphere interface is always a non-neutral interface with respect to the high-chi BCPs. An SA layer consisting essentially of a high-chi BCP in contact with the atmosphere interface will almost certainly undergo self-assembly to form islands and holes whose boundaries represent a disruption in parallel oriented lamellae. This occurs regardless of whether the underlayer is neutral or non-neutral to the BCP.

Scheme 2 (FIG. 31) is a schematic cross-sectional representation of parallel oriented lamellar domains of a self-assembled BCP when the atmosphere is non-neutral to the BCP, and the self-assembly process forms islands and holes on a neutral underlayer surface.

In Scheme 2, the underlayer surface is in contact with the domain containing block A and the domain containing block B, and only the block A domain has contact with the atmosphere. The neutral (non-preferential) wetting properties of the underlayer surface cause disruptions in the parallel oriented lamellar domains, resulting in formation of islands and holes having a step height h' by AFM of about 0.5 Lo. It should be understood that block A phase separates to retain contact with the atmosphere, including in the disruption zone of the lamellar domains (the boundary of the hole and the island). No attempt has been made to characterize the arrangement of blocks B in the disruption zone of Scheme 2.

The examples further below show that an SA layer comprising a BCP and a disclosed SAP can self-assemble to form perpendicularly oriented lamellar domains when the top surface of the SA layer has contact with the atmosphere. The SAP is preferentially miscible with the polycarbonate domain (i.e., the domain comprising the polycarbonate block of the self-assembled BCP) and substantially immiscible with non-polycarbonate domains of the self-assembled block copolymer (e.g., a block prepared from a vinyl polymerizable monomer such as styrene and/or substituted styrenes).

Without being bound by theory, self-assembly is believed to produce a polycarbonate domain having a greater concentration of SAP than the non-polycarbonate domain. The higher SAP concentration of the polycarbonate domain after self-assembly may allow the SAP-enriched polycarbonate domain to wet the atmosphere interface, thereby allowing perpendicularly orientation of the lamellar domains. Non-polycarbonate domains having contact with the atmosphere can be essentially free of SAP at the atmosphere interface. When the block copolymer structure favors cylindrical domain formation, the presence of the SAP can allow formation of perpendicularly oriented cylindrical domains.

Scheme 3 (FIG. 32) is a schematic cross-sectional representation of perpendicularly oriented lamellar domains of a self-assembled BCP in which the SA layer comprises a SAP that is preferentially soluble in the domain comprising block B. The SAP is represented by the forward slash marks within the block B and block A domains. The block B domain can comprise a concentration gradient in SAP, wherein the concentration of SAP is highest at the atmosphere interface (not shown). The block A domain can have essentially no SAP at the atmosphere interface.

In Scheme 3, the main planes of the lamellae are oriented perpendicular to the plane of the underlayer surface, and also to the main plane of the SA layer. The lamellae of each domain are in contact with the atmosphere and underlayer surface. The bulk periodicity, Lo, is indicated, as well as 0.5Lo. In this example, the underlayer surface has contact with block A and block B of the self-assembled diblock copolymer. Therefore, the underlayer is neutral to the self-assembled diblock copolymer. The presence of the SAP allows the SAP-containing block B domain to contact the atmosphere interface.

The examples further below were carried out using a neutral underlayer. If an SA layer comprising a self-assembled BCP exhibits islands and/or holes or parallel cylinders by atomic force microscopy, the atmosphere interface (air interface) is non-neutral to the self-assembled SA layer (undesirable). If an SA layer comprising a self-assembled BCP exhibits perpendicularly oriented lamellae or cylinders, the atmosphere interface (air interface) is neutral to the self-assembled SA layer (desirable).

The examples further below show that the SAP allows perpendicularly oriented domain patterns to be formed without employing a top coat (i.e., a layer between the SA layer and the atmosphere interface) or employing a topographic pre-pattern to direct self-assembly of the high-chi BCP. Although a topographic pre-pattern is not essential for orientation control, a topographic pre-pattern can be present for other purposes. This is also demonstrated in the examples further below.

The lamellar domain patterns can have a bulk periodicity, Lo, in the range of about 4 nm to about 80 nm, which is useful for producing line features having a half-pitch of about 2 nm to about 40 nm, respectively, more particularly about 2 nm to about 20 nm.

Surface Active Polymers (SAPs)

The SAP is phase selective, meaning the SAP has preferential solubility in the polycarbonate domain formed by self-assembly. As a result, the polycarbonate domain has a higher concentration of SAP after self-assembly compared to other domains. The SAP concentration of the polycarbonate domain after self-assembly lowers the surface energy of the polycarbonate domain sufficiently to allow the polycarbonate domain to wet the atmosphere interface and provide perpendicular orientation of each domain. Perpendicular orientation can be achieved without forming a monolayer of SAP over the SA layer. For this reason, the SAP can be used in amounts of more than 0 wt % up to about 10 wt %, more specifically about 0.1 wt % to about 10 wt %, and even more specifically 0.1 wt % to about 5 wt %, based on total weight of the dry solids of the SA layer. In an embodiment, the formulation used to prepare the SA layer comprises about 0.5 wt % to about 5 wt % SAP based on total weight of dry solids of the SA layer. In another embodiment, the formulation used to prepare the SA layer comprises about 1.5 wt % to about 3 wt % SAP based on total weight of dry solids of the SA layer.

The SAP is preferably a linear random copolymer having preferential solubility in the polycarbonate domain. Other polymer architectures (e.g., dendritic polymers, star polymers, and block polymers) are not excluded as long as the SAP is preferentially soluble in the polycarbonate domain and does not form a discrete domain during self-assembly that is separate and distinct from the polycarbonate domain. A random copolymer is a polymer comprising a random distribution of the different repeat units making up the polymer backbone. Random copolymer names can include an "-r-", "-co-", or "-random-" separating the abbreviated monomer names used to prepare the polymer. Herein, a linear polymer has a one polymer branch having two peripheral ends (i.e., dangling ends, as in a segment of a rope).

The SAP can be prepared by any suitable polymerization technique. Exemplary polymerization techniques include radical polymerization, atom transfer radical polymerization (ATRP), reversible addition-fragmentation chain-transfer polymerization (RAFT), ionic polymerization, ring opening polymerization, and ring-opening metathesis polymerization (ROMP). Non-limiting monomers for forming an SAP include vinyl polymerizable monomers (e.g., styrenes, acrylates, methacrylates) and cyclic monomers (e.g., cyclic ethers, cyclic carbonates).

The SAP comprises a hydrophobic fluorinated repeat unit (first repeat unit). Preferably, the first repeat unit comprises a side chain functional group selected from the group consisting of fluorinated aromatic rings and fluorinated esters. The first repeat unit can have a structure in accordance with formula (H-1):

(H-1)

wherein

Q' is a monovalent radical comprising an aromatic ring and/or an ester group,

R' is a monovalent radical selected from the group consisting of *—H, methyl (*—CH$_3$), ethyl (*-Et), and trifluoromethyl (*—CF$_3$), and Q' and/or R' comprises at least one fluorine.

Herein, a bond with an asterisk is a starred bond. Starred bonds are not methyl groups. It should be understood that an atomic center shown with a starred bond is linked by a covalent bond to another specified or unspecified atomic center of a chemical structure. A starred bond can be said to be "linked to" a referenced structure or atomic center, meaning that the atomic center shown having the starred bond is linked by a covalent bond to the referenced structure or atomic center.

The chemical structure of the first repeat unit has no functionality capable of donating a hydrogen to form a hydrogen bond. Non-limiting functionality capable of donating a hydrogen to form a hydrogen bond include alkyl and aryl alcohols, alkyl and aryl carboxylic acids, alkyl and aryl peracids, alkyl and aryl hydrogen peroxides, alkyl and aryl sulfonic acids, alkyl and aryl sulfinic acids, alkyl and aryl mono- and di-esters of phosphoric acid, alkyl and aryl monoesters of phosphonic acids, alkyl and aryl primary amines, alkyl and aryl secondary amines, alkyl and aryl hydroxylamines, alkyl and aryl primary and secondary amides, and alkyl and aryl primary and secondary sulfonamides. In an embodiment, the first repeat unit has a chemical structure that excludes functionality capable of donating a hydrogen to form a hydrogen bond.

More specific first repeat units have a structure in accordance with formula (H-2):

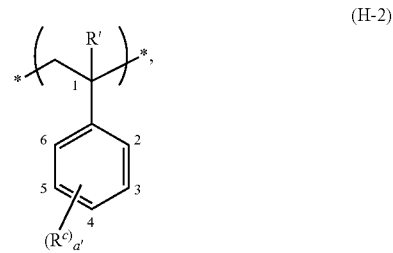

(H-2)

wherein a' is an integer having a value of 0-5, each $R^c$ is an independent monovalent radical selected from the group consisting of fluoride (*—F), chloride (*—Cl), bromide (*—Br), fluorinated and non-fluorinated alkyl groups comprising 1-3 carbons, and fluorinated and non-fluorinated alkoxy groups comprising 1-3 carbons, R' is a monovalent radical selected from the group consisting of hydrogen (*—H), methyl (*—$CH_3$), ethyl (*-Et), and trifluoromethyl (*—$CF_3$), and the first repeat unit comprises at least one fluorine.

When a starred bond of a given group crosses a bond of a ring as shown in the above structure, the group can be linked to any one of the available positional isomers of the ring. The group can be present as a mixture of positional isomers. This convention is followed below also. It should be understood that any of aromatic ring centers labelled 2-6 of formula (H-2), which are not linked to an $R^c$ group, are linked to hydrogen. In a preferred embodiment, R' is hydrogen, a' is 5, and each $R^c$ is fluoride. That is, the aromatic ring moiety is a pentafluorophenyl group and the first repeat unit is a pentafluorophenylethylen-1,2-yl group, which can be formed by vinyl polymerization of pentafluorostyrene:

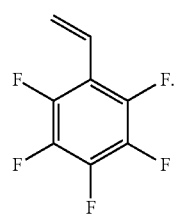

Other more specific first repeat units have structures in accordance with formula (H-3):

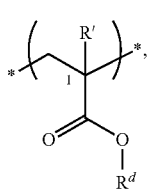
(H-3)

wherein $R^d$ is a monovalent radical selected from the group consisting of fluorinated alkyl groups comprising 1-30 carbons, fluorinated aryl groups comprising 1-30 carbons, and fluorinated poly(alkylene oxide) groups comprising 4 to 30 carbons, and R' is a monovalent radical selected from the group consisting of *—H, methyl (*—$CH_3$), ethyl (*-Et), and trifluoromethyl (*—$CF_3$).

Exemplary non-limiting fluorinated first repeat units include those of Scheme 4.

Scheme 4.

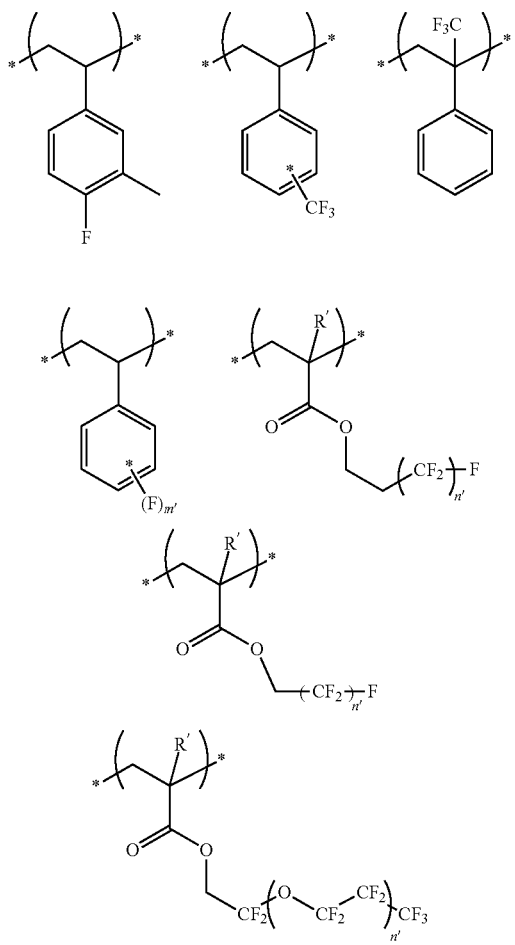

m = 1-5
R' = H, Me, Et, $CF_3$
n' = 1-12

In an embodiment, the fluorinated first repeat unit is selected from the group consisting of

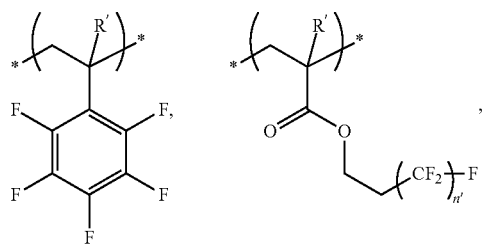

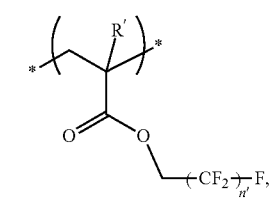

-continued

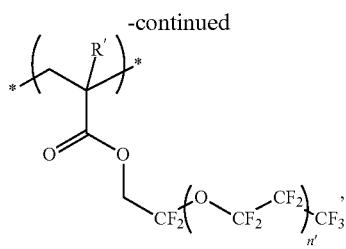

and combinations thereof, wherein each R' is independently selected from the group consisting of hydrogen (*—H), methyl (*-Me), ethyl (*-Et), and trifluormethyl (*—CF$_3$), and each n' is an independent integer having a value of 1 to 12. In another embodiment, the first repeat unit is

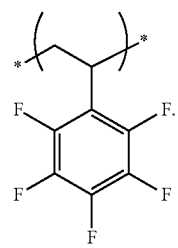

In another embodiment, the first repeat unit is

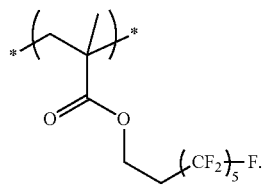

The SAP further comprises a non-fluorinated second repeat unit, which comprises at least one hydroxy group capable of donating a hydrogen to form a hydrogen bond. Each hydroxy group of the second repeat unit can independently be present as an alcohol, a hydroxy group of a carboxylic acid, a hydroxy group of a phosphonic acid, or a hydroxy group of a sulfonic acid group. That is, the second repeat unit can comprise a member of the group consisting of alcohols, carboxylic acids, phosphonic acids, sulfonic acids, and combinations thereof. In an embodiment, the second repeat unit comprises a phenol.

More specific second repeat units of the SAP have structures in accordance with formula (H-4):

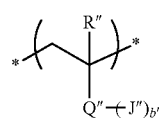
(H-4)

where b' is 1 or 2,

Q" is a single bond or a linking group having a valency of b'+1 and comprising at least one carbon, each J" is an independent monovalent radical selected from the group consisting of alcohols, carboxylic acids, phosphonic acids, and sulfonic acids, and R" is a monovalent radical selected from the group consisting of *—H, methyl (*—CH$_3$), ethyl (*-Et).

Preferably, Q" comprises an aromatic ring, ester carbonyl, or amide carbonyl group linked to carbon 1 of formula (H-4). In an embodiment, each J" is selected from the group consisting of *—OH, and *—COOH.

More specific Q" groups include those of Scheme 5, wherein the starred bond of carbon 1 of Q" is linked to carbon 1 bearing the R" group of formula (H-4), and each remaining starred bond of Q" is linked to a J" group.

Scheme 5

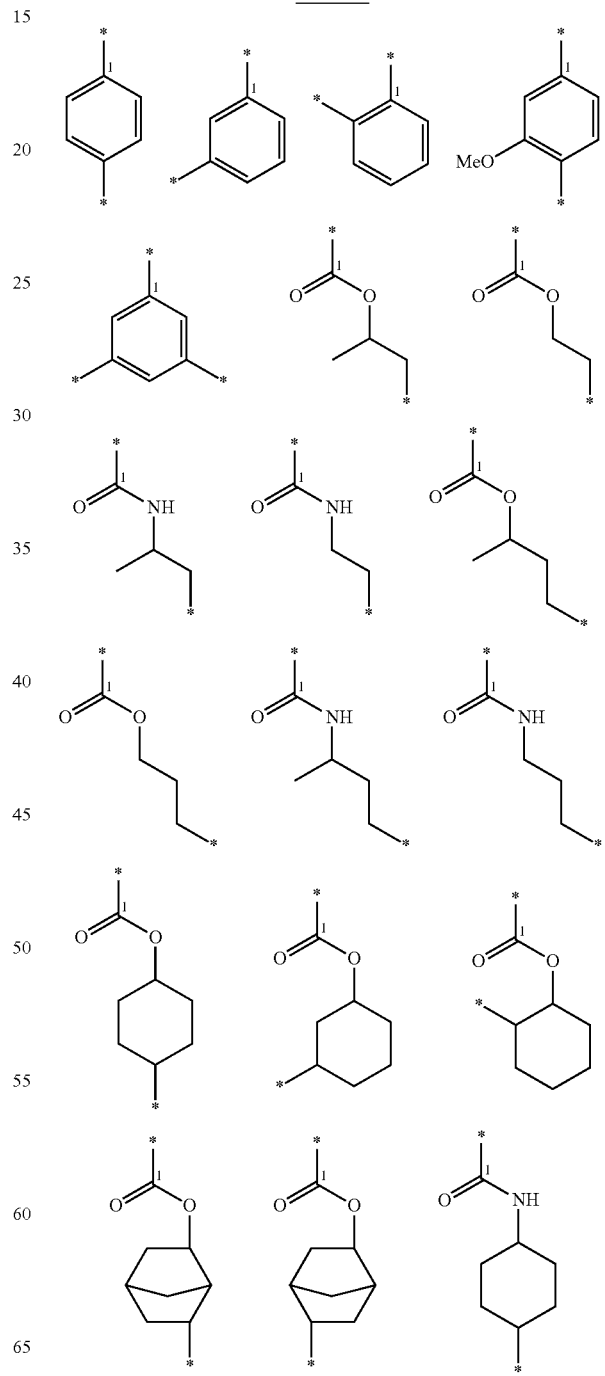

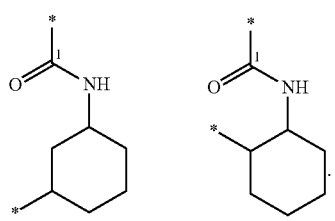
More specific second repeat units of the SAP include those of Scheme 6.
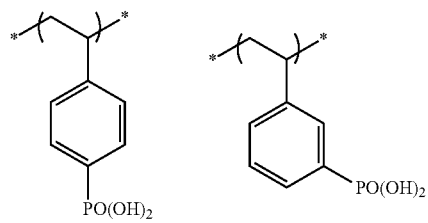
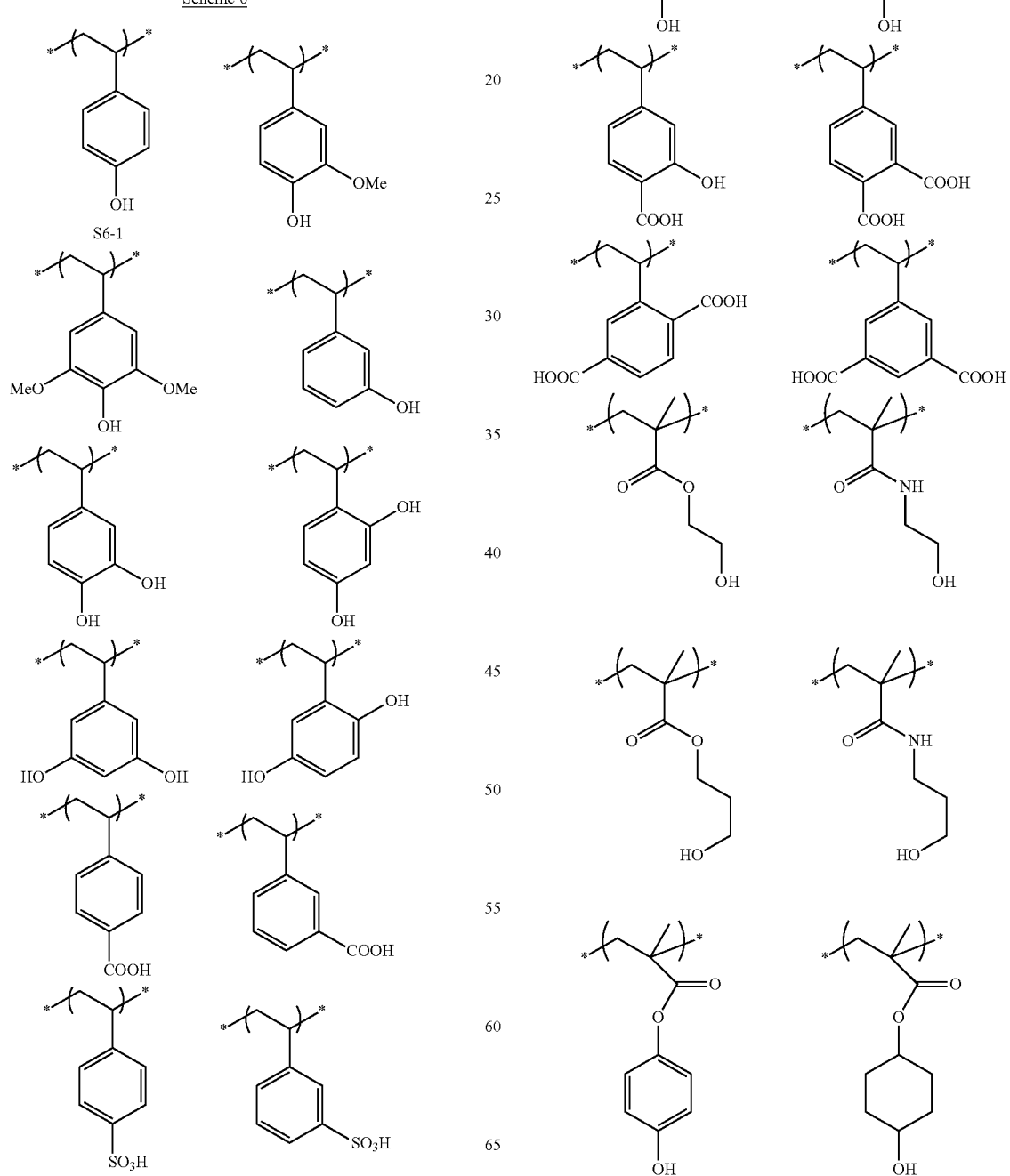

-continued

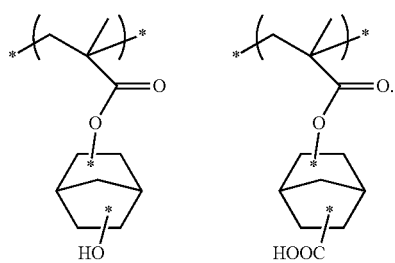

In an embodiment, the second repeat unit of the SAP is selected from the group consisting of

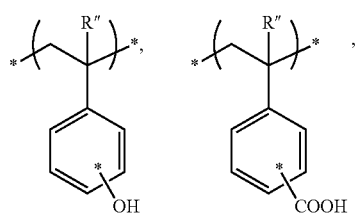

and combinations thereof, wherein each R" is independently selected from the group consisting of *—H, *-Me, *-Et.

The SAP can comprise the second repeat units singularly or in combination.

Monomers used to form the second repeat units, referred to herein as "second monomers", can be the corresponding styrene, methacrylate, or methacrylamide monomers of the above-mentioned first repeat units or protected forms thereof that can be deprotected after the polymerization. For example, the above repeat unit S6-1 can be obtained by vinyl polymerization of 4-acetoxystyrene followed treatment of the resulting polymer with aqueous base (e.g., ammonium hydroxide) to hydrolyze the acetoxy ester, thereby forming S6-1. Non-limiting exemplary second monomers include those of Scheme 7.

Scheme 7

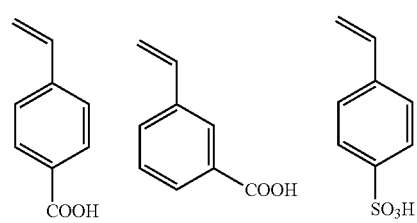

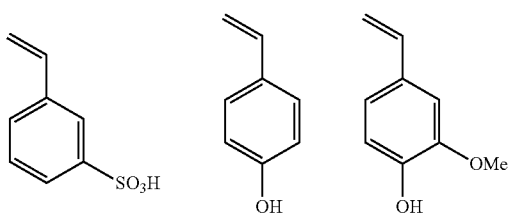

-continued

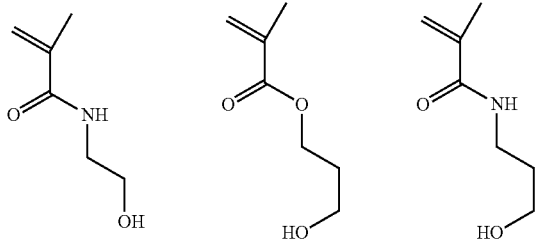

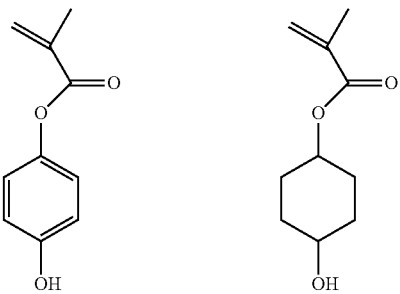

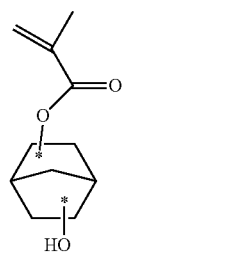

Particularly preferred second monomers for forming a SAP include 4-acetoxystyrene (Ac-Sty) and 4-vinylbenzoic acid (4-VBA):

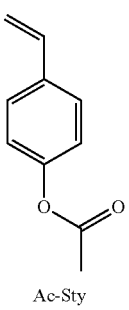

Ac-Sty

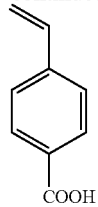

4-VBA

More specific SAP polymers have a structure in accordance with formula (H-5):

E'-P'-E"             (H-5), wherein
E' is a first end group,
E" is a second end group,
P' is a polymer chain consisting essentially of:
i) fluorinated first repeat units selected from the group consisting of:

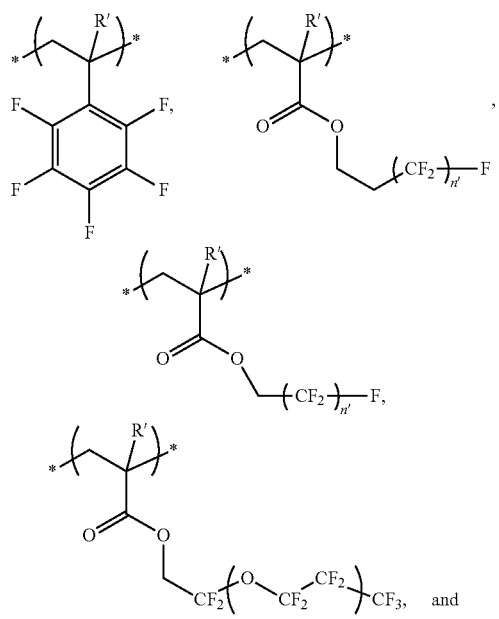

combinations thereof, wherein each R' is an independent radical selected from the group consisting of hydrogen (*—H), methyl (*-Me), ethyl (*-Et), and trifluoromethyl (*—CF$_3$), and each n' is an independent integer having a value of 1 to 12, and
ii) second repeat units selected from the group consisting of

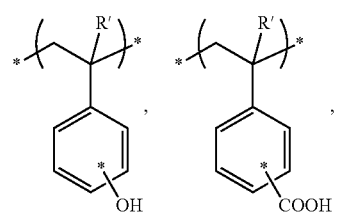

and combinations thereof, wherein each R" is independently selected from the group consisting of *—H, *-Me, *-Et.

The SAP can have any suitable end group functionality E' and E", with the proviso that wetting properties of the SAP do not adversely affect self-assembly. Non-limiting E' and/or E" groups include hydrogen, halide (e.g., fluoride, chloride, bromide, iodide), alkyl groups, alkoxy groups, ester groups, aromatic groups, non-aromatic cyclic groups, groups comprising combinations of the foregoing functionalities, and any of the foregoing groups substituted with one or more fluorine groups.

E' and/or E" of formula (H-5) can comprise 1 to 25 fluorines, more particularly 10-25 flourines. In an embodiment, end group E' and/or E" comprises an ester group comprising 1 to 25 fluorines. Non-limiting examples of fluorinated ester groups include those of Scheme 8.

Scheme 8

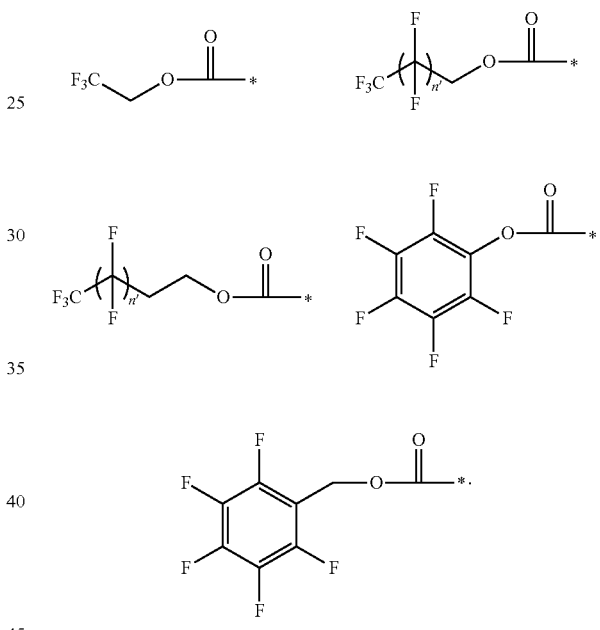

n' = 1 to 12

A more specific SAP polymer comprises a first end group E' containing an above-described fluorinated ester group and a second end group E" that is bromide. As an example, Scheme 9 illustrates the ATRP copolymerization of pentafluorostyrene (PFS) and 4-hydroxystyrene (HOST) to form random copolymer S9-1 using ATRP initiator Pf-OiBr.

Scheme 9.

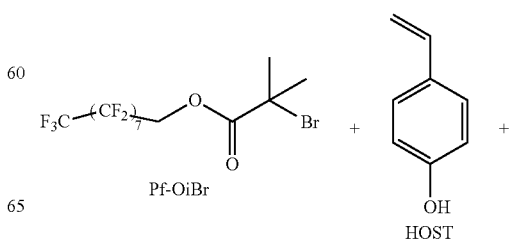

Pf-OiBr             HOST

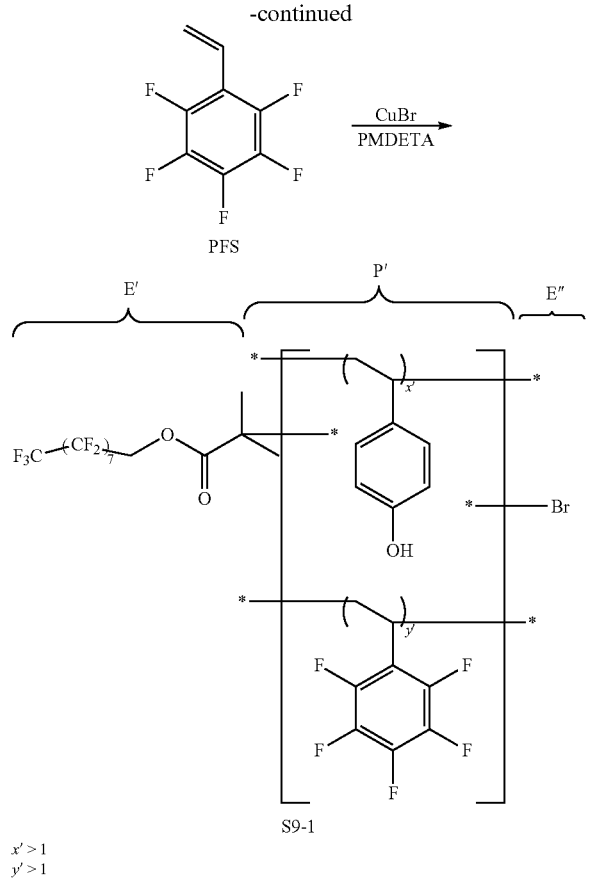

In the above notation of Scheme 9, the square brackets indicate the ends of the polymer chain, which is composed of the repeat units enclosed by the square brackets. The vertical stacking of the repeat units within the square brackets indicates a random distribution of the repeat units in the polymer chain. In a random distribution of the repeat units, a given repeat unit whose starred bond overlaps the left square bracket can be linked to a different one of the repeat units at an atomic center whose starred bond overlaps the right square bracket, or to end group E', represented in this instance by the moiety derived from Pf-OiBr. Likewise, a given repeat unit whose starred bond overlaps the right squared bracket can be linked to an atomic center of a different one of the repeat units at an atomic center whose starred bond overlaps the left square bracket, or to end group E", represented in this instance by the bromide group. End group E' can be linked to any one of the repeat units at an atomic center having a starred bond overlapping the left square bracket. End group E" can be linked to any one of the repeat units at an atomic center having a starred bond overlapping the right square bracket. Subscripts x' and y' can represent molar ratio or average degree of polymerization (DP) of the corresponding repeat unit enclosed in parentheses.

The SAP can comprise the fluorinated first repeat unit in an amount of about 40 mol % to about 90%, preferably about 55 mol % to about 80 mol %, based on total moles of monomers used to form the SAP. The SAP can comprise the non-fluorinated second repeat unit in an amount of about 10 mol % to about 60%, preferably about 20 mol % to about 45 mol % based on total moles of monomer used to prepare the SAP.

The SAP can have a number average molecular weight (Mn) of about 1000 to about 100000, more particularly 2000 to about 50000, and even more particularly about 2000 to about 20000. The SAP can have a polydispersity index of about 1.0 to about 3.0.

Random Copolymers for Orientation Control (Underlayer)

In general, the underlayer polymer is a random copolymer capable of undergoing a reaction to form a covalent bond with another layer of the substrate.

For SA materials comprising a polycarbonate block having ester side chains linked to the carbonate backbone, the underlayer polymer can potentially be a crosslinkable or brush-type random copolymer of styrene (Sty) and methyl methacrylate (MMA), also referred to as poly(styrene-r-methyl methacrylate) or P(Sty-r-MMA).

The following discussion pertains to underlayers for high-chi SA materials comprising a polycarbonate block having no side chain groups (e.g., a poly(trimethylene carbonate) block (PTMC)) or a polycarbonate block having carbonate repeat units comprising an alkyl side chain group of 1-3 carbons (e.g., methyl, ethyl, propyl).

For these high-chi SA materials, the underlayer polymer preferably comprises a repeat unit comprising an ethylenic backbone portion and a side chain portion comprising a polycarbonate chain. The polycarbonate chain of the side chain can comprise 1 or more carbonate repeat units, preferably 2 to about 40 carbonate repeat units. In an embodiment, the carbonate repeat unit of the pendant polycarbonate chain of the underlayer polymer has the same chemical structure as the carbonate repeat unit of the polycarbonate block of the BCP used in the SA layer (described further below). The underlayer polymers comprising a pendant polycarbonate chain can be prepared by ring opening polymerization (ROP) of a cyclic carbonate using a polymeric macroinitiator having one or more pendant hydroxy groups capable of initiating the ROP. The polymeric macroinitiator can be prepared by random polymerization of one or more vinyl polymerizable monomers comprising a pendant alcohol group (e.g., hydroxyethyl methacrylate, HEMA) or a protected alcohol group that is subsequently deprotected.

I) Underlayers for SA Materials Formed Comprising Trimethylene Carbonate (TMC)

More specifically, the random copolymers for the underlayer comprise a first repeat unit of formula (A-1):

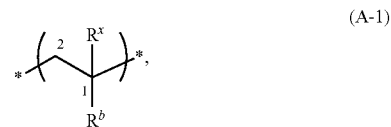

wherein $R^x$ is a monovalent radical selected from the group consisting of H, methyl, ethyl, and trifluoromethyl (*—CF$_3$), and $R^b$ is a monovalent radical comprising an aromatic ring.

It should be understood that the two starred bonds of formula (A-1) represent attachment points to other repeat units of the polymer chain or to polymer chain end groups, carbons 1 and 2 are ethylenic carbons of the polymer backbone, $R^x$ is a first side chain linked to carbon 1 of the polymer backbone, and $R^b$ is a second side chain linked to carbon 1 of the polymer backbone.

Non-limiting $R^b$ groups of formula (A-1) include substituted and unsubstituted aryl groups. Exemplary $R^b$ groups are listed in Scheme 10 below, where the starred bond of the aromatic ring is linked to carbon 1 of formula (A-1).

Scheme 10

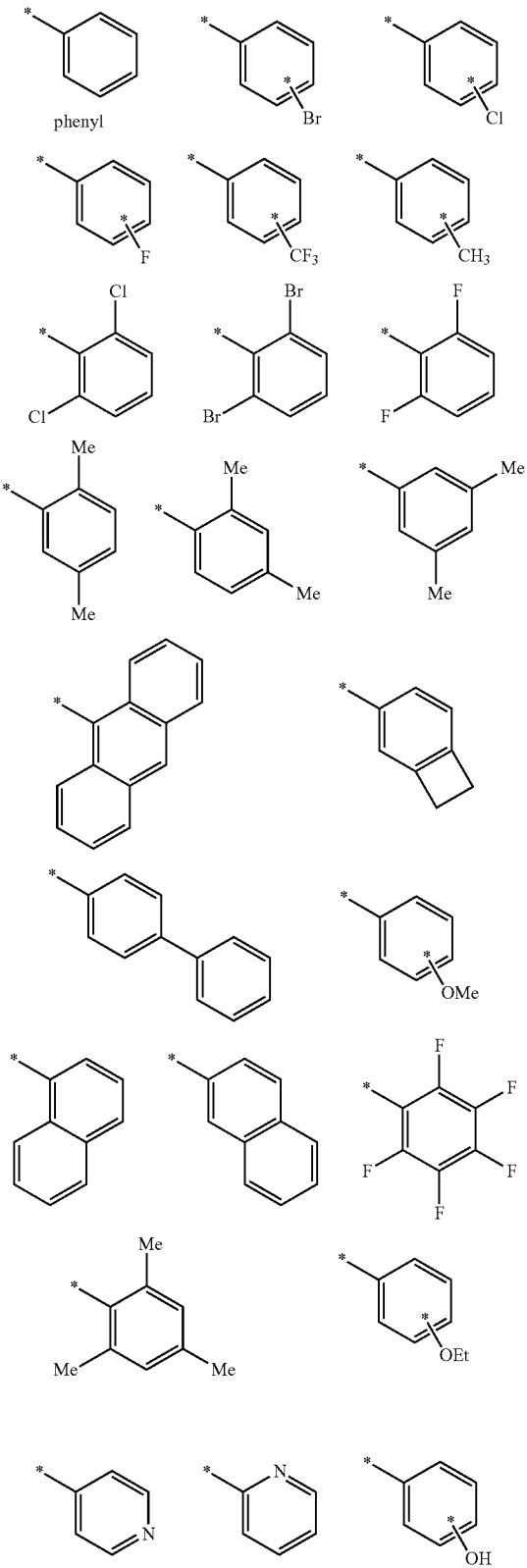

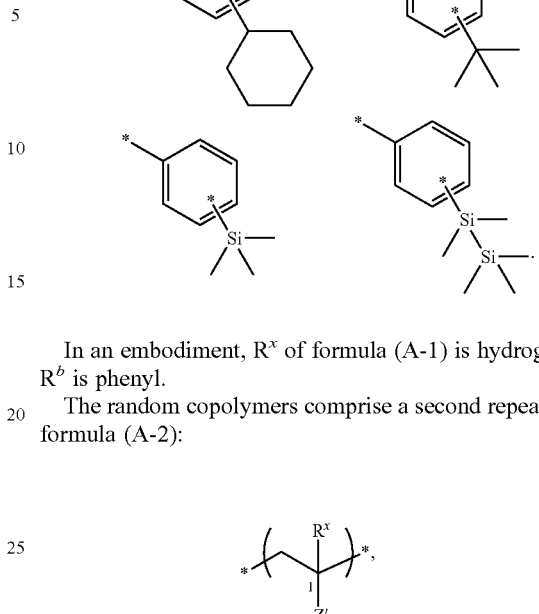

In an embodiment, $R^x$ of formula (A-1) is hydrogen, and $R^b$ is phenyl.

The random copolymers comprise a second repeat unit of formula (A-2):

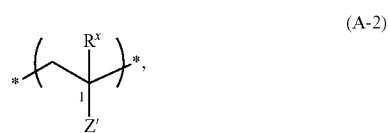

(A-2)

wherein $R^x$ is a monovalent radical selected from the group consisting of H, methyl, ethyl, and trifluoromethyl (*—CF$_3$), and Z' is a monovalent radical comprising two or more carbonyl-containing functional groups independently selected from the group consisting of ester groups, carbonate groups, amide groups, carbamate groups, and combinations thereof.

It should be understood that $R^x$ is a first side chain of the second repeat unit which is linked to polymer backbone carbon 1 of formula (A-2), and Z' is a second side chain of the second repeat unit linked to polymer backbone carbon 1 of formula (A-2).

Second repeat units of formula (A-2) include those obtained from styrenes, acrylates, methacrylates, acrylamides, methacrylamides, and the like, which are modified before or after vinyl polymerization to comprise the two or more carbonyl-containing functional groups.

More specific Z' groups of formula (A-2) include those of formula (A-2a):

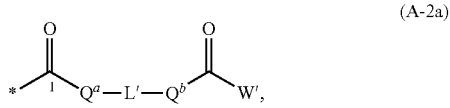

(A-2a)

wherein

L' is a divalent linking group comprising 2 to 10 carbons, $Q^a$ is *—O—* or *—N(H)—*, $Q^b$ is *—O—* or *—N(H)—*, and W' is a group comprising at least one carbon.

The starred bond of formula (A-2a) is linked to carbon 1 of formula (A-2).

Non-limiting examples of Z' groups of formula (A-2a) include those of Scheme 11.

Scheme 11

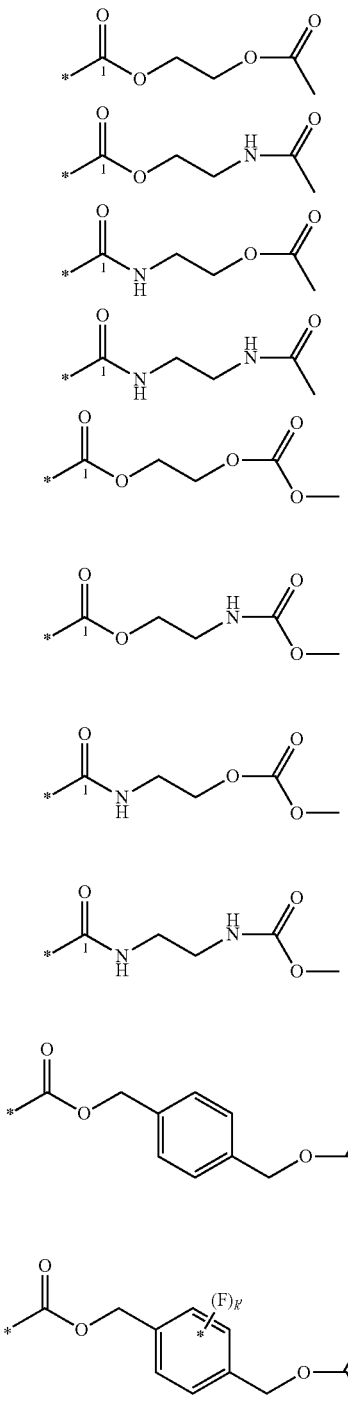

In an embodiment, Z' is

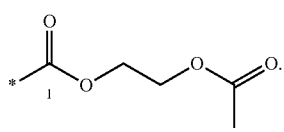 [SMILES: *C(=O)OCCOC(C)=O]

Other more specific Z' groups of formula (A-2) include those of formula (A-2b):

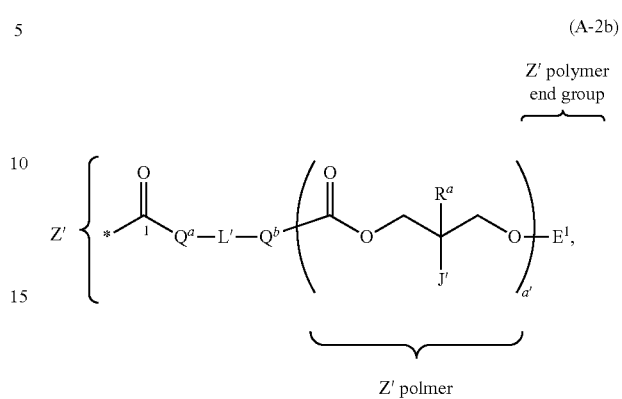

(A-2b)

wherein a' represents the average number of repeat units and has a value of 1 or more, $E^1$ is a monovalent end group independently selected from the group consisting of hydrogen and groups comprising 1 to 10 carbons, each J' is an independent monovalent radical selected from the group consisting of hydrogen and groups comprising 1 to 10 carbons, L' is a divalent linking group comprising 2 to 10 carbons, $Q^a$ is *—O—* or *—N(H)—*, $Q^b$ is *—O—* or *—N(H)—*, and each $R^a$ is an independent monovalent radical selected from the group consisting of hydrogen, methyl, and ethyl.

The starred bond of formula (A-2b) is linked to carbon 1 of formula (A-2). The average degree of polymerization, a', of the Z' polymer is preferably 1 to about 40, more preferably 1 to about 20. $R^a$ is a first side chain of the Z' polymer, and J' is a second side chain of the Z' polymer (labeled above).

Non-limiting examples of Z' groups of formula (A-2b) include those of Scheme 12.

Scheme 12

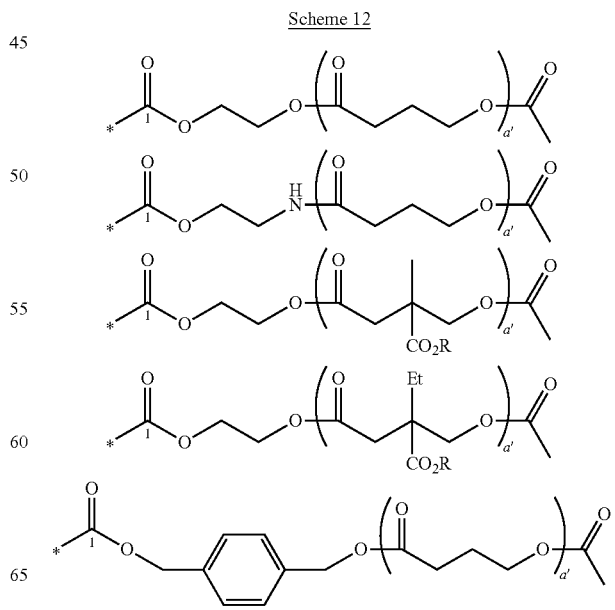

-continued

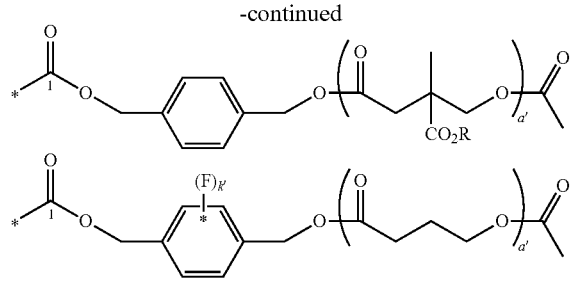

R = Me, Et, Pr, Bu, Benzyl k' = 1-4

In an embodiment, $Q^a$ and $Q^b$ are *—O—*, L' is ethylene (*—CH$_2$CH$_2$-*), $R^a$ is hydrogen, and J' is hydrogen of formula (A-2b). In another embodiment, Z' is

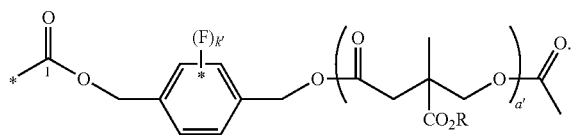

wherein a' represents the average number of repeat units and has a value of 1 or more.

Still other more specific Z' groups of formula (A-2) include those of formula (A-2c):

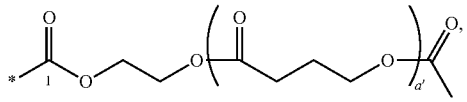

(A-2c)

wherein a' represents the average number of repeat units enclosed in the parentheses and has a value of 1 or more, u' is 0 or 1, $E^1$ is a monovalent end group independently selected from the group consisting of hydrogen and groups comprising 1 to 10 carbons, each J' is an independent monovalent radical selected from the group consisting of hydrogen and groups comprising 1 to 10 carbons, $L^a$ is a divalent linking group comprising 1 to 5 carbons, each $R^a$ is an independent monovalent radical selected from the group consisting of hydrogen, methyl, and ethyl, and when a' is 1, $L^a$, $R^a$, J' and/or E' comprises a carbonyl-containing functional group selected from the group consisting of esters, carbonates, carbamates, and combinations thereof The starred bond of formula (A-2c) is linked to carbon 1 of formula (A-2). The average degree of polymerization, a', of the Z' polymer is preferably 1 to about 40, more preferably 1 to about 20. $R^a$ is a first side chain of the Z' polymer, and J' is a second side chain of the Z' polymer.

Non-limiting examples of Z' groups of formula (A-2c) include those of Scheme 13, wherein a' has an average value of 1 to about 40, and $R^f$ is a group comprising 1 to 10 carbons (e.g., methyl, ethyl, propyl, butyl, benzyl).

Scheme 13

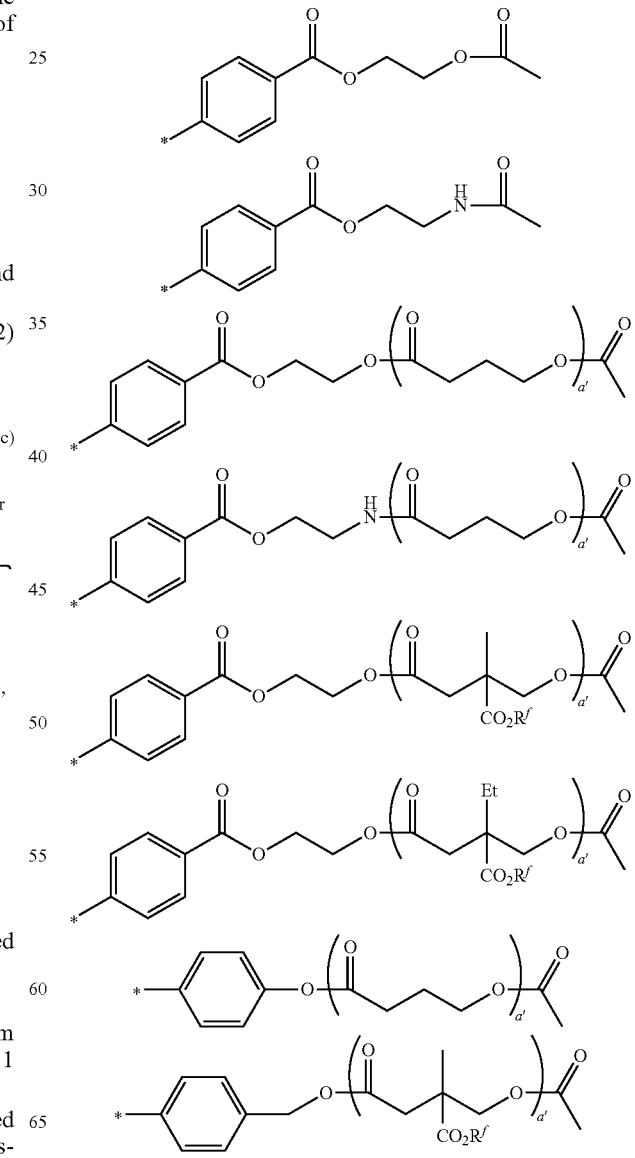

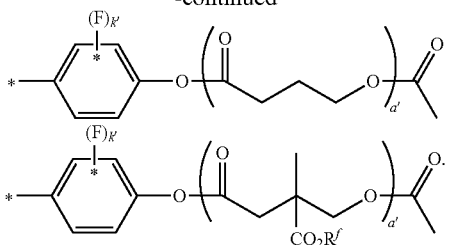

k' = 1-4

Non-limiting examples of second repeat units of formula (A-2) include those of Scheme 13b, wherein a' has an average value of 1 to about 40, and $R^f$ is a group comprising 1 to 10 carbons.

Scheme 13b

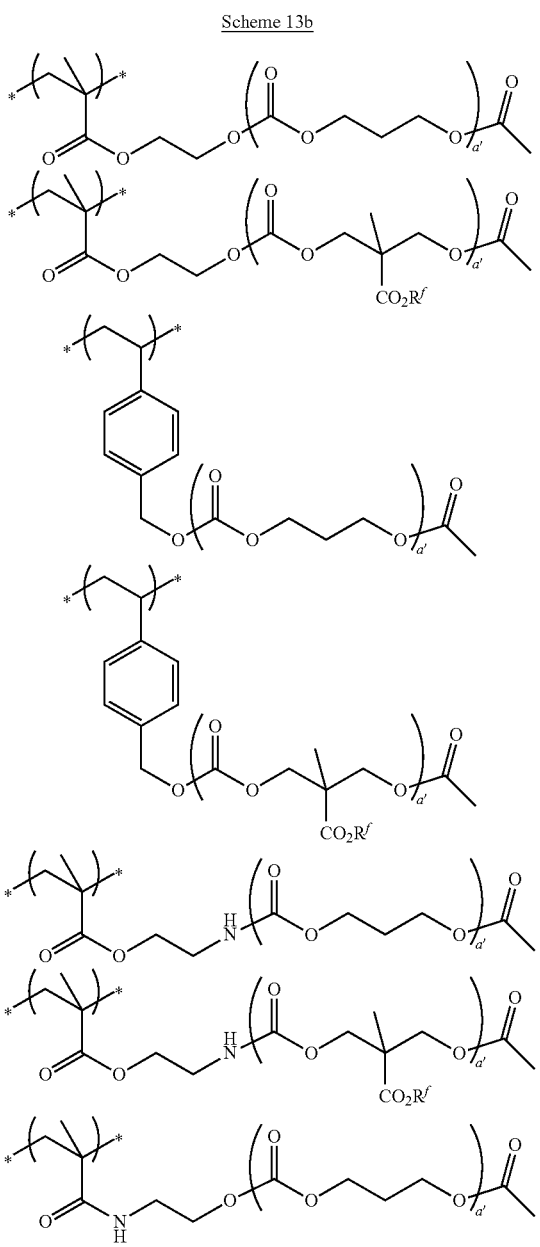

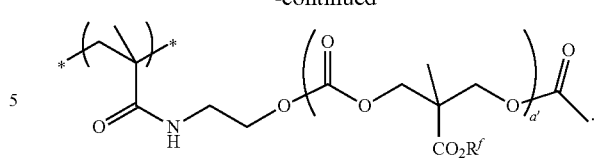

In an embodiment, the second repeat unit of the underlayer random copolymer is selected from the group consisting of

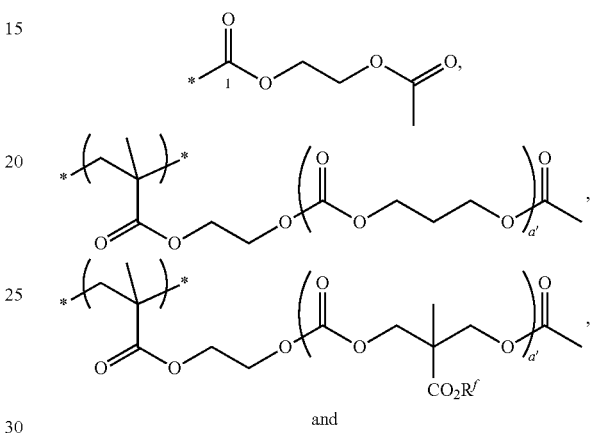

and combinations thereof, wherein a' represents degree of polymerization and has an average value of about 1 to about 40 and $R^f$ is a member of the group consisting of methyl, ethyl, propyl, phenyl, and benzyl.

The random copolymer for the underlayer preferably comprises a first repeat unit:second repeat unit mole ratio between 24:76 to 88:12.

The random copolymer for the underlayer further comprises a third repeat unit of formula (A-3):

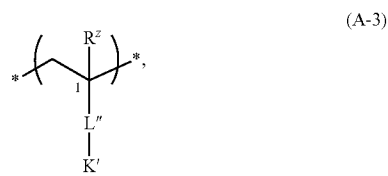

(A-3)

wherein $R^z$ is a monovalent radical selected from the group consisting of H, methyl, ethyl, and trifluoromethyl (*—$CF_3$), L" is an independent divalent linking group comprising 1 to 10 carbons, and K' is a monovalent electrophilic group capable of reacting with a nucleophile to form a covalent bond.

Non-limiting L" groups of formula (A-3) include ester, amide, aryl, arylester and arylamide groups. Exemplary L" groups include those listed in Scheme 14 below, where the starred bond of the carbonyl group or the aromatic ring (i.e., the left-most starred bond in each structure) is linked to polymer backbone carbon 1 of formula (A-3).

Scheme 14

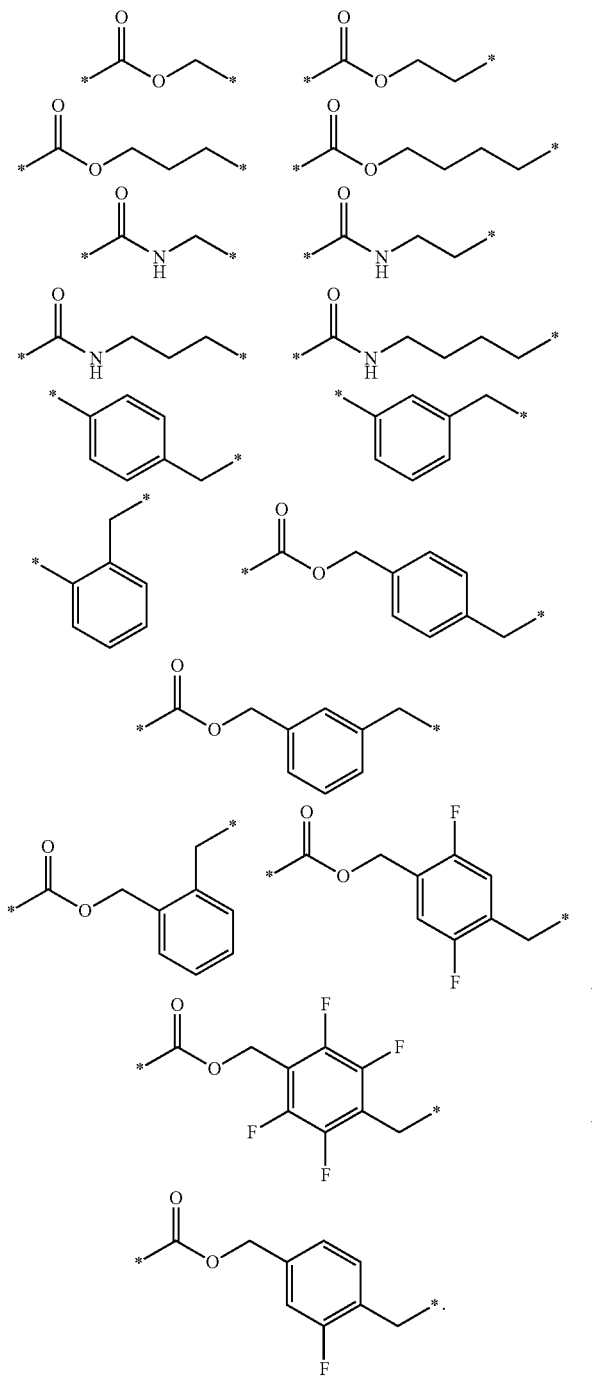

Scheme 15

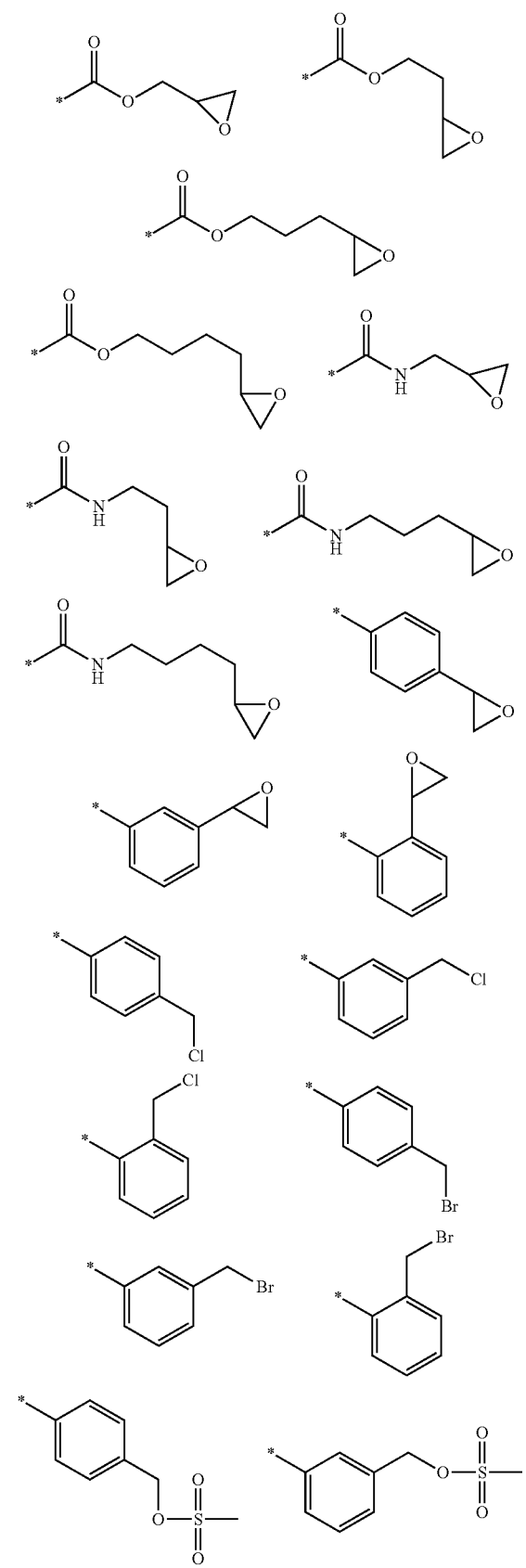

K' can comprise an electrophilic group selected from the group consisting of active carboxylic ester groups (e.g., p-nitrophenyl ester, pentafluorophenyl ester), halide groups (e.g., chloride, bromide, and iodide), sulfonate esters (e.g., p-toluenesulfonates, mesylates), groups containing an epoxide group, and the like. In an embodiment, K' comprises an epoxide group.

More specific *-L"-K' groups include those of Scheme 15, wherein the starred bond from the carbonyl group or the aromatic ring is linked to carbon labeled 1 of formula (A-3).

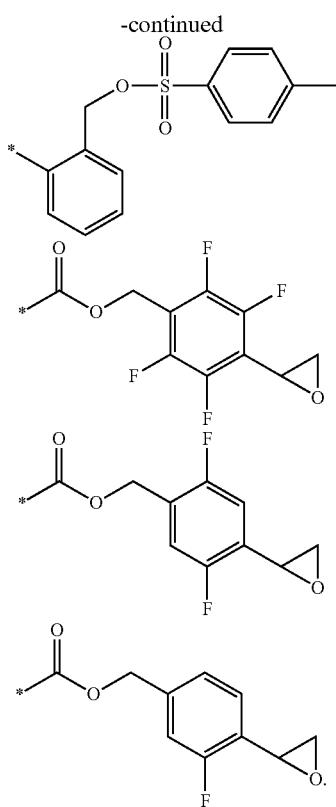

In an embodiment, $R^z$ is methyl of formula (A-3) and L"-K' is of formula (A-3) is

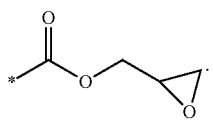

More specific random copolymers for the underlayer have structures in accordance with formula (A-4):

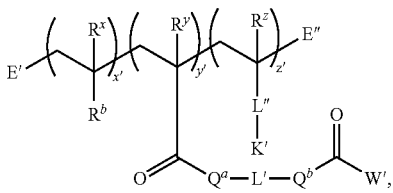

(A-4)

wherein each of subscripts x', y', and z' represents an average number of repeat units enclosed in the respective parentheses and independently has an average value greater than 1, E' and E' are monovalent end groups independently selected from the group consisting of hydrogen, halides, and groups comprising 1-10 carbons, each K' is a monovalent radical capable of reacting with a substrate surface to form a covalent bond, L' is a divalent linking group comprising 2 to 10 carbons, each L" is an independent divalent linking group comprising 1 to 10 carbons, $Q^a$ is *—O—* or *—N(H)—*, $Q^b$ is *—O—* or *—N(H)—*, each $R^b$ is an independent monovalent radical comprising 1 or more aromatic rings, each of $R^x$, $R^y$, and $R^z$ is a monovalent radical independently selected from the group consisting of hydrogen, methyl, ethyl, and trifluoromethyl (*—CF$_3$), and W' is a group comprising at least one carbon.

In an embodiment, each $R^x$ is hydrogen, each $R^b$ is phenyl, $Q^a$ is *—O—* and $Q^b$ is *—O—*. In another embodiment, L' is ethylene (*—CH$_2$CH$_2$—*) and W' is methyl.

Herein, formula A-4 can also be written as formula (A-5):

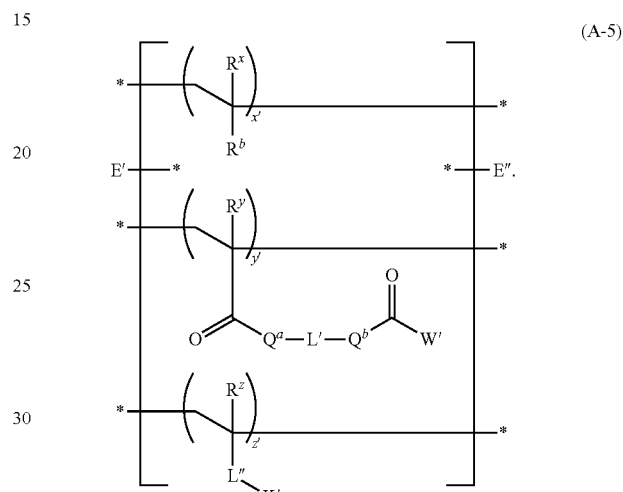

(A-5)

Other more specific random copolymers for the underlayer have structures in accordance with formula (A-6):

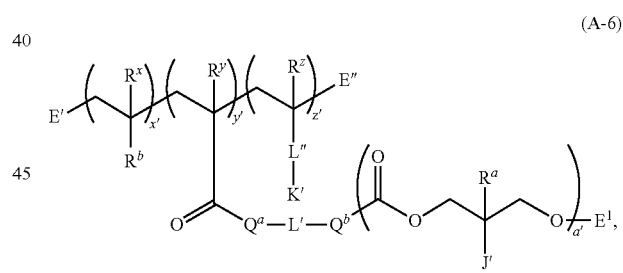

(A-6)

wherein each of subscripts a', x', y', and z' represents an average number of repeat units enclosed in the respective parentheses and independently has an average value greater than 1, E' and E" are monovalent end groups independently selected from the group consisting of hydrogen, halides, and groups comprising 1-10 carbons, $E^1$ is a monovalent end group independently selected from the group consisting of hydrogen and groups comprising 1 to 10 carbons, each J' is an independent monovalent radical selected from the group consisting of hydrogen and groups comprising 1 to 10 carbons, each K' is a monovalent radical capable of reacting with a substrate surface to form a covalent bond, each L' is a divalent linking group comprising 2 to 10 carbons, each L" is an independent divalent linking group comprising 1 to 10 carbons, $Q^a$ is *—O—* or *—N(H)—*, $Q^b$ is *—O—* or *—N(H)—*, each $R^a$ is an independent monovalent radical selected from the group consisting of hydrogen, methyl, and ethyl, each $R^b$ is an independent monovalent radical comprising 1 or more aromatic rings, and each of $R^x$, $R^y$, and $R^z$ is a monovalent radical independently selected from the group consisting of hydrogen, methyl, ethyl, and trifluoromethyl (*—$CF_3$).

In an embodiment, each $R^x$ is hydrogen, each $R^b$ is phenyl, $Q^a$ is *—O—* and $Q^b$ is *—O—*, $R^a$ is hydrogen, and J' is hydrogen. In another embodiment, L' is ethylene (*—$CH_2CH_2$-*) and $E^1$ is acetyl.

Formula A-6 can also be written as formula (A-7):

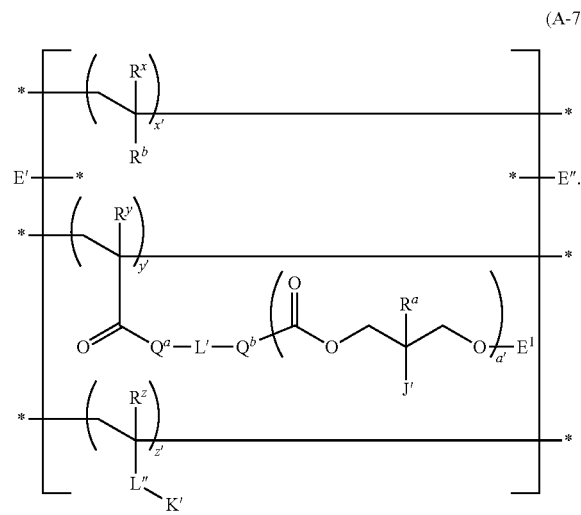

(A-7)

Other more specific random copolymers for the underlayer have a structure according to formula (A-8):

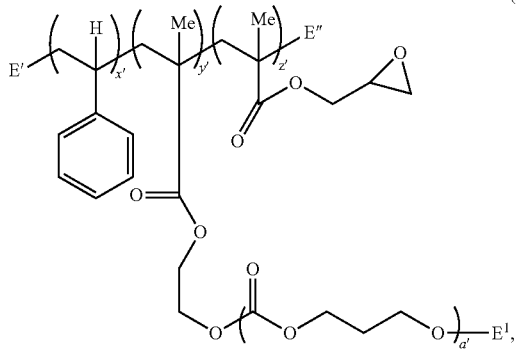

(A-8)

wherein each of x', y', and z' represents the average number of respective repeat units enclosed in the respective parentheses, and has an average value greater than 1, a' represents the number of respective repeat units enclosed in the parentheses, and has an average value of 1 or more, E' and E" are monovalent end groups independently selected from the group consisting of hydrogen, halides, and groups comprising 1-10 carbons, and $E^1$ is a monovalent end group independently selected from the group consisting of hydrogen and groups comprising 1-10 carbons.

Preferably, x' is 20 to 80, y' is 1 to 20, z' is 1 to 5, and a' is 1 to 40. In an embodiment, $E^1$ is acetyl. In another embodiment, a' is about 1 to about 10.

The structure of formula (A-8) can also be represented by the formula (A-9):

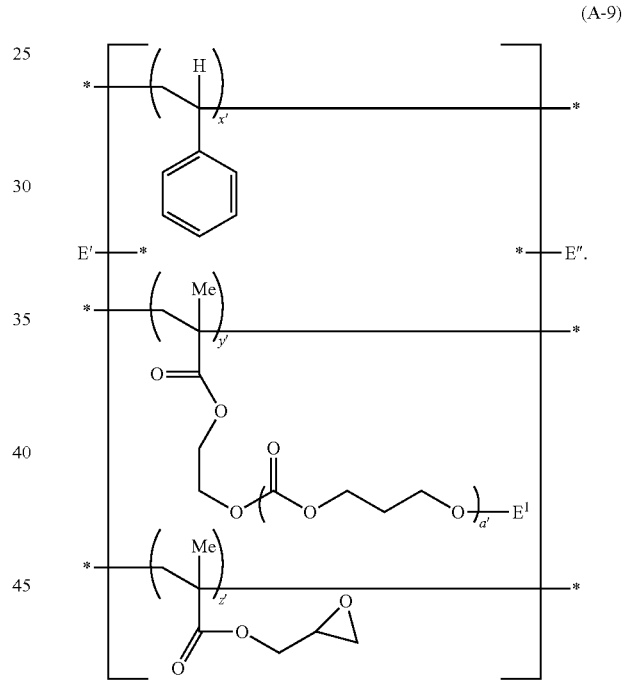

(A-9)

Preparation of Random Copolymers for Orientation Control Layers

A random copolymer for the underlayer can be prepared by copolymerization of a mixture comprising a vinyl polymerizable monomer comprising an aromatic ring, a second vinyl polymerizable monomer comprising a pendant polycarbonate or polyestercarbonate chain, and a third vinyl polymerizable monomer comprising an electrophilic group capable of reacting with a nucleophile to produce a covalent bond. This method is illustrated in Scheme 16 below using the monomers styrene (Sty), HEMA-PTMC, and glycidyl methacrylate (GMA). Catalysts for the vinyl polymerization include radical initiators (e.g., azobisisobutyronitrile (AIBN)).

Scheme 16.

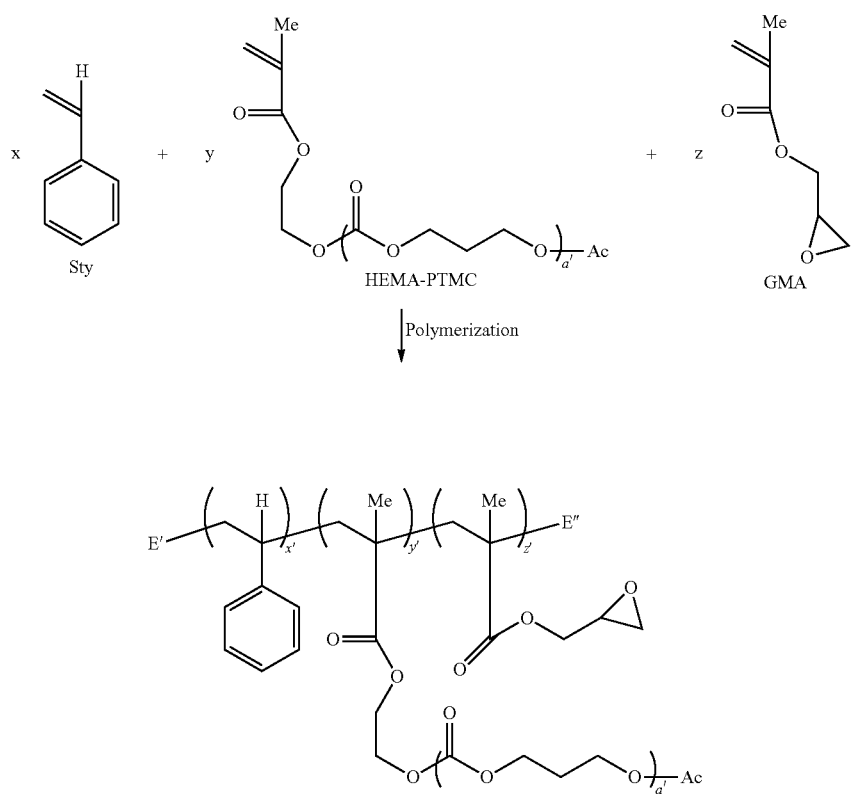

$x' > 1$
$y' > 1$
$z' > 1$
$a' > 1$
$E', E'' =$ end groups

HEMA-PTMC can be prepared by an organocatalyzed ring opening polymerization (ROP) of trimethylene carbonate (TMC) using hydroxyethyl methacrylate (HEMA) as the polymerization initiator, and endcapping the resulting polycarbonate with acetyl chloride, as shown in Scheme 17 below. Catalysts for the ROP include organic bases (e.g., 1,8-diazabicyclo[5,4,0]undec-7-ene (DBU)) and phosphate esters (e.g., diphenyl phosphate (DPP)).

Scheme 17.

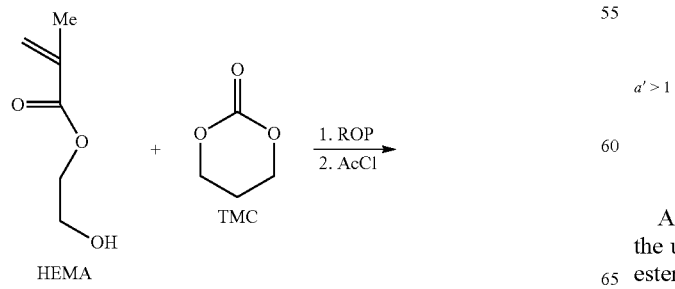

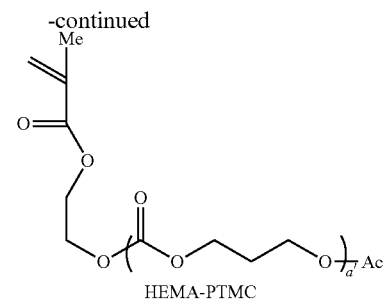

$a' > 1$

A second method of preparing the random copolymer for the underlayer comprises growing a polycarbonate or polyestercarbonate chain by ring opening polymerization from a nucleophilic site on a side chain of a precursor random copolymer, as illustrated in Scheme 18.

Scheme 18.

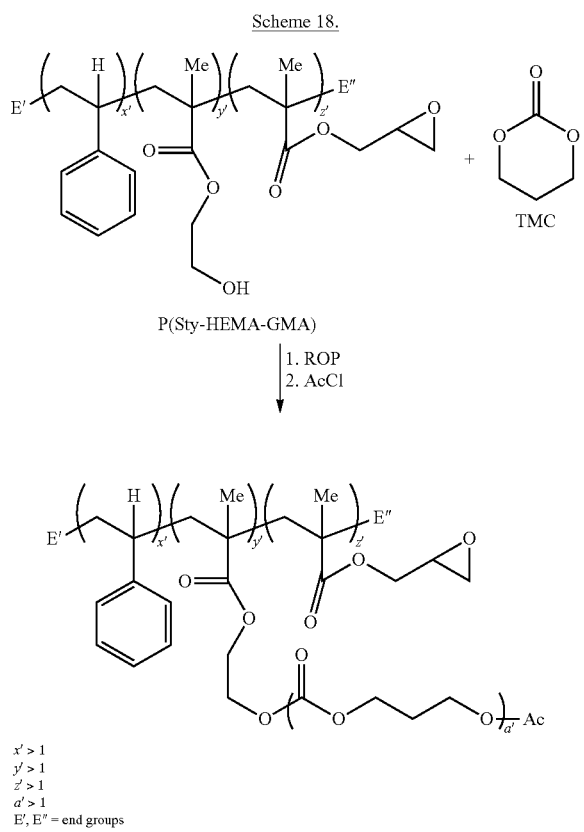

x' > 1
y' > 1
z' > 1
a' > 1
E', E'' = end groups

In this example, the random copolymer of styrene (Sty), hydroxyethyl methacrylate (HEMA), and glycidyl methacrylate GMA), referred to as P(Sty-HEMA-GMA), is a macroinitiator for the ring opening polymerization of TMC. Each nucleophilic hydroxy group of the macroinitiator P(Sty-HEMA-GMA) serves as a potential initiating site for ROP of TMC. The resulting polymer is a random graft copolymer comprising a plurality of side chains bearing a polycarbonate chain.

Block Copolymers for Self-Assembly

Block copolymer names can include a "-b-" or "-block-" separating the abbreviated monomer names used to prepare the polymer. The block copolymers for self-assembly can comprise two or more blocks, preferably 2 to 4 blocks. At least one block comprises a carbonate repeat unit. For example, the block copolymer can comprise one polystyrene (PS) block and one polycarbonate (PC) block joined by a linking group. As another example, the block copolymer can comprise two PS blocks and one PC block joined by one or two linking groups in the form of a linear polymer chain (i.e., not macrocyclic). As another example, the block copolymer can comprise two PS blocks and two PC blocks joined by one to three linking groups.

The following discussion is directed to diblock polymers (A-B) but can be applied to triblock polymers and other block polymer architectures (e.g., star polymers comprising 3 or more polymer arms linked to a multi-valent core, mikto-arm star polymers wherein or more arms comprise different repeat units compared to the other arms).

A first block (block A) comprises a backbone comprising repeating functionalized ethylenic units (e.g., as in a polystyrene backbone). A second block (block B) comprises at least one aliphatic carbonate repeat unit (i.e., comprising an aliphatic carbonate group in the polymer backbone). The blocks are selected so as to be substantially immiscible with each other. Additionally, it is preferable that the first block and the second block of the block polymer have the following solubility properties with respect to a solvent mixture used to precipitate the block polymer: i) the first block and the second block are substantially insoluble in a first solvent of the solvent mixture, ii) the first block is substantially insoluble in a second solvent of the solvent mixture, and iii) the second block is soluble in a second solvent of the solvent mixture. That is, the first solvent is a non-solvent for the first block and the second block, the second solvent is a non-solvent for the first block, and the second solvent is a solvent for the second block.

The specific bulk structural units formed by self-assembly of the block polymer are determined by the volume ratio of the first block to the second block. The volume of a given block means the volume occupied by the block, which depends on molecular mass of the block. For example, when the volume ratio of the first block A to the second block B is greater than about 80:20, the block polymer can form an ordered array of spheres composed of the second block in a matrix composed of the first block. When the volume ratio of the first block to the second block is in a range greater than about 80:20, the block copolymer can form an ordered array of spheres of the second block in a matrix composed of the first block. When the volume ratio of the first block to the second block is in a range of about 80:20 to about 60:40, the block polymer can form an ordered array of cylinders composed of the second block in a matrix composed of the first block. When the volume ratio of the first block to the second block is less than about 60:40 to about 40:60, the block polymer can form alternating lamellae (i.e., an array of domains composed of the first block alternating with domains composed of the second block). As an example, a polystyrene-b-polymethylmethacrylate block copolymer (PS-b-PMMA) comprising 20% or less by volume of the polystyrene (PS) block can self-assemble to form PS spheres in a polymethylmethacrylate (PMMA) matrix. As another example, a PS-b-PMMA block copolymer comprising about 20% to 40% PS by volume can self-assemble to form PS cylinders in a PMMA matrix. The volume ratio between the first block and the second block can be adjusted by controlling the average molecular weight of each block.

More specifically, the volume ratio of the first block to the second block can be about 15:85 to about 85:15, based on the average total volume of the block polymer macromolecule. Preferably, for alternating lamellae formation, the volume ratio of the first block to the second block can be about 40:60 to about 60:40, more preferably 45:55 to 55:45, and most preferably 48:52 to 52:48. For cylinder formation, the volume ratio of the first block to second block can be about 74:26 to about 63:37, and more preferably about 72:28 to about 65:35.

One of the blocks of the block polymer can be selectively removed (e.g., by etching techniques) relative to the other block to form structural features composed of the remaining block using known dry and/or wet etching techniques. The structural features can have any suitable form such as, for example, a line pattern, a hole pattern, and/or other patterns.

The ROP polymeric initiator is preferably the product of a vinyl polymerization. Vinyl polymerizable monomers include styrenes, acrylates, methacrylates, substituted derivatives thereof, and the like. The vinyl polymerizable monomers can be used singularly or in combination to form the ROP polymeric initiator using any suitable polymerization technique, including but not limited to free radical polymerization, anionic polymerization, cationic polymerization, atom transfer radical polymerization (ATRP), nitroxide mediated polymerization (NMP), and/or reversible addition-fragmentation chain transfer (RAFT) polymerization.

More specifically, the first block of the block copolymer comprises a repeat unit of formula (B-1):

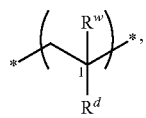
(B-1)

wherein $R^w$ is a monovalent radical selected from the group consisting of H, methyl, ethyl, and trifluoromethyl (*—CF$_3$), and $R^d$ is a monovalent radical comprising an aromatic ring linked to carbon 1.

Non-limiting $R^d$ groups of formula (B-1) include substituted and unsubstituted aryl groups. Exemplary $R^d$ groups are listed in Scheme 19 below, where the starred bond of the carbonyl group or the aromatic ring is linked to carbon labeled 1 of formula (B-1).

Scheme 19.

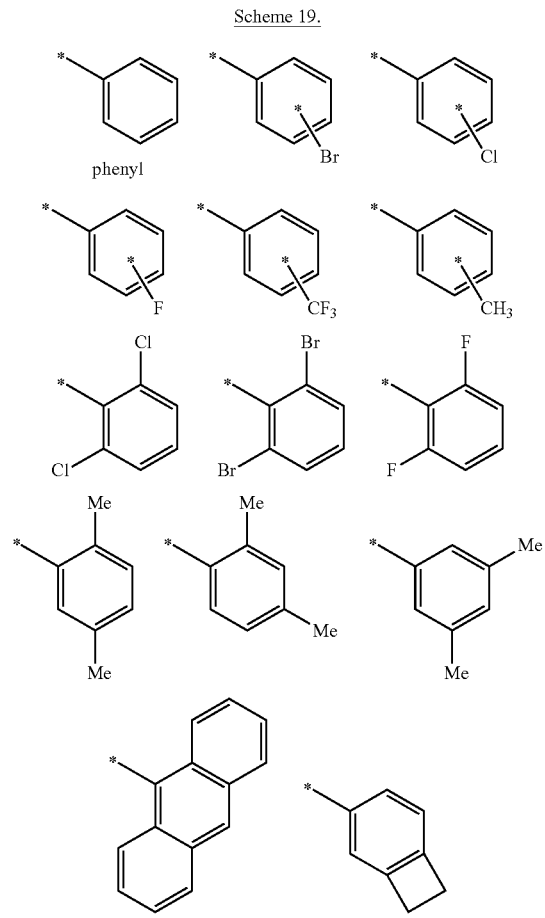

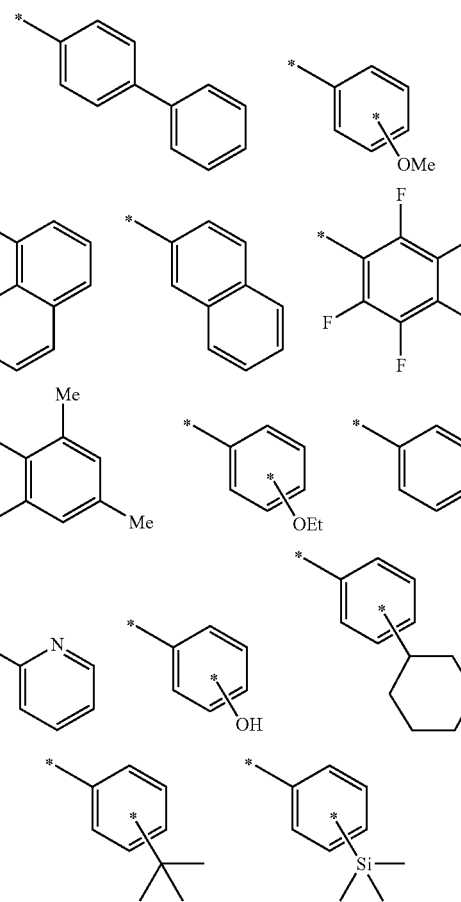

In an embodiment, $R^w$ of formula (B-1) is hydrogen, and $R^d$ is phenyl. Repeat units of formula (B-1) can be present singularly or in combination.

The first block can be a homopolymer of a repeat unit of formula (B-1) or a random copolymer chain comprising a combination of repeat units of formula (B-1) and/or a second repeat unit.

The second block of the diblock copolymer comprises at least one aliphatic carbonate repeat unit of formula (B-2):

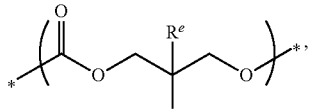
(B-2)

wherein $R^e$ is an independent monovalent radical selected from the group consisting of hydrogen, methyl, and ethyl, and B" is an independent monovalent radical selected from the group consisting of hydrogen and groups comprising 1 to 40 carbons.

In an embodiment, the polycarbonate block of the block copolymer comprises an ester bearing carbonate repeat unit of formula (B-3):

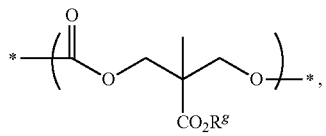

(B-3)

wherein $R^g$ is monovalent hydrocarbon group comprising 1-20 carbons.

In an embodiment $R^g$ is a member selected from the group consisting of methyl, ethyl, propyl, iso-propyl, n-butyl, sec-butyl, tert-butyl, n-pentyl, neo-pentyl, iso-pentyl, cyclopentyl, norbornyl, cyclohexyl, adamantyl, phenyl, and benzyl. In another embodiment $R^g$ is methyl, ethyl, propyl, or benzyl.

More specific block copolymers for self-assembly and directed self-assembly have a structure according to formula (B-4), wherein the square brackets represent separate blocks A and B of the block copolymer:

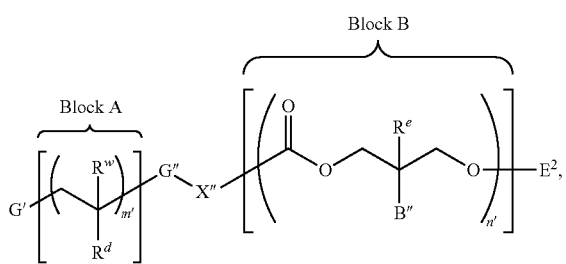

(B-4)

wherein each subscript m' and n' represents the average number of respective repeat units enclosed in parentheses, and independently has an average value greater than 1, $E^2$ is a monovalent end group selected from the group consisting of hydrogen and groups comprising 1-10 carbons, G' is a monovalent end group selected from the group consisting of hydrogen, halides, and groups comprising 1-10 carbons, G" is a divalent linking group comprising 1-20 carbons, each B" is an independent monovalent radical selected from the group consisting of hydrogen and groups comprising 1 to 20 carbons, each $R^d$ is an independent monovalent radical comprising an aromatic ring, each $R^w$ is an independent monovalent radical selected from the group consisting of H, methyl, ethyl, and trifluoromethyl (*—$CF_3$), each $R^e$ is an independent monovalent radical selected from the group consisting of hydrogen, methyl, and ethyl, and each X" is an independent divalent radical selected from the group consisting of *—O—*, *—S—*, —N(H)—*, and *—N(R")—*, wherein R" is a monovalent radical comprising 1 to 6 carbons.

In an embodiment, each B" is hydrogen, each $R^e$ is hydrogen, each $R^w$ is hydrogen, each $R^d$ is phenyl, $E^2$ is acetyl, and X" is *—O—*.

A more specific example of a block copolymer for self-assembly has a structure according to formula (B-5):

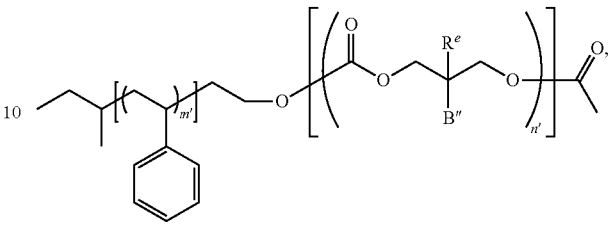

(B-5)

wherein each subscript m' and n' represents the average number of respective repeat units enclosed in parentheses, and independently has an average value greater than 1, each $R^e$ is an independent monovalent radical selected from the group consisting of hydrogen, methyl, and ethyl, and each B" is an independent monovalent radical selected from the group consisting of hydrogen and groups comprising 1 to 20 carbons.

In an embodiment, each $R^e$ is hydrogen and each B" is hydrogen. In another embodiment, each $R^e$ is methyl and each B" is *—$CO_2$Me, *—$CO_2$Et, *—$CO_2$Pr (propyl ester), or —$CO_2$Bn (benzyl ester).

Preparation of the Block Copolymers for Self-Assembly

The block copolymers for self-assembly are preferably prepared by ring opening polymerization of a cyclic carbonate monomer using a polymeric initiator having a backbone derived from a vinyl polymerizable monomer. For diblock and triblock copolymer formation, the polymeric initiator can comprise, respectively, 1 and 2 nucleophilic groups (e.g., *—OH, *—$NH_2$) capable of initiating the ROP of the cyclic carbonyl monomer. The ROP reaction mixture comprises a cyclic carbonyl monomer, a ROP catalyst, a solvent, and the polymeric initiator. The ROP catalyst is preferably an acid catalyst (e.g., diphenyl phosphate).

The following methods of forming a diblock copolymer can be applied to the preparations of triblock polymers and other block polymer architectures. The methods provide a block copolymer that is substantially free of any polycarbonate homopolymer and/or polycarbonate random copolymer.

Method 1

This method utilizes a solvent mixture to fractionate an initial block polymer formed when the ROP is conducted for a duration time corresponding to about 50% to 100%, more particularly about 85% to 100% consumption of a cyclic carbonate monomer. For a given set of reaction conditions (e.g., temperature, solvent, type of atmosphere, relative molar amounts, and other reaction parameters), the consumption of the cyclic carbonate monomer can be monitored using any suitable analytical technique (e.g., proton nuclear magnetic resonance ($^1$H NMR)).

The ROP produces an initial block polymer containing a living end group, which is a nucleophilic group capable of undergoing further chain growth and/or initiating a ROP of a different cyclic carbonyl monomer. Preferably, the active living end group is deactivated by addition of an endcapping agent to the reaction mixture, thereby terminating the polymerization and forming an endcapped initial block polymer containing a protected nucleophilic end group. The endcapped initial block polymer is not capable of initiating a ROP. As an example, a polycarbonate formed by ROP of a cyclic carbonate monomer has a living end containing a nucleophilic hydroxy group, which can be deactivated by addition of a suitable acylating agent (e.g., acetic anhydride) to form a protected hydroxy group (e.g., as an acetyl ester).

The isolated initial block polymer or the endcapped initial block polymer ("crude block polymer") can contain polymeric impurities derived from the cyclic carbonyl monomer that are not covalently linked to the polymeric initiator. Polymeric impurities can include polycarbonate homopolymer initiated by traces of water, and/or cyclic polycarbonate formed by backbiting of the living hydroxy end group on the polycarbonate backbone of the initial block polymer. These impurities can adversely affect the self-assembly properties of the initial block polymer.

The polymeric impurities can be removed by the following fractionation process. A first solution is prepared containing the initial block polymer dissolved in a minimal amount of a solvent (e.g., THF) capable of dissolving each block of the block polymer. The first solution contains the initial block polymer at a concentration of about 20 wt % based on total weight of the first solution. The first solution is then added to an excess amount (about 200 to 400 times the amount of crude polymer by weight) of a solvent mixture comprising a first solvent and a second solvent in a volume ratio of about 40:60 to about 60:40, respectively, wherein the first solvent is a non-solvent for the first block and the second block, and the second solvent is a non-solvent for the first block and a solvent for the second block. In an embodiment, the first solvent is MeOH and the second solvent is acetonitrile. The solvent mixture selectively dissolves the polymeric impurities, allowing the final block polymer to precipitate as a solid that can be substantially free of the polymeric impurities. The fractionation procedure can be repeated one or more times as necessary to form the block polymer used for self-assembly applications.

Method 2

In a second method, a trial ROP is performed using the given set of reaction conditions that includes the polymeric initiator. The amount of consumed cyclic carbonyl monomer is monitored (e.g., % consumption) as a function of ROP duration time t as in Method 1, allowing the ROP to proceed to 85% to 100% consumption of the cyclic carbonyl monomer. A graph is plotted of the percent consumption of the cyclic carbonate as a function of ROP duration time t in minutes.

From the scatter plot of the collected data points, a second order polynomial function F(t) (i.e., a trendline) can be fitted to the plotted points, wherein F(t) expresses the amount of consumed cyclic carbonyl monomer as a function of ROP duration time t. The $R^2$ (R-squared) coefficient for F(t) preferably has a value of about 0.85 to 1.0, more preferably 0.9 to 1.0.

Using the expression of F(t), a time $t_1$ corresponding to 50% consumption of the cyclic carbonyl monomer can be calculated.

The first derivative of F(t), denoted F'(t), is then calculated for each measurement time t.

The value of F'(t) at 50% cyclic monomer conversion is then determined. Using the value of $F'(t_1)$ at 50% cyclic monomer conversion, ROP duration times $t_2$ and $t_3$ are determined corresponding to a slope change of −10% and −20% relative to the slope at 50% consumption of cyclic carbonyl monomer.

The ROP is then conducted using the given reaction conditions, stopping the ROP at duration time (t'), wherein $t_1 \le t' \le t_3$, and more preferably $t_2 \le t' \le t_3$. Using these modified reaction conditions, a block polymer for self-assembly can be obtained directly that is free of, or substantially free of, polymer impurities that do not comprise a block derived from the polymeric initiator. Optionally, the block polymer can be further treated with the solvent mixture as described above under Method 1 to remove any remaining polymeric impurities.

Method 3

In Method 3, the mathematical expression for F'(t) is obtained as described above under Method 2. The value of F'(t) is then calculated for each ROP duration time t. Using the values of F'(t), the change in F'(t) between adjacent ROP duration times is calculated for each ROP duration time greater than 0. For example, the change in F'(t) at duration time $t_n$, denoted as $\Delta F'(t_n)$, is equal to $F'(t_n)-F'(t_{n-1})$, where n is a positive integer and $t_n > 0$.

A second order polynomial trendline D(t) is obtained for a scatter plot of $\Delta F'(t)$ as a function of t having the shape of an inverted parabola. D(t) has a first derivative D'(t) equal to zero at some ROP duration time t">0 that is less than the duration time corresponding to 100% consumption of the cyclic carbonyl monomer.

The ROP is repeated using the given reaction conditions, terminating the ROP at 0.8 t" to about t". The resulting final block polymer can be free of, or substantially free of, polymer impurities that do not comprise a block derived from the polymeric initiator. Optionally, the block polymer can be further treated with the solvent mixture as described above under Method 1 to remove any polymeric impurities present.

Cyclic Carbonyl Monomers

Exemplary cyclic carbonyl monomers include cyclic carbonate compounds of Scheme 20, which can be used, for example, to form a polycarbonate block of the initial block polymer.

Scheme 20.

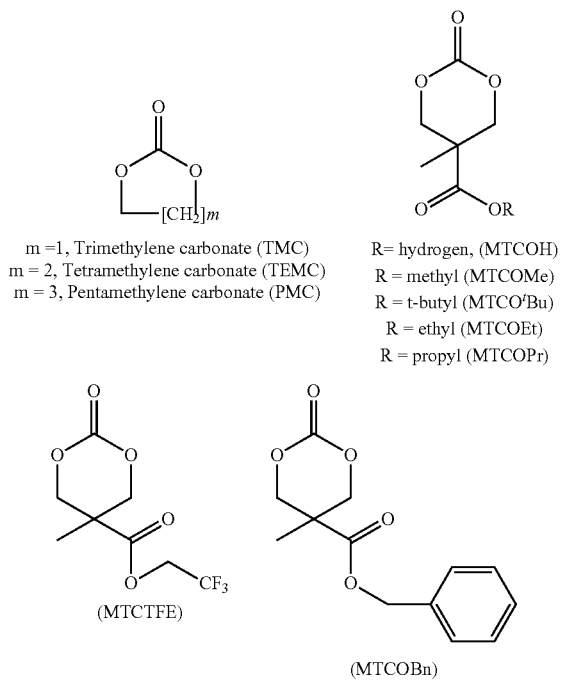

m = 1, Trimethylene carbonate (TMC)
m = 2, Tetramethylene carbonate (TEMC)
m = 3, Pentamethylene carbonate (PMC)

R = hydrogen, (MTCOH)
R = methyl (MTCOMe)
R = t-butyl (MTCO$^t$Bu)
R = ethyl (MTCOEt)
R = propyl (MTCOPr)

(MTCTFE)

(MTCOBn)

-continued

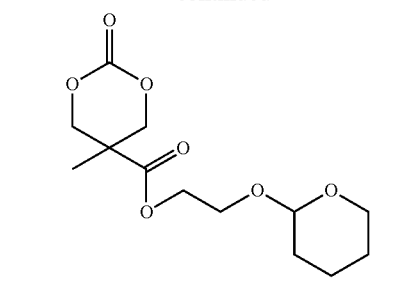

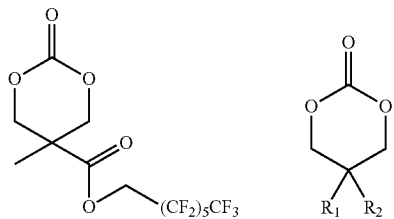

R₁ = R₂ = Methyl
R₁ = Methyl, R₂ = H
R₁ = R₂ = Ethyl
R₁ = Ethyl, R₂ = H

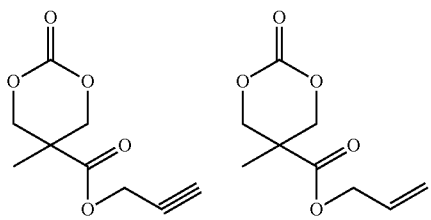

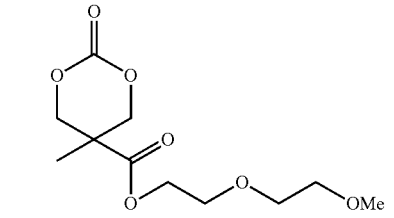

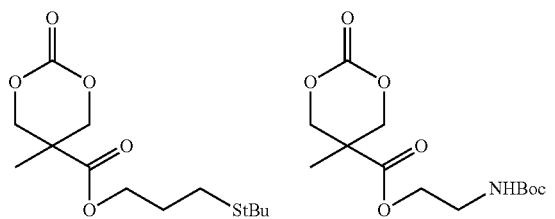

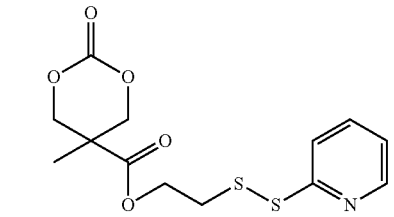

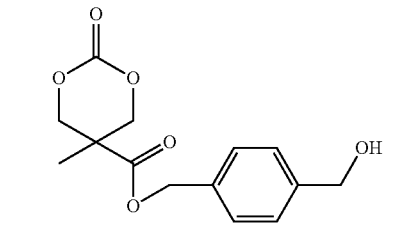

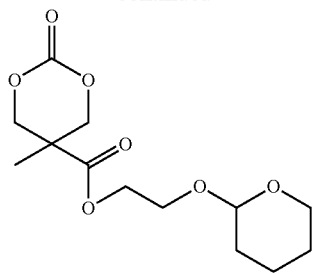

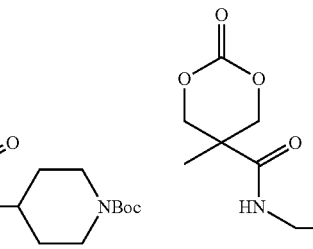

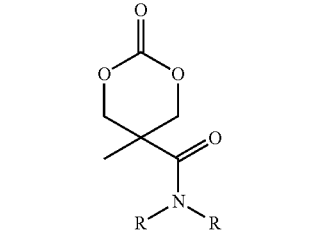

R = methyl
R = iso-propyl

Other cyclic carbonyl monomers include cyclic esters (lactones), such as the compounds of Scheme 21.

Scheme 21.

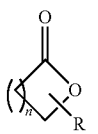 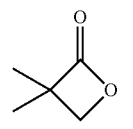

R = H, n = 1: beta-Propiolactone (b-PL)
R = H, n = 2: gamma-Butyrolactone (g-BL)
R = H, n = 3: delta-Valerolactone (d-VL)
R = H, n = 4: epsilon-Caprolactone (e-CL)
R = CH₃, n = 1: beta-Butyrolactone (b-BL)
R = CH₃, n = 2: gamma-Valerolactone (g-VL)

Pivalolactone (PVL)

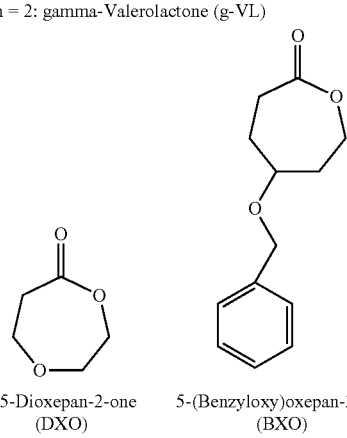

1,5-Dioxepan-2-one (DXO)

5-(Benzyloxy)oxepan-2-one (BXO)

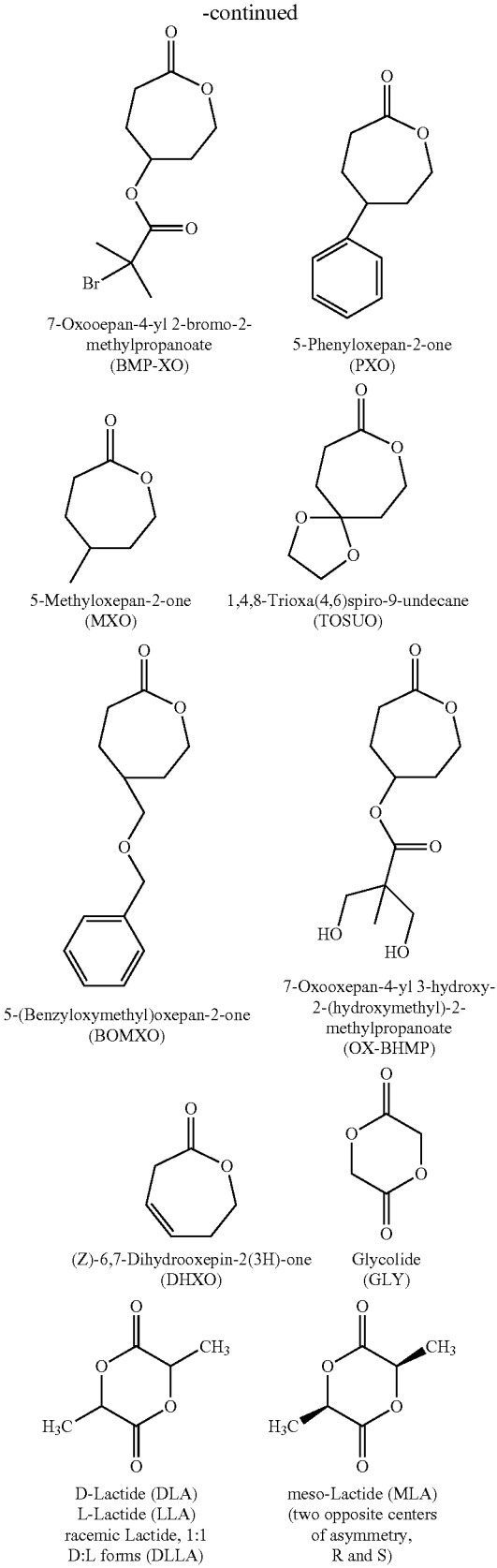

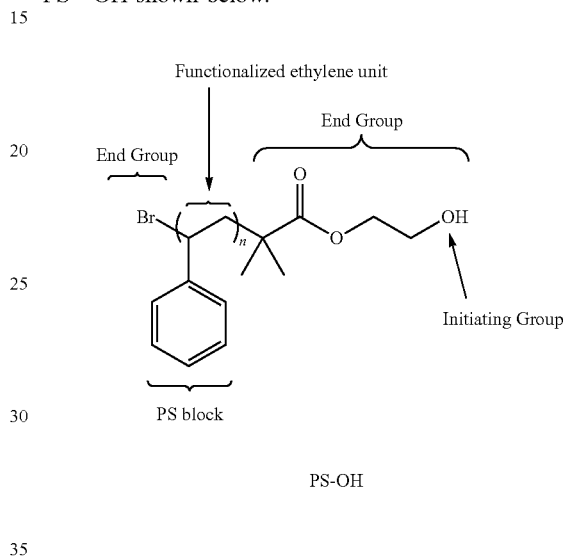

other known methods of purification, with particular attention being paid to removing as much water as possible from the monomer.

ROP Initiators for the Block Copolymers

Initiators for ring opening polymerizations generally include nucleophilic groups such as alcohols, primary amines, secondary amines, and thiols. Herein, the ROP initiator for the block copolymer is a polymeric initiator comprising a polymer backbone derived from a polymerizable vinyl monomer (styrenes, methacrylates, acrylates, methacrylamides, acrylamides, vinyl esters). An exemplary polymeric initiator is the functionalized polystyrene initiator PS—OH shown below.

The polymeric initiator preferably comprises one or two nucleophilic hydroxy groups for initiating a ROP and forming diblock, triblock, and tetrablock copolymers, respectively. In an embodiment, the polymeric initiator comprises two nucleophilic initiating groups, and the block copolymer formed by the ROP is a mikto-armed star polymer comprising 4 arms. A mikto-arm star polymer has a chemical structure comprising 3 or more polymer arms linked to a core of the star polymer, and at least one arm has a different polymer composition compared to another of the arms.

The number average molecular weight of the polymeric initiator can be from 1000 to 1,000,000, more specifically 1000 to 100,000, and even more specifically, 1000 to 50,000.

An exemplary non-limiting reaction to form a block copolymer is illustrated in Scheme 22 using another macroinitiator AZPS-OH.

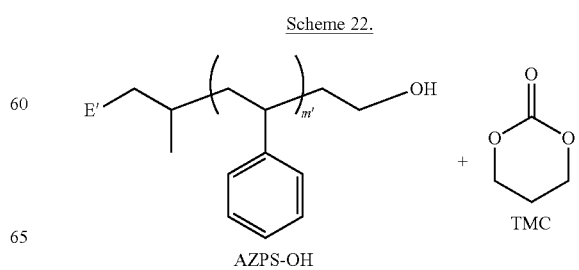

The above cyclic carbonyl monomers can be purified by recrystallization from a solvent such as ethyl acetate or by

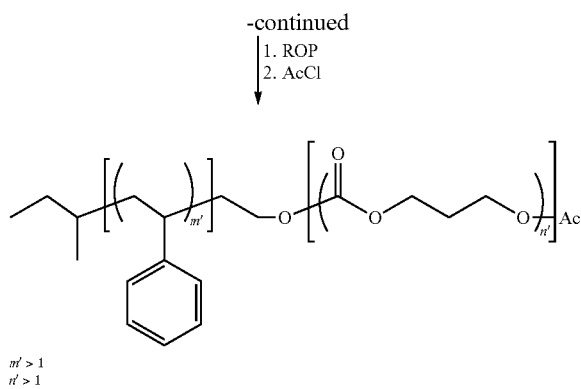

m' > 1
n' > 1

Ring Opening Polymerizations (ROP)

The following description of methods, conditions and materials for ring opening polymerizations is applicable to the preparation of the random copolymer for orientation control material and/or the block polymer for self-assembly.

The ring-opening polymerization can be performed at a temperature that is about ambient temperature or higher, 15° C. to 100° C., and more specifically ambient temperature. Reaction times vary with solvent, temperature, agitation rate, pressure, and equipment, but in general the polymerizations are complete within about 1 hour to about 48 hours.

The ROP reaction can be performed with or without the use of a solvent, preferably with a solvent. Exemplary solvents include dichloromethane, chloroform, benzene, toluene, xylene, chlorobenzene, dichlorobenzene, benzotrifluoride, petroleum ether, acetonitrile, pentane, hexane, heptane, 2,2,4-trimethylpentane, cyclohexane, diethyl ether, t-butyl methyl ether, diisopropyl ether, dioxane, tetrahydrofuran, or a combination comprising one of the foregoing solvents. When a solvent is present, a suitable monomer concentration is about 0.1 to 5 moles per liter, and more particularly about 0.2 to 4 moles per liter.

Whether performed in solution or in bulk, the ROP polymerizations are conducted using an inert (i.e., dry) atmosphere, such as nitrogen or argon, and at a pressure of from 100 to 500 MPa (1 to 5 atm), more typically at a pressure of 100 to 200 MPa (1 to 2 atm). At the completion of the reaction, the solvent can be removed using reduced pressure.

ROP Catalysts

No restriction is placed on the ROP catalyst. Less preferred catalysts for the ROP polymerization include metal oxides such as tetramethoxy zirconium, tetra-iso-propoxy zirconium, tetra-iso-butoxy zirconium, tetra-n-butoxy zirconium, tetra-t-butoxy zirconium, triethoxy aluminum, tri-n-propoxy aluminum, tri-iso-propoxy aluminum, tri-n-butoxy aluminum, tri-iso-butoxy aluminum, tri-sec-butoxy aluminum, mono-sec-butoxy-di-iso-propoxy aluminum, ethyl acetoacetate aluminum diisopropylate, aluminum tris(ethyl acetoacetate), tetraethoxy titanium, tetra-iso-propoxy titanium, tetra-n-propoxy titanium, tetra-n-butoxy titanium, tetra-sec-butoxy titanium, tetra-t-butoxy titanium, tri-iso-propoxy gallium, tri-iso-propoxy antimony, tri-iso-butoxy antimony, trimethoxy boron, triethoxy boron, tri-iso-propoxy boron, tri-n-propoxy boron, tri-iso-butoxy boron, tri-n-butoxy boron, tri-sec-butoxy boron, tri-t-butoxy boron, tri-iso-propoxy gallium, tetramethoxy germanium, tetraethoxy germanium, tetra-iso-propoxy germanium, tetra-n-propoxy germanium, tetra-iso-butoxy germanium, tetra-n-butoxy germanium, tetra-sec-butoxy germanium and tetra-t-butoxy germanium; halogenated compounds such as antimony pentachloride, zinc chloride, lithium bromide, tin(IV) chloride, cadmium chloride and boron trifluoride diethyl ether; alkyl aluminum such as trimethyl aluminum, triethyl aluminum, diethyl aluminum chloride, ethyl aluminum dichloride and tri-iso-butyl aluminum; alkyl zinc such as dimethyl zinc, diethyl zinc and diisopropyl zinc; tertiary amines such as triallylamine, triethylamine, tri-n-octylamine and benzyldimethylamine; heteropolyacids such as phosphotungstic acid, phosphomolybdic acid, silicotungstic acid and alkali metal salts thereof; zirconium compounds such as zirconium acid chloride, zirconium octanoate, zirconium stearate and zirconium nitrate. More particularly, the zirconium catalyst can be zirconium octanoate, tetraalkoxy zirconium or a trialkoxy aluminum compound.

Preferred ROP catalysts are organocatalysts whose chemical formulas contain no metal. Base organocatalysts for ROPs of cyclic carbonyl monomers include tertiary amines such as triallylamine, triethylamine, tri-n-octylamine and benzyldimethylamine 4-dimethylaminopyridine, phosphines, N-heterocyclic carbenes (NHC), bifunctional aminothioureas, phosphazenes, amidines, and guanidines.

A thiourea ROP organocatalyst is N-(3,5-trifluoromethyl)phenyl-N'-cyclohexyl-thiourea (TU):

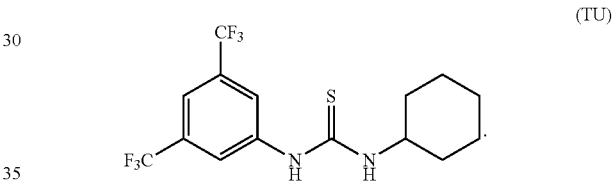

(TU)

Other ROP organocatalysts comprise at least one 1,1,1,3,3,3-hexafluoropropan-2-ol-2-yl (HFA) group. Singly-donating hydrogen bond catalysts have the formula (C-1):

$R^2$—$C(CF_3)_2OH$     (C-1), wherein $R^2$ represents a hydrogen or a monovalent radical having from 1 to 20 carbons, for example an alkyl group, substituted alkyl group, cycloalkyl group, substituted cycloalkyl group, heterocycloalkyl group, substituted heterocycloalkyl group, aryl group, substituted aryl group, or a combination thereof. Exemplary singly-donating hydrogen bonding catalysts are listed in Scheme 23.

Scheme 23.

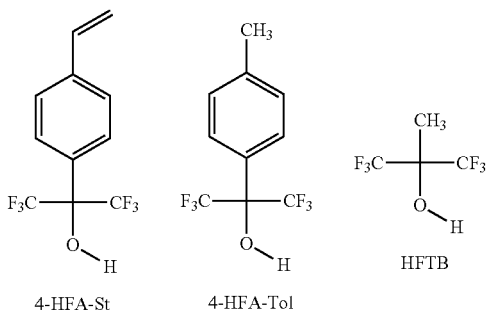

4-HFA-St    4-HFA-Tol    HFTB

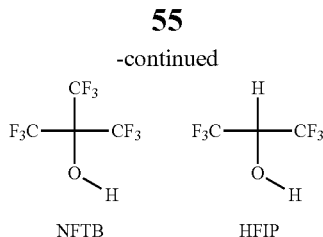

NFTB    HFIP

Doubly-donating hydrogen bonding catalysts have two HFA groups, represented by the general formula (C-2):

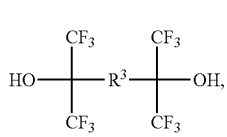

(C-2)

wherein R³ is a divalent radical bridging group containing from 1 to 20 carbons, such as an alkylene group, a substituted alkylene group, a cycloalkylene group, substituted cycloalkylene group, a heterocycloalkylene group, substituted heterocycloalkylene group, an arylene group, a substituted arylene group, or a combination thereof. Representative double hydrogen bonding catalysts of formula (C-2) include those listed in Scheme 24. In a specific embodiment, R² is an arylene or substituted arylene group, and the HFA groups occupy positions meta to each other on the aromatic ring.

Scheme 24.

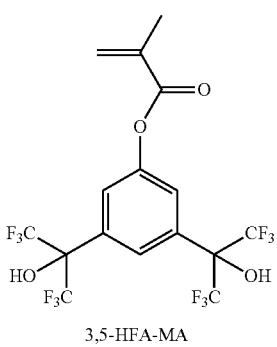

3,5-HFA-MA

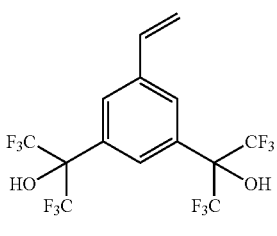

3,5-HFA-St

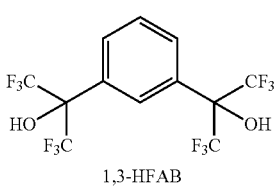

1,3-HFAB

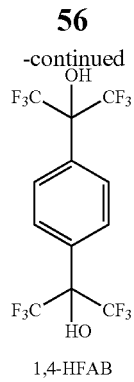

1,4-HFAB

Preferred hydrogen bonding catalysts include 4-HFA-St, 4-HFA-Tol, HFTB, NFTB, HPIP, 3,5-HFA-MA, 3,5-HFA-St, 1,3-HFAB, 1,4-HFAB, and combinations thereof The HFA catalyst can be bound to a support. In one embodiment, the support comprises a polymer, a crosslinked polymer bead, an inorganic particle, or a metallic particle. HFA-containing polymers can be formed by known methods including direct polymerization of an HFA-containing monomer (for example, the methacrylate monomer 3,5-HFA-MA or the styryl monomer 3,5-HFA-St). Functional groups in HFA-containing monomers that can undergo direct polymerization (or polymerization with a comonomer) include acrylate, methacrylate, alpha, alpha, alpha-trifluoromethacrylate, alpha-halomethacrylate, acrylamido, methacrylamido, norbornene, vinyl, vinyl ether, and other groups known in the art. Examples of linking groups include $C_1$-$C_{12}$ alkyl groups, $C_1$-$C_{12}$ heteroalkyl groups, ether groups, thioether groups, amino groups, ester groups, amide groups, and combinations thereof. Also contemplated are catalysts comprising charged HFA-containing groups bound by ionic association to oppositely charged sites on a polymer or a support surface.

Most preferably, the ROP catalyst is an acid organocatalyst (e.g., diphenylphosphate (DPP), triflic acid, and the like).

The ROP reaction mixture comprises at least one ROP catalyst and, when appropriate, several ROP catalysts together. The ROP catalyst is added in a proportion of 1/20 to 1/40,000 moles relative to the cyclic carbonyl monomers, and preferably in a proportion of 1/1,000 to 1/20,000 moles relative to the cyclic carbonyl monomers.

ROP Accelerators.

The ROP polymerization can be conducted in the presence of an optional accelerator, in particular a nitrogen base. Exemplary nitrogen base accelerators are listed below and include pyridine (Py), N,N-dimethylaminocyclohexane ($Me_2NCy$), 4-N,N-dimethylaminopyridine (DMAP), trans 1,2-bis(dimethylamino)cyclohexane (TMCHD), 1,8-diazabicyclo[5.4.0]undec-7-ene (DBU), 1,5,7-triazabicyclo[4.4.0]dec-5-ene (TBD), 7-methyl-1,5,7-triazabicyclo[4.4.0]dec-5-ene (MTBD), (−)-sparteine, (Sp) 1,3-bis(2-propyl)-4,5-dimethylimidazol-2-ylidene (Im-1), 1,3-bis(2,4,6-trimethylphenyl)imidazol-2-ylidene (Im-2), 1,3-bis(2,6-di-i-propylphenyl(imidazol-2-ylidene (Im-3), 1,3-bis(1-adamantyl)imidazol-2-ylidene (Im-4), 1,3-di-i-propylimidazol-2-ylidene (Im-5), 1,3-di-t-butylimidazol-2-ylidene (Im-6), 1,3-bis(2,4,6-trimethylphenyl)-4,5-dihydroimidazol-2-ylidene (Im-7), 1,3-bis(2,6-di-i-propylphenyl)-4,5-dihydroimidazol-2-ylidene, 1,3-bis(2,6-di-i-propylphenyl)-4,5-dihydroimidazol-2-ylidene (Im-8) or a combination thereof, shown in Scheme 25.

Scheme 25.

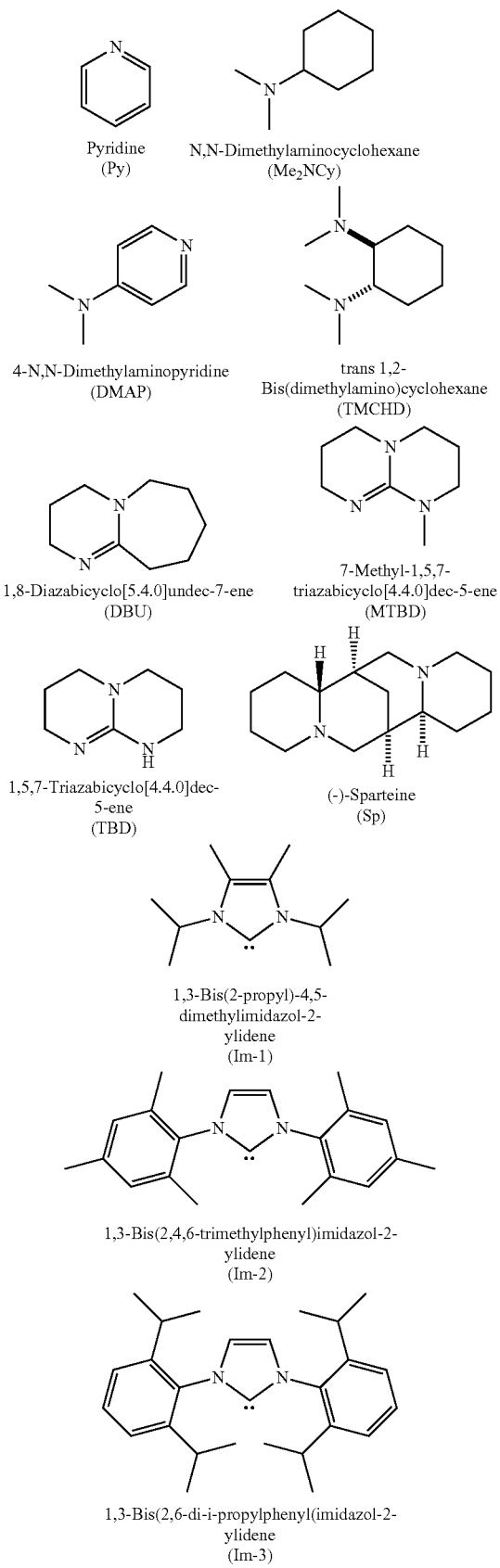

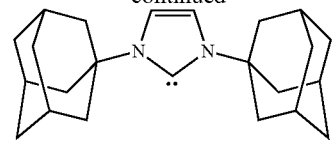

1,3-Bis(1-adamantyl)imidazol-2-yliden)
(Im-4)

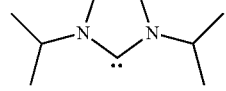

1,3-Di-i-propylimidazol-2-ylidene
(Im-5)

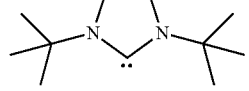

1,3-Di-t-butylimidazol-2-ylidene
(Im-6)

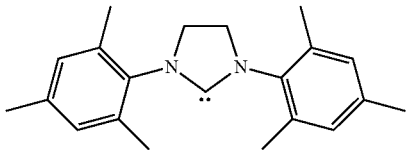

1,3-Bis(2,4,6-trimethylphenyl)-4,5-dihydroimidazol-2-ylidene
(Im-7)

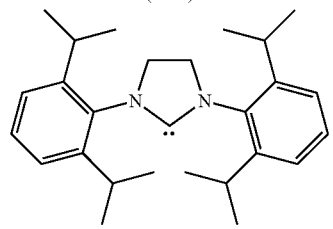

1,3-Bis(2,6-di-i-propylphenyl)-4,5-dihydroimidazol-2-ylidene
(Im-8)

In an embodiment, the accelerator has two or three nitrogens, each capable of participating as a Lewis base, as for example in the structure (−)-sparteine. Stronger bases generally improve the polymerization rate.

The catalyst and the accelerator can be the same material. For example, some ring opening polymerizations can be conducted using 1,8-diazabicyclo[5.4.0]undec-7-ene (DBU) alone, with no another catalyst or accelerator present.

The catalyst is preferably present in an amount of about 0.2 to 20 mol %, 0.5 to 10 mol %, 1 to 5 mol %, or 1 to 2.5 mol %, based on total moles of cyclic carbonyl monomer.

The nitrogen base accelerator, when used, is preferably present in an amount of 0.1 to 5.0 mol %, 0.1 to 2.5 mol %, 0.1 to 1.0 mol %, or 0.2 to 0.5 mol %, based on total moles of cyclic carbonyl monomer. As stated above, in some instances the catalyst and the nitrogen base accelerator can be the same compound, depending on the particular cyclic carbonyl monomer.

The amount of initiator is calculated based on the equivalent molecular weight per nucleophilic initiator group in the dinucleophilic initiator. The initiator groups are preferably present in an amount of 0.001 to 10.0 mol %, 0.1 to 2.5 mol %, 0.1 to 1.0 mol %, and 0.2 to 0.5 mol %, based on total moles of cyclic carbonyl monomer. For example, if the molecular weight of the initiator is 100 g/mole and the initiator has 2 hydroxyl groups, the equivalent molecular weight per hydroxyl group is 50 g/mole. If the polymerization calls for 5 mol % hydroxyl groups per mole of monomer, the amount of initiator is 0.05×50=2.5 g per mole of monomer.

In a specific embodiment, the catalyst is present in an amount of about 0.2 to 20 mol %, the nitrogen base accelerator is present in an amount of 0.1 to 5.0 mol %, and the nucleophilic initiator groups of the initiator are present in an amount of 0.1 to 5.0 mol % based on the equivalent molecular weight per nucleophilic initiator group of the initiator.

The catalysts can be removed by selective precipitation or in the case of the solid supported catalysts, simply by filtration. The block polymer can comprise residual catalyst in an amount of 0 wt % (weight percent) or more, based on total weight of the block copolymer and the residual catalyst. The amount of residual catalyst can also be less than 20 wt %, less than 15 wt %, less than 10 wt %, less than 5 wt %, less than 1 wt %, or most specifically less than 0.5 wt % based on the total weight of the block copolymer and the residual catalyst.

Endcap Agents

An endcap agent can prevent further chain growth and stabilize the reactive end groups from unwanted side reactions, such as chain scission. Endcap agents include, for example, compounds for converting terminal hydroxyl groups to esters, such as acid anhydrides (e.g., acetic anhydride), acid chlorides (acetyl chloride), and/or active esters (e.g., p-nitrophenyl esters). Other endcap agents include alkyl and aryl isocyanates, which form carbamates (urethanes) with terminal hydroxy groups. Other endcap agents include alkylating agents capable of forming alkyl ethers, aromatic ethers including benzyl ethers, silyl ethers, acetals, ketals, and the like. Still other endcap agents include perhalogenated (e.g., perfluorinated) derivatives of any of the foregoing endcap agents. In an embodiment, the endcap agent is acetic anhydride, which converts reactive hydroxy end groups to acetate ester groups.

Average Molecular Weight.

The block polymer used for self-assembly preferably has a number average molecular weight Mn as determined by size exclusion chromatography of at least 1500 g/mol, more specifically 1500 g/mol to 1,000,000 g/mol, 4000 g/mol to 150000 g/mol, or 4000 g/mol to 50000 g/mol. In an embodiment, the final block polymer has a number average molecular weight Mn of 8,000 to 40,000 g/mole.

The block polymer used for self-assembly also preferably has a narrow polydispersity index (PDI), generally from 1.01 to 2.0, more particularly 1.01 to 1.30, and even more particularly 1.01 to 1.25.

Layered Structures

The substrate is a layered structure, which can comprise an orientation control layer (underlayer). The orientation control layer of the substrate comprises a covalently bound form of the above-described random copolymer of the underlayer linked to the surface of the underlying layer of the substrate. The covalently bound random copolymer comprises a divalent first repeat unit of formula (A-1), a divalent second repeat unit of formula (A-2), and a trivalent third repeat unit of formula (A-8):

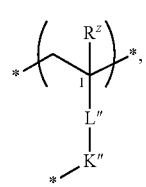
(A-8)

wherein
$R^z$ is a monovalent radical selected from the group consisting of H, methyl, ethyl, and trifluoromethyl (*—$CF_3$),
L" is an independent divalent linking group comprising 1 to 10 carbons, and
K" is a divalent linking group, and the starred bond of K" is covalently linked to a surface group of the substrate, and
the first repeat unit, second repeat unit, and third repeat are randomly covalently bound in the chemical structure of the random copolymer.

An orientation control layer can be formed by disposing on a first layered structure (first substrate) a solution containing an above-described random copolymer for the underlayer, a solvent, and optionally a member of the group consisting of thermal acid generators (TAGs), photo-acid generators (PAGs), catalysts, and combinations thereof, and removing the solvent (e.g., by a thermal bake and/or exposure to actinic light), thereby forming a second layer structure (second substrate) comprising an top orientation control layer. The orientation control layer comprises a covalently bound form of the random copolymer linked to an underlying layer of the first layered structure. Optionally, the second layered structure can be rinsed with a solvent to remove any un-bound random copolymer. The orientation control layer is neutral wetting with respect to the high-chi block copolymer for self-assembly, which comprises a polycarbonate block. The thermal bake can be performed at a temperature of about 100° C. to about 250° C. for about 1 second to about 24 hours, preferably about 120° C. to about 250° C. for 1 minute to 5 minutes.

Also disclosed are compositions for preparing the SA layers. The compositions comprise a solvent, a high-chi block copolymer, and an SAP. The block copolymer and the SAP are dissolved in the solvent. The compositions are suitable for forming a film layer (SA layer) comprising the block copolymer. The film layer is preferably disposed on an orientation control layer (underlayer). The film layer has a top surface in contact with the atmosphere. The film layer comprises the block copolymer and the polymer additive in non-covalent association.

The following schematic diagrams illustrate methods of forming substrates comprising underlayers for orientation control and their use in forming perpendicularly oriented lamellar domain patterns with high-chi block copolymers.

FIGS. 1A to 1F are cross-sectional layer diagrams illustrating a process of directed self-assembly of an SA layer comprising a high-chi block copolymer and SAP additive, which produces perpendicularly oriented lamellar domains without employing a lithographically prepared topographic or chemical pre-pattern. It should be understood that the layers and features are not drawn to scale.

Layered structure 10 of FIG. 1A comprises substrate 11 having substrate surface 12. Substrate 11 can comprise one or more layers (not shown). A solution comprising a disclosed random copolymer for orientation control, which is dissolved in a suitable solvent, is applied to substrate surface 12 (e.g., by spin coating), followed by removal of any solvent, resulting in layered structure 20 (FIG. 1B), also referred to as a "modified substrate". Layered structure 20 comprises underlayer 21 for orientation control, which comprises the random copolymer bound by at least one covalent bond to substrate 11. Optionally, layered structure 20 can be rinsed with a solvent to remove any un-bound random copolymer.

Figure 1C:
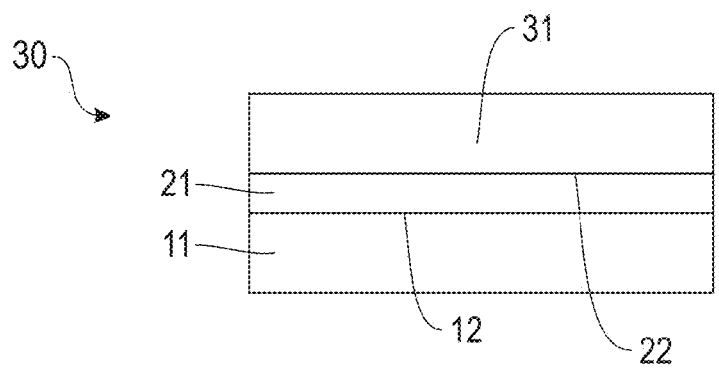
Figure 1D:
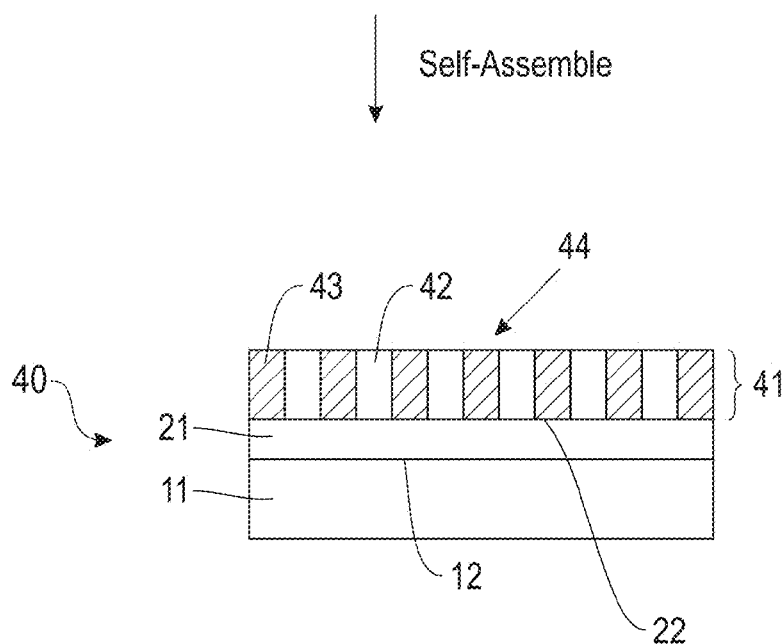
Figure 1E:
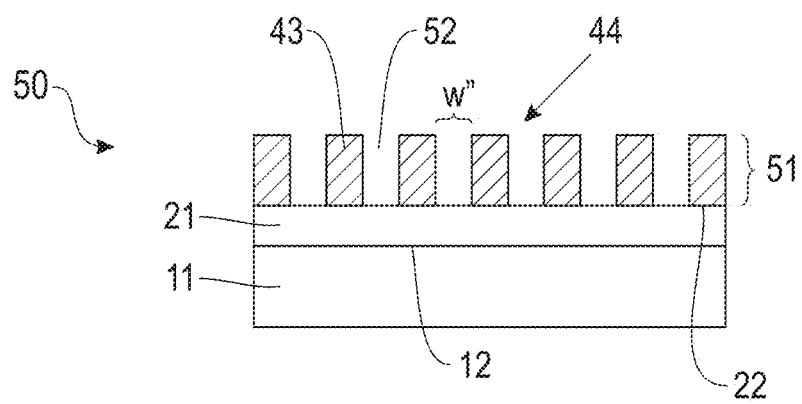
Figure 1F:
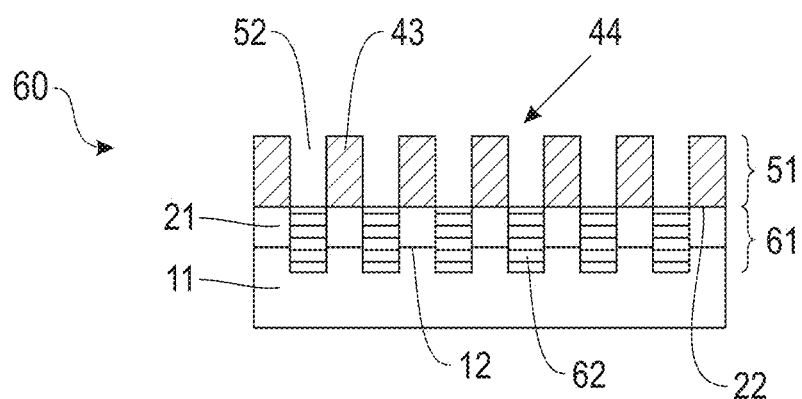

Underlayer 21 has underlayer surface 22. A solution comprising a disclosed high-chi block copolymer comprising a polycarbonate block for self-assembly (SA material), a disclosed SAP, and a solvent is applied to underlayer surface 22 using any suitable technique (e.g., spin coating). Removal of the solvent followed by an optional post-application bake (PAB) (e.g., 115° C. for 1 minute) produces layered structure 30 (FIG. 1C). Layered structure 30 comprises SA layer 31 comprising the block copolymer and SAP. SA layer 31 is disposed on underlayer surface 22. SA layer 31 is then subjected to conditions effective in inducing the block copolymer to self-assemble (e.g., annealing layered structure 30 at a temperature of 120° C. to 250° C. for about 1 minute to about 24 hours), thereby forming layered structure 40 (FIG. 1D). Layered structure 40 comprises perpendicularly oriented lamellar domain pattern 41 of self-assembled block copolymer disposed on underlayer surface 22. Domain pattern 41 comprises first lamellar domain 43 comprising a first block of the block copolymer (e.g., block A, polystyrene) and second lamellar domain 42 comprising a polycarbonate block (e.g., block B) of the high-chi block copolymer. Second lamellar domain 42 has a higher concentration of SAP than first lamellar domain 43 (not shown). In this instance the lamellae of each of the domains formed by the block copolymer are in contact with atmosphere interface 44 and underlayer surface 22. Self-assembly of SA layer is conducted with the top surface of SA layer 31 in contact atmosphere interface 44.

One of the domains can be selectively removed (e.g., etched) or modified in the presence of the other domain. As an example, dry etching using a suitable gas (02) or wet/chemical etching technique can be used to selectively etch second lamellar domain 42. As another example, first lamellar domain 43 (polystyrene block) can be selectively etched by modifying second lamellar domain 42 by i) sequential infiltration synthesis (SIS) to infuse metal oxide precursors or ii) by solution infiltration of second lamellar domain 42 with metal salts, followed by ion-etching of first lamellar domain 43. Selective removal of one of the domains can also remove underlying orientation control material of the underlayer (not shown).

Selective removal of one of the domains produces layered structure 50 (FIG. 1E) comprising etched domain pattern 51. In this example, etched domain pattern 51 comprises first lamellar domain 43 disposed on underlayer surface 22, and openings 52 (shown). Alternatively, first lamellar domain 43 can be selectively removed leaving second lamellar domain 42 (not shown). Lamellae of first lamellar domain 43 can have different dimensions after removing second lamellar domain 42 compared to their dimensions before the selective removal. Openings 52 can have a width w" of about 0.5Lo, (e.g., for low-chi SA materials, w" is about 10 nm to about 100 nm). The selective removal process may be carried out by a thermal bake (for thermally decomposable materials), a reactive ion etch process, dissolution in a selective solvent, or a combination thereof. A chemical modification can be accomplished by a variety of known methods. For example, domains can be selectively reacted with silanes or silyl chlorides to introduce silicon content into a domain and thereby increase its plasma etch resistance. Alternatively, chemical agents can be used to bind or chemically couple to functional groups that are exclusively located in one type of self-assembled domain, to effect, for example, increased solubility property differences that can advantageously be used to selectively remove one domain in the presence of the other domain.

Lastly, etched domain pattern 51 can be transferred to substrate 11, thereby forming layered structure 60 (FIG. 1F) comprising transfer pattern 61. Patterned region 61 can be a pattern of lines, holes, pits, and/or a chemically altered state of the underlayer 21 and/or substrate 11, which are represented by areas 62. Patterned region 61 can extend into one or more layers, including the underlayer 21 and/or the substrate 11 (shown). The pattern transfer process can further comprise removal of first lamellar domain 43 (not shown).

FIGS. 2A to 2E are cross-sectional layer diagrams illustrating a lithographic process utilizing a pre-formed topographic pre-pattern with the disclosed underlayer and SA layer comprising a high-chi block copolymer and SAP. Layered structure 100 (FIG. 2A) comprises substrate 110 comprising underlayer 102 disposed on surface 103 of bottom layer 101 (e.g., silicon wafer). Topographic pre-pattern 104 is disposed on underlayer surface 105. Underlayer 102 comprises a form of the disclosed random copolymer bound by at least one covalent bond to surface 103. Bottom layer 101 can comprise one or more sub-layers (not shown). Topographic pre-pattern 104 comprises features 106 (e.g., resist features). Features 106 have sidewalls 107 of height h', and top surfaces 108 of width w'. Features 106 are separated by trenches 109 (recessed areas) which include bottom surfaces 112 comprising material of underlayer 102 in contact with an atmosphere. Pre-pattern 104 can be formed by any suitable lithographic technique. Features 106 can comprise any suitable material 111 for directing self-assembly. For example, features 106 can comprise a resist material, which can be a positive and/or negative tone resist material.

In the present invention, the topography of pre-pattern 104 is not essential for orientation control of the self-assembled lamellar domains of the high-chi block copolymer. The SA layer is allocated substantially or wholly within the trench areas 109 of features 106. Height h' of features 106 is typically greater than or comparable to the thickness of the SA layer. Bottom surface 112 is neutral wetting to the SA material (block copolymer), whereas the air interface is not neutral to the SA material. In this example, sidewalls 107 can be neutral wetting or non-neutral wetting to the block copolymer, with the proviso that the surface properties of the sidewalls do not adversely affect self-assembly and orientation of the domains formed.

Figure 2A:
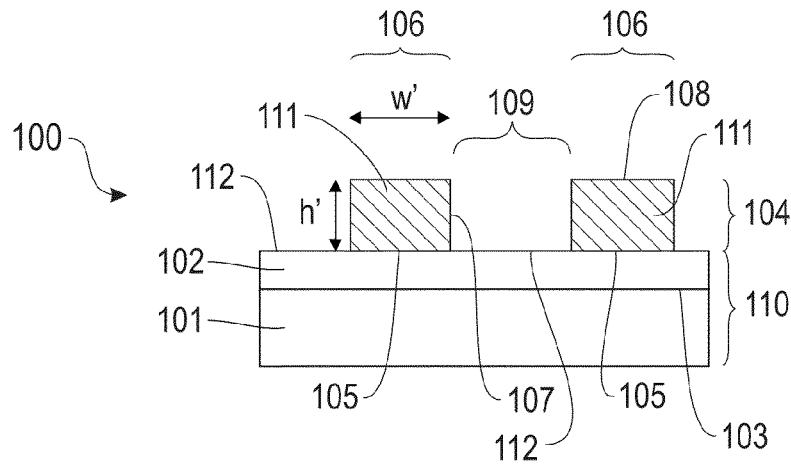
FIGS. 2A to 2E are cross-sectional layer diagrams showing a process of forming a perpendicularly oriented lamellar domain pattern in the presence of a topographic pre-pattern. The air interface is not neutral wetting to the block copolymer in the absence of the SAP. The air interface becomes neutral wetting to the block copolymer during self-assembly. The resist features can be non-neutral wetting to the SA layer comprising the high-chi block copolymer and SAP.
Figure 2B:
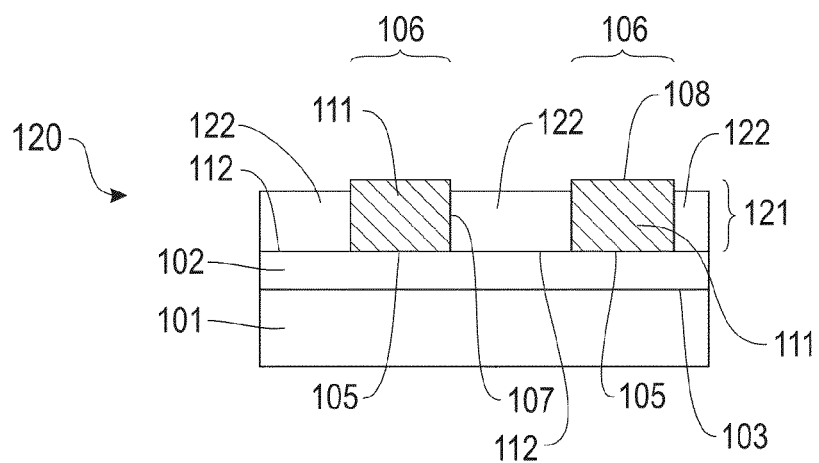
Figure 2C:
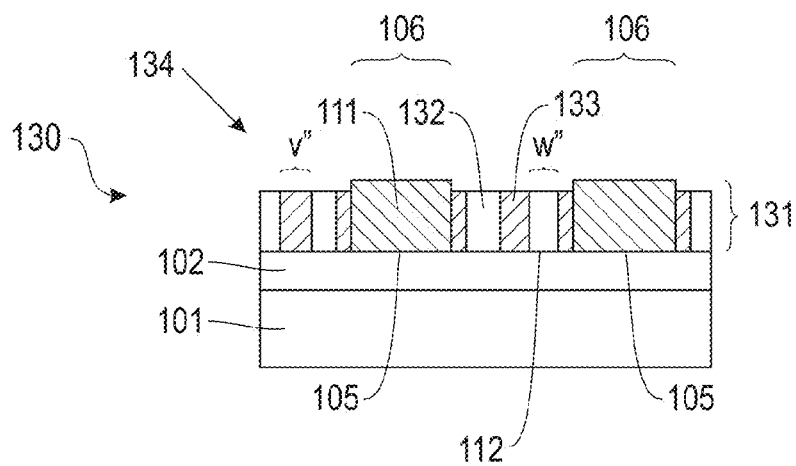

A coating mixture comprising the SA material (a high-chi block copolymer) and SAP dissolved in a solvent is applied to topographic pre-pattern 104 using any suitable technique (e.g., spin coating), thereby allocating the mixture substantially or exclusively in trench areas 109. Topographic pre-pattern 104 is insoluble in or substantially insoluble in the solvent used to prepare the mixture. Removal of the solvent from the applied coating mixture provides layered structure 120 comprising SA layer 121 (FIG. 2B). SA layer 121 comprises regions 122 comprising the SA material (high-chi block copolymer) and SAP. SA layer 121 is disposed on bottom surfaces 112 of trench areas 109.

Self-assembly of the high-chi block copolymer produces layered structure 130 (FIG. 2C) comprising perpendicularly oriented lamellar domain pattern 131. Self-assembly can be spontaneous and/or assisted by a thermally treating (annealing) layer 121. Domain pattern 131 comprises first lamellar domain 133 (e.g., PS) having a width of v", and second lamellar domain 132 (e.g., polycarbonate) having a width w" and disposed on bottom surface 112 of trench areas 109. Atmosphere interface 134 is indicated by the arrow. In this example, sidewalls 107 of features 106 have preferential affinity for first lamellar domains 133. Therefore, first lamellar domain 133 are positioned in contact with sidewalls 107.

First lamellar domain 133 in contact with sidewalls 107 can have a width of about 0.5 v". In an embodiment, v" and w" are about equal to 0.5Lo.

Figure 2D:
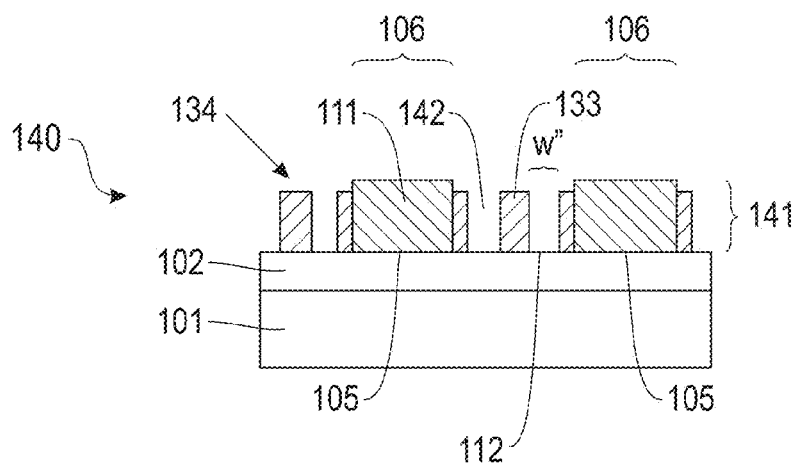

One of the domains, for example second lamellar domain 132 (e.g., polycarbonate block), can be selectively removed (e.g., ion-etched) or modified in the presence of the first lamellar domain 133 (e.g., PS block) to generate topographical or chemical contrast. Selective removal of one of the domains can also remove underlying orientation control material (not shown), producing layered structure 140 comprising etched domain pattern 141 (FIG. 2D). Etched domain pattern 141 comprises first lamellar domain 133 disposed on underlayer surface 112, openings 142, and features 106. Openings 142 can have a width w" of about 0.5Lo (e.g., for a high-chi block copolymer, w" can be about 2 nm to about 10 nm). The selective removal process may be carried out by a thermal bake (for thermally decomposable materials), a reactive ion etch process, dissolution in a selective solvent, or a combination thereof. A chemical modification may be accomplished by a variety of known methods as discussed above. The selective removal process can further remove features 106 (not shown).

Figure 2E:
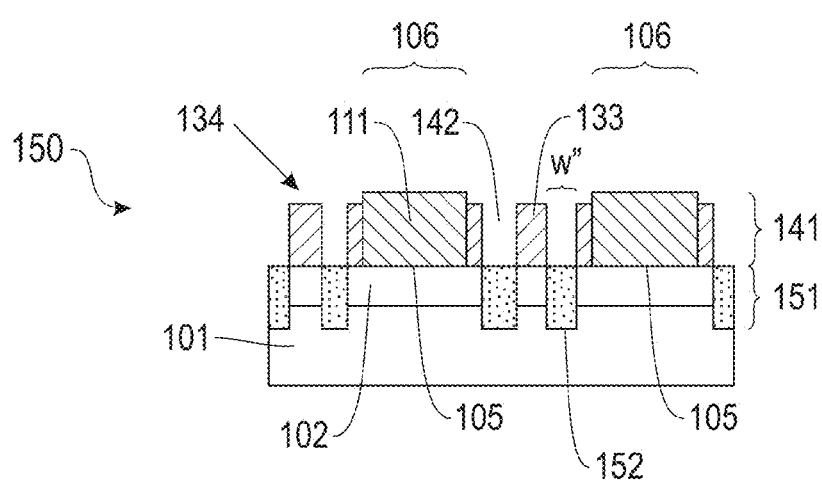
Figure 3:
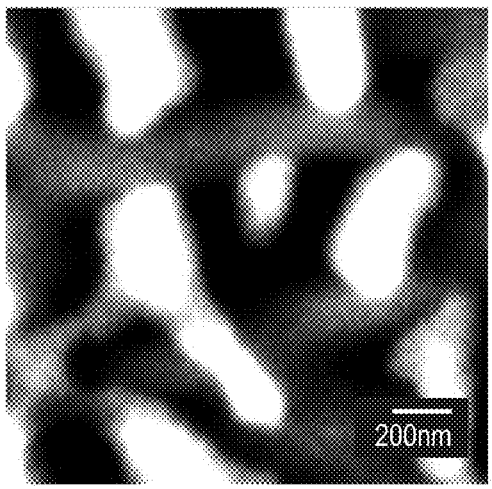
FIG. 3 is an AFM height image of the self-assembled block copolymer film of Example 66.
Figure 4:
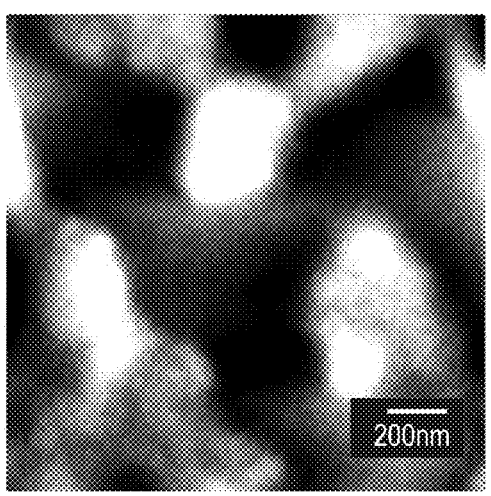
FIG. 4 is an AFM height image of the self-assembled block copolymer film of Example 67.
Figure 5:
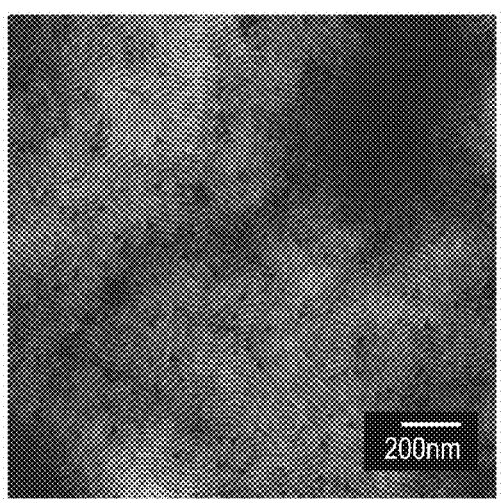
FIG. 5 is an AFM height image of the self-assembled block copolymer film of Example 68.
Figure 6:
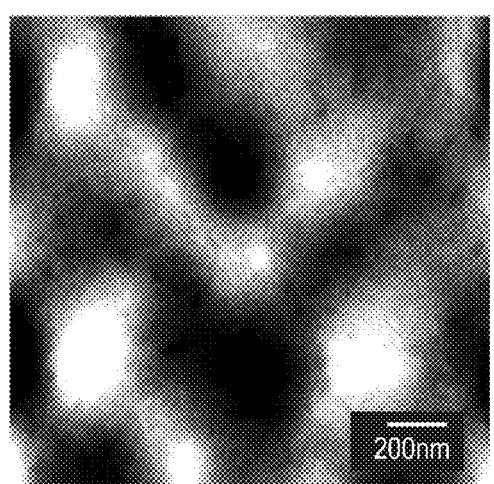
FIG. 6 is an AFM height image of the self-assembled block copolymer film of Example 69.
Figure 7:
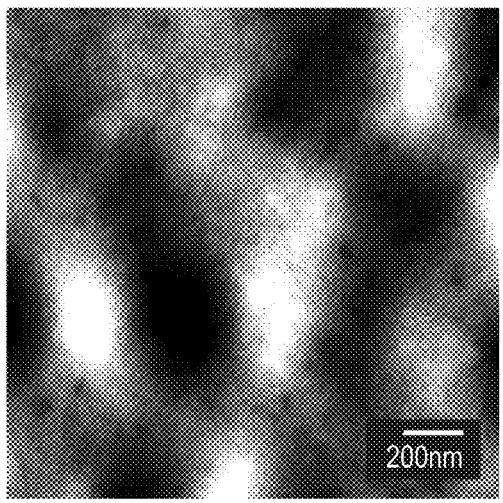
FIG. 7 is an AFM height image of the self-assembled block copolymer film of Example 70.
Figure 8:
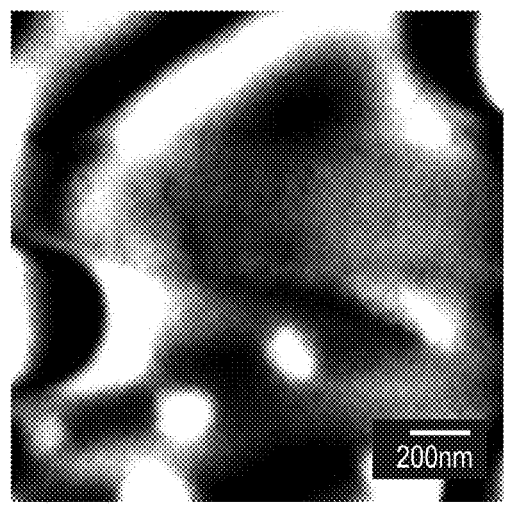
FIG. 8 is an AFM height image of the self-assembled block copolymer film of Example 71.
Figure 9:
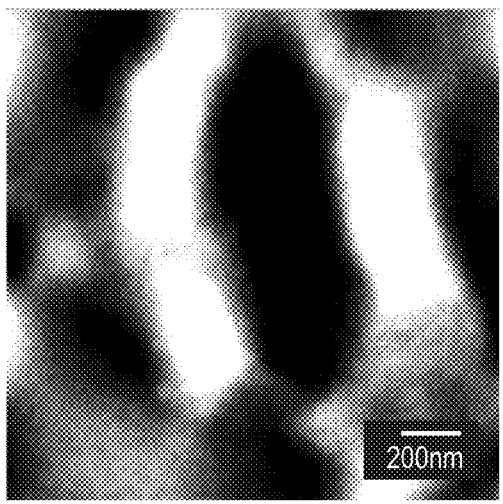
FIG. 9 is an AFM height image of the self-assembled block copolymer film of Example 72.
Figure 10:
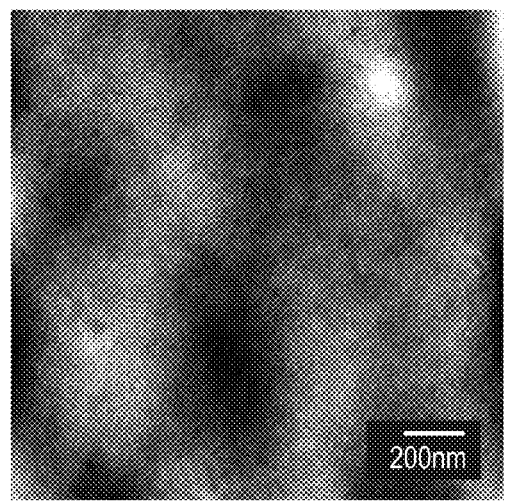
FIG. 10 is an AFM height image of the self-assembled block copolymer film of Example 73.
Figure 11:
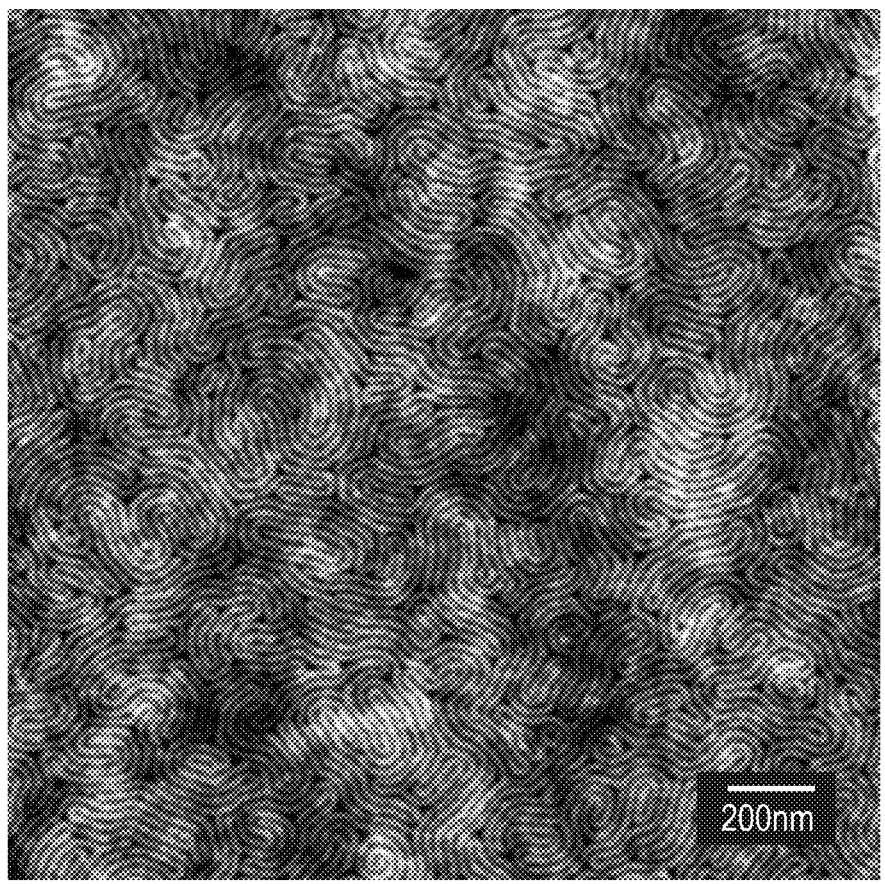
FIG. 11 is an AFM height image of the self-assembled block copolymer film of Example 74.
Figure 12:
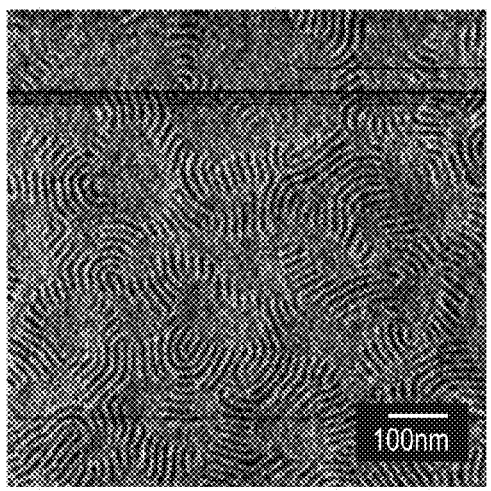
FIG. 12 is an AFM height image of the self-assembled block copolymer film of Example 75.
Figure 13:
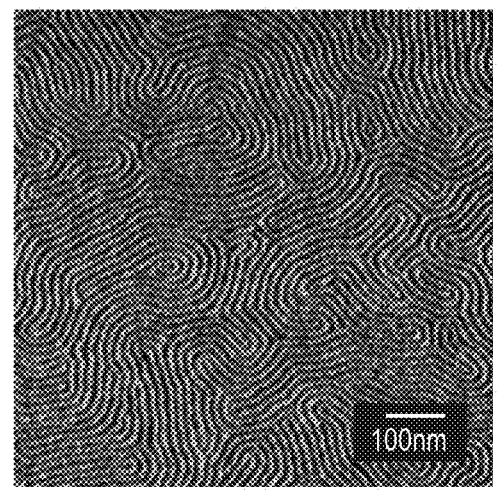
FIG. 13 is an AFM height image of the self-assembled block copolymer film of Example 76.
Figure 14:
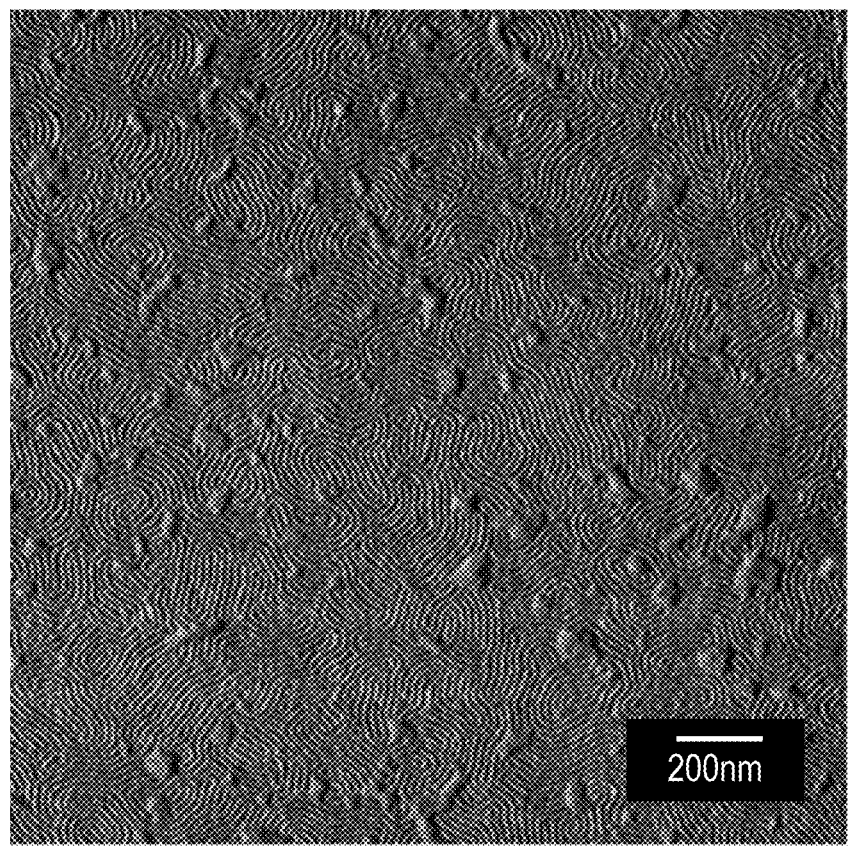
FIG. 14 is an AFM height image of the self-assembled block copolymer film of Example 77.
Figure 15:
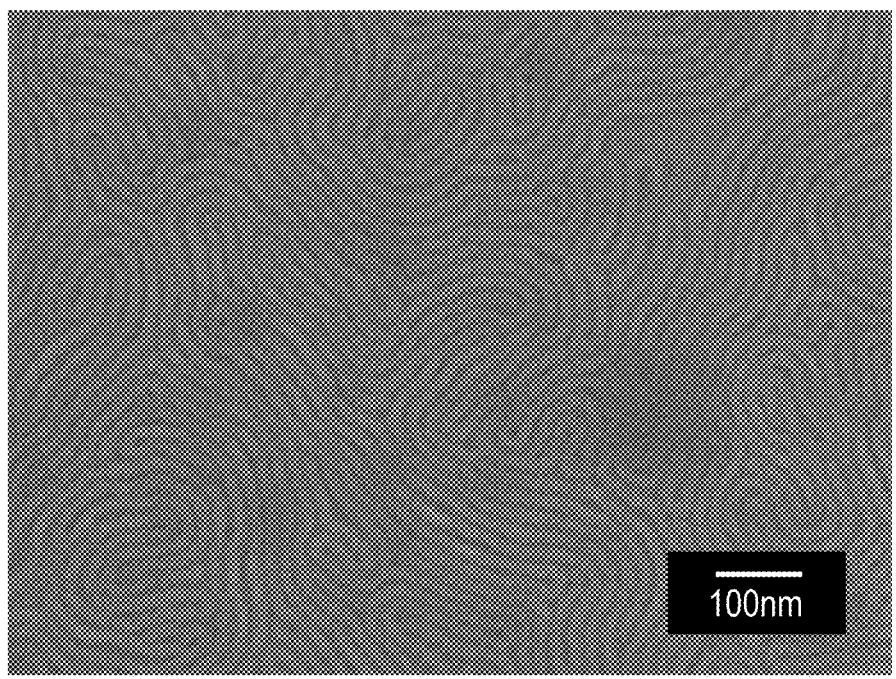
FIG. 15 is an AFM height image of the self-assembled block copolymer film of Example 78.

Finally, etched domain pattern 141 can be transferred to underlayer 102 and/or bottom layer 101, thereby forming layered structure 150 comprising patterned region 151 (FIG. 2E). Patterned region 151 can be a pattern of lines, holes, pits, and/or a chemically altered state of the substrate material represented by altered areas 152. Patterned region 151 can extend into one or more layers of bottom layer 101. The pattern transfer can be accomplished, for example, by using a reactive ion etch process. Features 106 and first lamellar domain 133 can be removed concomitantly or subsequently to formation of altered areas 152. The height of etched domain pattern 141 after the transfer can be less than the height of etched domain pattern 141 before the transfer.

The substrate, and more particularly the surface of the substrate, can comprise inorganic or organic materials such as metals, carbon, or polymers. More particularly, the substrate can comprise a semiconducting material including, for example, Si, SiGe, SiGeC, SiC, Ge alloys, GaAs, InAs, InP, silicon nitride, titanium nitride, hafnium oxide, as well as other III-V or II-VI compound semiconductors. The substrate can also comprise a layered semiconductor such as Si/SiGe, or a semiconductor-on-insulator (SOI). In particular, the substrate can contain a Si-containing semiconductor material (i.e., a semiconductor material that includes Si). The semiconductor material can be doped, non-doped or contain both doped and non-doped regions therein.

The substrate can have an anti-reflection control layer (ARC layer) or a bottom ARC layer (BARC layer) to reduce reflectivity of the film stack. Many suitable BARCs are known in the literature including single layer BARCs, dual layer BARCs, graded BARCs, and developable BARCs (DBARCs). The substrate can also comprise a hard mask, a transfer layer (e.g., planarizing layer, spin-on-glass layer, spin-on carbon layer), and other materials as required for the layered device.

Auxiliary Polymers

The substrate, the underlayer and/or the SA layer referred to above can include other polymers, referred to as auxiliary polymers. The auxiliary polymer can be a homopolymer, random copolymer, or block copolymer.

The auxiliary polymers can comprise a hydroxyl group. These include hydroxyl-terminated polymers (e.g., hydroxyl-terminated poly(styrene-co-methyl methacrylate and blends of hydroxyl-terminated poly(styrene), hydroxyl-terminated poly(methyl methacrylate), and poly(styrene-b-methyl methacrylate)), hydroxyl-functionalized polymers (e.g., poly(styrene-co-methyl methacrylate-co-2-hydroxyethyl methacrylate)).

Other auxiliary polymers include materials comprising reactive groups, such as those derived from epoxydicyclopentadiene methacrylate, glycidyl methacrylate, or vinyl cinnamates. Exemplary materials comprising reactive groups include poly(styrene-co-epoxydicyclopentadiene methacrylate), poly(styrene-co-methyl methacrylate-co-epoxydicyclopentadiene methacrylate), poly(styrene-co-methyl methacrylate-co-glycidyl methacrylate), poly(styrene-co-methyl methacrylate-co-vinyl cinnamate) poly(styrene-co-methyl methacrylate-co-vinyl benzocyclobutane), and poly(alpha-methyl styrene-co-methyl methacrylate)). The reactive polymers may react as a result of thermal or photochemical treatment either alone or in conjunction with an additional crosslinking agent. In particular, a catalytic species such as a strongly acidic species may be used to facilitate reaction. The strongly acidic species may be directly incorporated into a coating composition. Alternatively, a thermal acid generator or photoacid generator molecule may be used to generate an acidic species as a result of thermal or photochemical treatment, respectively.

Other non-limiting examples of auxiliary polymers include materials used in ARC layers, which can include homopolymers and copolymers selected from the group consisting of polybisphenols, polysulfones, polycarbonates, polyhydroquinones, polyphthalates, polybenzoates, polyphenylethers, polyhydroquinone alkylates, polycarbamates, polymalonates and mixtures thereof. These moieties are typically functionalized in order to tune the required physical properties of the polymer (optical constants, surface energy). The polymer components can also contain a plurality of reactive sites distributed along the polymer for reaction with a crosslinking component. More specific materials used in ARC layers include poly(4,4'-methylenebisphenol-co-epichlorohydrin), poly(4,4'-ethylidenebisphenol-co-epichlorohydrin), poly(4,4'-isopropylidenebisphenol-co-epichlorohydrin), poly(4,4'-isopropylidenebis[2-methylphenol]-co-epichlorohydrin), poly(4,4'-isopropylidenebis[2,6-dimethylphenol]-co-epichlorohydrin), poly(4,4'-cyclohexylidenebisphenol-co-epichlorohydrin), poly(4,4'-[1-phenylethylidene]bisphenol-co-epichlorohydrin), poly(4,4'-trifluoroisopropylidenebisphenol-co-epichlorohydrin), poly(4,4'-hexafluoroisopropylidenebisphenol-co-epichlorohydrin), poly(4,4'-sulfonylbisphenol-co-epichlorohydrin), poly(bisphenol AF adipic ester), poly(bisphenol AF succinic ester), poly(4,4'-hexafluoroisopropylidenediphthalate-co-epichlorohydrin), poly(4,4'-hexafluoroisopropylidenediphthalate-co-poly(bisphenol AF)), poly(4,4'-hexafluoroisopropylidenebisbenzoate-co-epichlorohydrin), poly(3,3',4,4'-benzophenonetetracarboxylate-co-epichlorohydrin), poly(4,4'-hexafluoroisopropylidenediphthalate-co-epichlorohydrin-co-2,6-bis[hydroxymethyl]-p-cresol), poly(3,3',4,4'-benzophenonetetracarboxylate-co-epichlorohydrin-co-2,6-bis[hydroxymethyl]-p-cresol), poly(terephthalate-co-epichlorohydrin), poly(2-nitroterephthalate-co-epichlorohydrin), poly(2-nitrophthalate-co-epichlorohydrin), poly(2-nitroisophthalate-co-epichlorohydrin), poly(hydroquinone-co-epichlorohydrin), poly(methylhydroquinone-co-epichlorohydrin), poly(1,2,4-benzenetriol-co-epichlorohydrin), poly(methylene-bis[4-aminophenyl]-co-glycerol carbamate), poly(isopropylidenebis[4-aminophenyl]-co-glycerol carbamate), poly (isopropylidene-bis[3-carboxy-4-aminophenyl]-co-glycerol carbamate), poly(methylene-bis[4-hydroxyphenyl]-co-glycerol carbonate), poly(isopropylidene-bis[4-hydroxyphenyl]-co-glycerol carbonate), poly(isopropylidene-bis[3-carboxy-4-hydroxyphenyl]-co-glycerol carbonate), poly(2-phenyl-1,3-propanediol malonate), poly(2-phenyl-1,3-propanediol 2-methyl-malonate), poly(1,3-propanediol benzylidene-malonate), poly(2-phenyl-1,3-propanediol benzylidene-malonate), glycidyl end-capped poly(bisphenol A-co-epichlorohydrin), and silicon-containing anti-reflection coating A940 from Shin Etsu. Another more specific auxiliary polymer is poly(styrene-co-epoxydicyclopentadiene methacrylate) random copolymer, P(Sty-r-EDCPMA):

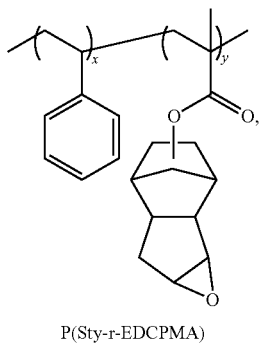

P(Sty-r-EDCPMA)

wherein x and y are each integers greater than 1. Other auxiliary polymers include poly(styrene-co-methyl methacrylate-co-epoxydicyclopentadiene methacrylate), poly(styrene-co-methyl methacrylate-co-glycidyl methacrylate), poly(styrene-co-methyl methacrylate-co-2-hydroxyethyl methacrylate), poly(styrene-co-methyl methacrylate-co-4-vinyl cinammate), poly(styrene-co-methyl methacrylate-co-vinyl benzocyclobutane), poly(styrene-co vinyl benzocyclobutane), poly(alpha-methyl styrene-co-methyl methacrylate), and poly(methyl glutarimide) (PMGI). Other auxiliary polymers comprise polymer brush layers including those formed by hydroxyl-terminated poly(styrene-co-methyl methacrylate), poly(styrene-co-methyl methacrylate-co-2-hydroxyethyl methacrylate), hydroxyl-terminated poly(styrene), hydroxyl-terminated poly(methyl methacrylate), poly(styrene-b-methyl methacrylate) block copolymer, and combinations of the foregoing surface affinity materials. Other auxiliary polymers include other block copolymers capable of forming self-assembled monolayers.

The coating composition used to prepare the underlayer comprises at least a solvent and a disclosed random copolymer.

The coating composition used to prepare the SA layer comprising a disclosed block copolymer comprises at least a solvent, a disclosed high-chi block copolymer comprising a polycarbonate block, and a disclosed SAP.

The foregoing compositions can additionally comprise other materials including surfactants, polymers, photoacid generators, and thermal acid generators. For example, an organosilicate resin can be included in the composition for preparing an underlayer.

The compositions for preparing the underlayer and SA layer can be applied by any suitable method that is compatible with the processes and equipment used in microelectronics fabrication assembly lines. Exemplary non-limiting techniques include spin-coating, dip-coating, doctor blading, and spray coating.

Exemplary non-limiting casting solvents for preparing the above-described polymer base coating compositions include toluene, propylene glycol monomethyl ether acetate (PGMEA), propylene glycol monomethyl ether (PGME), ethoxyethyl propionate, anisole, ethyl lactate, 2-heptanone, cyclohexanone, amyl acetate, n-butyl acetate, γ-butyrolactone (GBL), aqueous solutions, acetone, and combinations of the foregoing solvents.

The random copolymer for the underlayer has a weight average molecular weight (Mw) of 3,000 to 200,000 g/mol. Similarly, the random copolymer has a number average molecular weight (Mn) of 1,000 to 80,000. The random copolymer can also have a polydispersity (Mw/Mn) of 1.01 to about 3.0. Molecular weight, both Mw and Mn, can be determined by, for example, gel permeation chromatography (GPC) using a universal calibration method, calibrated to polystyrene standards.

The high-chi block copolymer for the directed self-assembly (SA material) has a weight-average molecular weight (Mw) of 3,000 to 200,000 g/mol. Similarly, the high-chi block copolymer can have a number average molecular weight (Mn) of 1,000 to 80,000. The high-chi block copolymer can also have a polydispersity (Mw/Mn) of 1.01 to 3.

The surface active polymer (SAP) for the SA layer has a weight-average molecular weight (Mw) of 3,000 to 200,000 g/mol. Similarly, the SAP can have a number average molecular weight (Mn) of 1,000 to 80,000. The SAP can have a polydispersity (Mw/Mn) of 1.01 to 3.

The morphology (e.g., shape, dimension, and orientation) of the self-assembled domains from block copolymer thin films is a function of block copolymer architecture (diblock, triblock, star polymer, bottlebrush block copolymer, miktoarm polymer, and others), composition (e.g., material, molecular weight, and volume ratio of different blocks), annealing conditions (e.g., temperature, environment, and annealing time), the interface properties (e.g., polymer-air interface and polymer substrate interface) as well as the defined geometry (e.g., film thickness and topography of the confinement). Therefore, by adjusting one or more parameters, the morphology can be adjusted to the need of specific applications.

Self-assembly of the high-chi block copolymer (i.e., phase separation and alignment of domains) can occur during film formation, during a post-application bake, or during a subsequent annealing process. Suitable annealing processes include thermal annealing, thermal gradient annealing, solvent vapor annealing or annealing by other gradient fields. More particularly, the SA layer comprising a high-chi block copolymer is thermally annealed at a temperature that is above the glass transition temperature ($T_g$) of the block copolymer but below the decomposition or degradation temperature ($T_d$) of the block copolymer. The thermal annealing step can be carried out at an annealing temperature of about 80° C. to about 300° C. The thermal annealing can be performed for a period of more than 0 hours to about 100 hours, and more particularly for about 1 hour to about 15 hours. The thermally annealed block copolymer self-assembles to form ordered domains whose orientation is perpendicular to the underlying surface plane. In general, the SA layer can have a thickness of 50 to 10000 angstroms, more particularly 100 to 5000 angstroms, and even more particularly 100 to 3000 angstroms.

The difference in the etch rates between two ordered domain regions of the block copolymer allows the generation of additional patterns. Selectively removing by etching, solvent or other means, at least one self-assembled domain, creates a nano-scale relief pattern comprising, for example, a pattern of holes that can be transferred into the underlying substrate. Types of etching include any common etching applied in the manufacture of semiconductor devices, for example, dry-etching such as plasma etching, or wet-etching using selective solvents and/or vapors. Typically, dry etching processes are employed for etching at sub-50 nm dimensions. Prior to this pattern development/pattern transfer, the self-assembled layer of SA material can be optionally chemically modified to improve properties necessary for pattern transfer, such as etch resistance or mechanical properties.

The relief pattern of openings formed by selective removal of one of the domains can have a spatial frequency greater than that of a topographic pre-pattern used with the high-chi block copolymer.

Etch resistant materials can be applied to a substrate surface, underlayer surface, surface of a resist feature, and/or a domain pattern of the block copolymer for control of relative etch rates. The etch-resistant material can be deposited from the vapor phase by a process including, chemical vapor deposition (CVD), plasma enhanced CVD, atomic layer deposition (ALD), sequential infiltration synthesis (SIS), sequential infiltration of metal salts, sputtering, thermal evaporation, electron beam evaporation, pulsed laser deposition, or other suitable deposition method that is compatible with the processes and equipment used in microelectronics fabrication.

Also disclosed is a film comprising the self-assembled high-chi block polymer, the film comprising lamellar domains having a perpendicular orientation relative to the plane of the film. Further disclosed is a layered structure comprising substrate that includes an underlayer, and a film of self-assembled high-chi block copolymer disposed on the underlayer, the film comprising lamellar domains having a perpendicular orientation relative to the plane of the film. In an embodiment, the layered structure is a semiconductor device.

The above-described processes can be used to form layered structures comprising metal wiring lines, holes for contacts or vias, insulation sections (e.g., damascene trenches or shallow trench isolation), and trenches for capacitor structures suitable for the design of integrated circuit devices. The method is especially useful in the context of creating patterned layers of oxides, nitrides or polysilicon.

The above-described methods advantageously allow self-assembled structures having reduced feature width and increased periodicity. The domain feature width can be from 1 nm to about 30 nm, from 5 nm to about 18 nm, or more particularly from 5 nm to about 15 nm.

The following non-limiting examples are provided to further illustrate the disclosed polymers and their use in forming self-assembled layers.

EXAMPLES

Materials used in the following examples are listed in Table 1.

TABLE 1

| ABBREVIATION | DESCRIPTION | SUPPLIER |
|---|---|---|
| AcCl | Acetyl Chloride | Sigma-Aldrich |
| AIBN | Azobisisobutyronitrile | Sigma-Aldrich |
| Anisole | Anisole | Sigma-Aldrich |

TABLE 1-continued

| ABBREVIATION | DESCRIPTION | SUPPLIER |
|---|---|---|
| AZPS1-OH | Hydroxyl-end-functional polystyrene, Mn 6200 | AZ Electronic Materials |
| AZPS2-OH | Hydroxyl-end-functional polystyrene, Mn 10000 | AZ Electronic Materials |
| AZPS3-OH | Hydroxyl-end-functional polystyrene, Mn 4200 | AZ Electronic Materials |
| BisMPA | Dimethylolpropionic acid | Perstorp |
| BriBr | α-Bromoisobutyryl bromide | Sigma-Aldrich |
| BzOH | Benzyl alcohol | Sigma-Aldrich |
| CuBr | Copper (I) bromide | Sigma-Aldrich |
| DBU | 1,8-Diazabicyclo[5,4,0]undec-7-ene | Sigma-Aldrich |
| DCM | Dichloromethane | Sigma-Aldrich |
| DPP | Diphenyl phosphate | Sigma-Aldrich |
| EtG | Ethylene glycol | Sigma-Aldrich |
| EtG | Ethylene glycol | Sigma-Aldrich |
| EtiBr | Ethyl α-bromoisobutyrate | Sigma-Aldrich |
| GMA | Glycidyl methacrylate, MW 142.2 | Sigma-Aldrich |
| HEMA | Hydroxyethyl methacrylate, MW 130.14 | Sigma-Aldrich |
| HFA-Sty | Hexafluoroalcohol Styrene | Central Glass Chemical Company |
| Lac | 3,6-Dimethyl-1,4-dioxane-2,5-dione | Sigma-Aldrich |
| Me6TREN | Tris[2-(dimethylamino)ethyl]amine | Sigma-Aldrich |
| MeOH | Methanol | Sigma-Aldrich |
| p-NBT | p-Nitrobenzyltosylate | Sigma-Aldrich |
| OH-PSI1-OH | Hydroxyl-end-functional polystyrene, Mn 11000, DP = 108 | Polymer Source Inc., Montreal |
| Pf-OH | 1H,1H-Perfluorononan-1-ol | Synquest Labs |
| PFS | Pentafluorostyrene | Sigma-Aldrich |
| PHOST | Poly(4-hydroxystyrene) Mn 5480, PDI = 1.08. | Nippon Soda Co. |
| PMDETA | N,N,N',N',N''-pentamethyldiethylenetriamine | Sigma-Aldrich |
| Si Gel | Silica Gel | Sigma-Aldrich |
| Sty | Styrene, MW 104.15 | Sigma-Aldrich |
| TEA | Triethylamine | Sigma-Aldrich |
| THF | Tetrahydrofuran | Sigma-Aldrich |
| TMC | Trimethylene carbonate | Richman Chemicals |
| Tol | Toluene | Sigma-Aldrich |
| P(Sty-r-MMA)-OH | Hydroxy-terminated poly(styrene-r-methyl methacrylate) random copolymer | AZ Electronics |

Herein, Mn is the number average molecular weight, Mw is the weight average molecular weight, and MW is the molecular weight of one molecule.

Cyclic carbonate monomer MTC-Me was prepared as previously reported (Y. Zoul et al., Polymer, 45(16), 5459-5463; 2004).

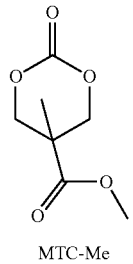

MTC-Me

Example 1

Synthesis of diblock polymer DBP1, n=57, m=75.

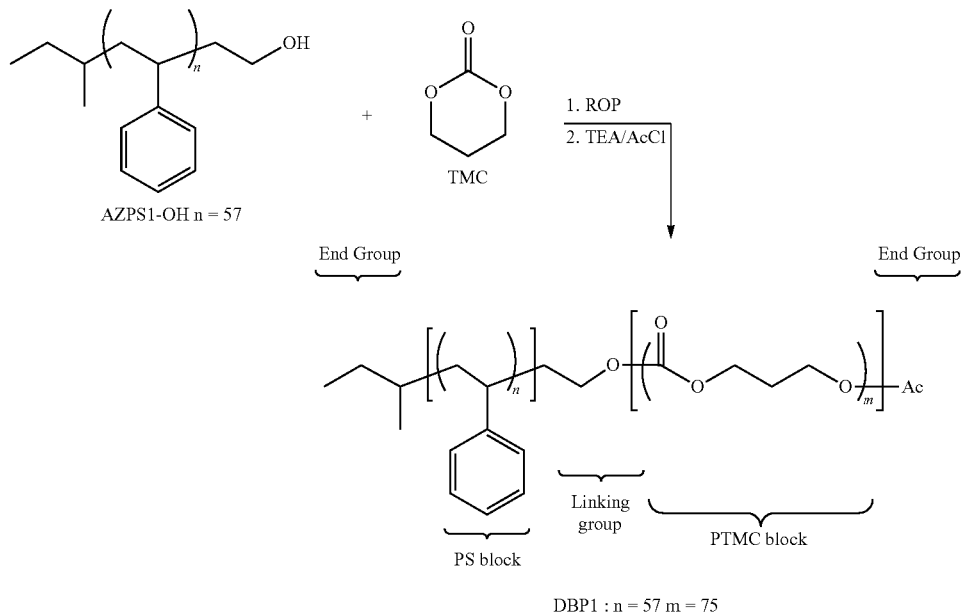

DBP1 : n = 57 m = 75

Diblock polymer DBP1, n=57, m=75 was prepared by ring opening polymerization (ROP) of trimethylene carbonate (TMC) using mono-alcohol initiator AZPS1-OH and ROP acid catalyst diphenylphosphate (DPP). To an oven dried 20 mL round bottom flask equipped with a magnetic stir bar, AZPS1-OH (0.70 g, 0.113 mmol, Mn=6200, PDI=1.02, n=57, obtained from AZ-Electronic Materials, Branchburg, N.J.), TMC (1.76 g, 17.25 mmol), and dichloromethane (DCM, 2.94 mL) were added. The reaction mixture was stirred until the AZPS1-OH macroinitiator and TMC were completely dissolved in DCM, upon which diphenylphosphate (DPP, 400 mg, 1.6 mmol, catalyst) was added. The reaction mixture was stirred at room temperature (r.t.) for 16 hours in a glove box. The reaction flask was brought out of the glove box and cooled at 0° C. by immersing it in an ice-water bath. The reaction was stopped by adding DCM (6 mL), triethylamine (TEA, 0.7 mL, 02.72 mmol) and acetyl chloride (0.25 ml, 3.52 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. Mn (GPC)=17200, Mw=17700, PDI=1.029; Mn (NMR)=AZPS(6.2k)-PMTC(7.8k), n=57.4, m=75; TMC % conversion: about 50%. The resulting polymer was dissolved in THF to form a 20 wt % solution and the polymer was precipitated in methanol:acetonitrile (200 mL, 60:40 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours to give DBP1. Mn (GPC)=17200, Mw=17600, PDI=1.02; Mn (NMR)=PS(6.2k)-b-PTMC(7.7k), n=57, m=75. The notation PS(6.2k)-b-PTMC(7.7k) means the poly(styrene) block (PS) has an Mn=6200 and the poly (trimethylene carbonate) block (PTMC) has an Mn=7700. This notation is also used in the examples that follow.

Example 2

Synthesis of diblock polymer DBP2, n=96, m=82.

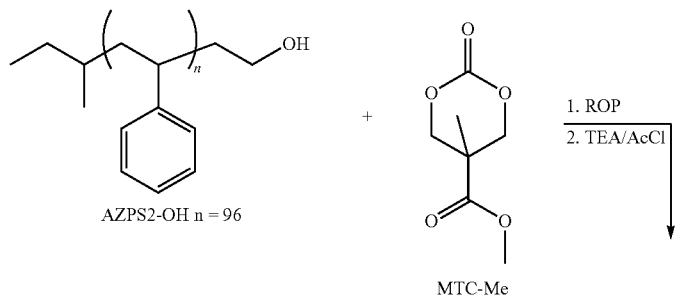

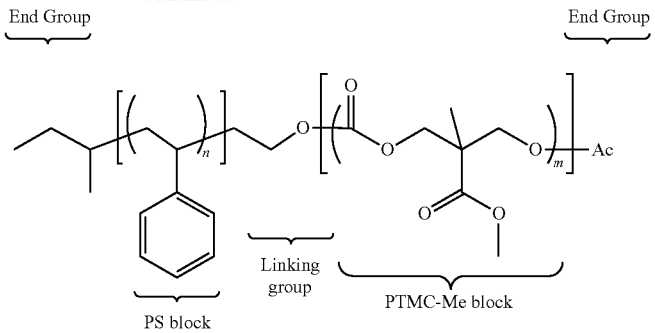

DBP2 : n = 96 m = 82

Diblock polymer DBP2, n=96, m=82 was prepared by ring opening polymerization (ROP) of methyl carbonate (MTC-Me), with mono-alcohol initiator AZPS2-OH and ROP base catalyst DBU. To an oven dried 4 mL glass vial equipped with a magnetic stir bar, AZPS2-OH (0.10 g, 0.01 mmol, Mn=10000, PDI=1.05, n=96), obtained from AZ-Electronic Materials, Branchburg, N.J.), MTC-Me (0.31 g, 1.80 mmol), and DCM (1.80 mL) were added. The reaction mixture was stirred until the AZPS2-OH macroinitiator and MTC-Me were completely dissolved in DCM, upon which catalyst (DBU, 1.5 mg, 0.01 mmol, 10 wt % solution in toluene) was added. The reaction mixture was stirred at room temperature (r.t.) for 3 hours in a glove box. The reaction flask brought out of the glove box and cooled at 0° C. by immersing it in an ice-water bath. The reaction was stopped by adding DCM (1 mL), TEA (0.1 mL, 0.39 mmol) and acetyl chloride (0.025 ml, 0.352 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. Mn (GPC)=24040, Mw=26224, PDI=1.09; Mn (NMR)= AZPS(10.0k)-PMTC-Me(16.9k), n=96, m=97; MTC-Me % conversion: about 57%. The resulting polymer was dissolved in THF to form a 20 wt % solution and the polymer was precipitated in methanol:acetonitrile (20 mL, 80:20 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours to give DBP2. Mn (GPC)=25700, Mw=27400, PDI=1.06; Mn of each block by NMR=PS(10k)-b-PMTC-Me(14.2k), n=96, m=84.

Example 3

Synthesis of triblock polymer TBP1

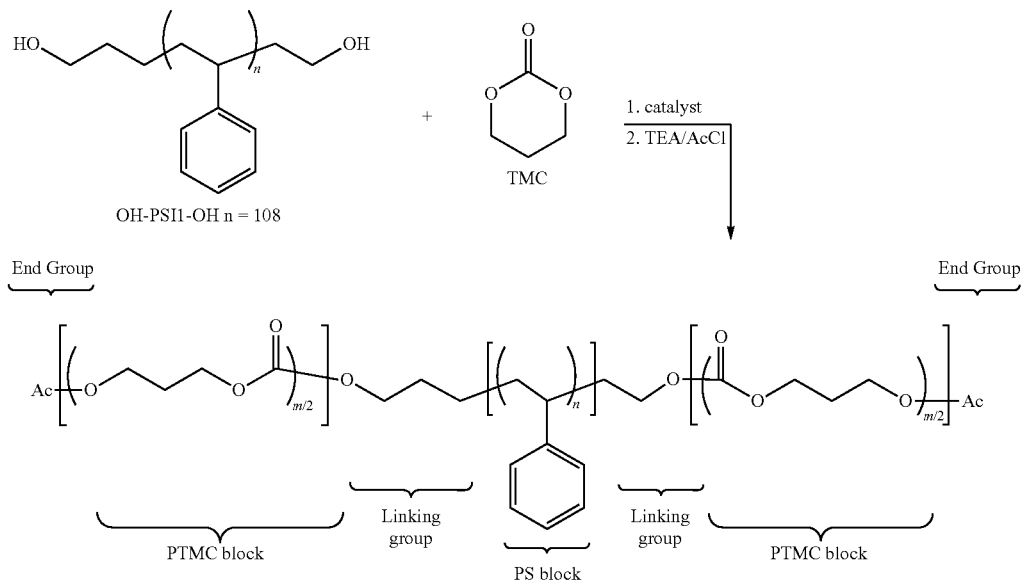

TBP1 n = 108 m = 138

To an oven dried 4 mL vial equipped with a magnetic stir bar, OH-PSI1-OH (0.15 g, 0.013 mmol, Mn=11,500, n=108, obtained from Polymer Source Incorporated, Montreal, Canada), TMC (0.378 g, 3.70 mmol), and DCM (1.85 mL) were added. The reaction mixture was stirred until the HO-PSI1-OH macroinitiator and TMC were completely dissolved in DCM, upon which DPP (65 mg, 0.26 mmol) was added. The reaction mixture was stirred at room temperature for 15 hours in a glove box. The reaction was stopped by adding DCM (1 mL), TEA (0.2 mL) and acetyl chloride (0.1 mL). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol. The solid was collected in a frit funnel and dried under vacuum at 40° C. for two hours to obtain the resulting compound. The resulting polymer was dissolved in THF to form a 20 wt % solution and the polymer was precipitated in methanol:acetonitrile (200 mL, 60:40 v/v). The precipitated solids and the solvents were collected in a centrifuge tube and the solids were collected by centrifuging at 4000 RPM at 0° C. followed by decanting the solvent and drying the solids in a vacuum oven at 40° C. for two hours. Mn (GPC)=27900, Mw=30300, PDI=1.09; Mn of each block by NMR=PTMC(7.05k)-b-PS(11.5k)-b-PTMC(7.05 k), n=108, m=138. The volume fraction of the PTMC block, expressed as VfPTMC, was about 0.49.

Table 2 summarizes the preparations and properties of the block copolymers of Examples 1-3.

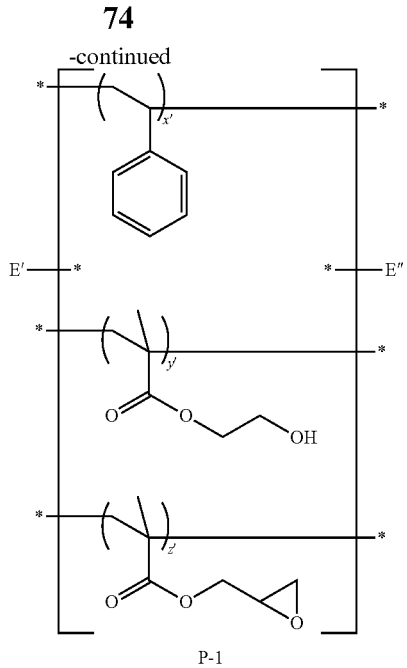

P-1

In the above notation, the vertical stacking of the repeat units within the square brackets indicates a random distribution of the repeat units in the polymer chain. End group E' is linked to one of the starred bonds overlapping the left square bracket. End group E" is linked to one of the starred bonds overlapping the right square bracket. It should be understood that for a given repeat unit, a starred bond that overlaps the left square bracket can be linked to a different repeat unit at the position indicated by the right starred bond overlapping the right square bracket, or to end group E'. Likewise, for a given repeat unit, a starred bond that overlaps the right square bracket can be linked to a different repeat unit at the position indicated by the left starred bond overlapping the left square bracket, or to end group E". Unless otherwise indicated, subscripts x', y', and z' represent the average number of the corresponding parenthesized repeat unit in the polymer. For P-1, the end groups E' and E" are not shown.

TABLE 2

| | | | | | | GPC | | | NMR (Mn, kDa)) | | Vf |
|---|---|---|---|---|---|---|---|---|---|---|---|
| Example | BCP Name | Monomer | Catalyst | Initiator | Temp | Time (hours) | Mn (kDa) | Mw (kDa) | PDI | PS block | Carbonate block | Carbonate |
| 1 | DBP1 | TMC | DPP | AZPS1-OH | r.t. | 16 | 17.2 | 17.6 | 1.02 | 6.2 | 7.7 | 0.49 |
| 2 | DBP2 | MTC-Me | DBU | AZPS2-OH | r.t. | 3 | 25.7 | 27.4 | 1.06 | 10k | 14.2 | 0.47 |
| 3 | DBP3 | TMC | DPP | OH-PSI1-OH | r.t. | 15 | 27.9 | 30.3 | 1.09 | 11.5 | 14.1 | 0.49 |

Underlayer random copolymers based on styrene, TMC, and GMA

Example 4

Synthesis of intermediate random copolymer P-1, Sty:HEMA:GMA mole ratio x:y:z=88:6:6, Sty:HEMA:GMA, DP ratio x':y':z'=50.5:3.5:3.5, used as a macroinitiator further below.

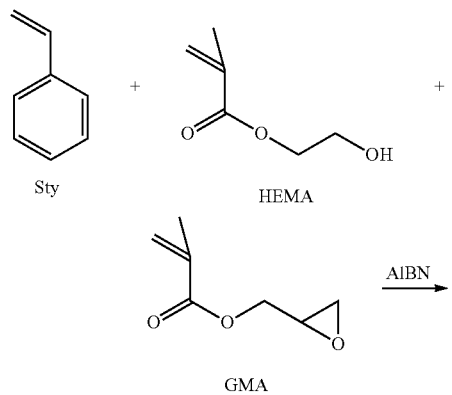

Styrene (Sty, 14.4 g, 138.0 mmol), hydroxy ethyl methacrylate (HEMA, 1.0 g, 7.68 mmol), glycidyl methacrylate (GMA, 1.09 g, 7.66 mmol), THF (50 g), and azobisisobutyronitrile (AIBN, 0.757 g, 4.61 mmol, 3 mol % based on total moles of vinyl monomers) were combined in a 250 mL round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in MeOH, and was dried under vacuum at 50° C. for 24 hours. Mn=6200, Mw=8700, PDI=1.40. The product Sty:HEMA:GMA mole ratio x:y:z was calculated by $^{13}$C inverse gated NMR as x:y:z=88:6:6. Based on the Mn and the product mole ratio, the degree of polymerization (DP) of each repeat units Sty:HEMA:GMA was calculated for P-1 to be x':y':z'=50.5:3.5:3.5, respectively.

The random copolymers of Examples 5-14 have the prefix "G1" in the name were prepared from macroinitiator P-1.

Example 5

Synthesis of TMC-functional random graft copolymer G1-1 from macroinitiator P-1 (Example 4, STY:HEMA:GMA molar ratio x:y:z=88:6:6, DP ratio x':y':z'=50.5:3.5:3.5) for orientation control.

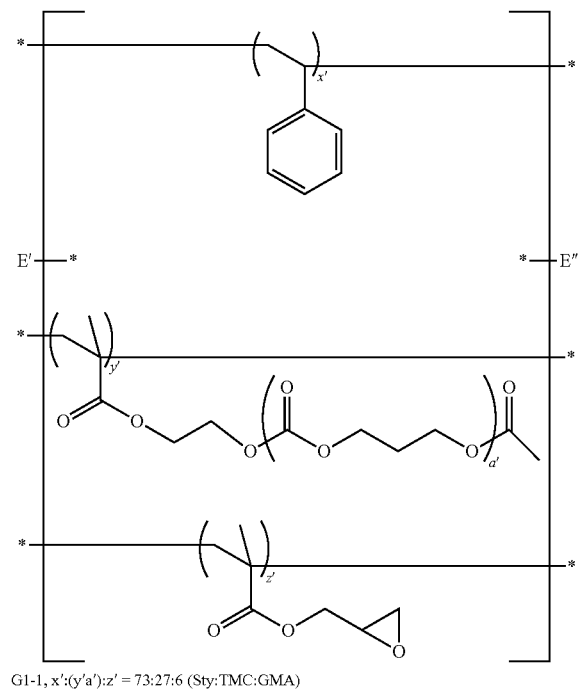

G1-1, x':(y'a'):z' = 73:27:6 (Sty:TMC:GMA)

The quantity y'a' (i.e., y' multiplied by a') represents the total average number of repeat units derived from TMC in the random graft copolymer G1-1. In these calculations, Mn was not adjusted for the mass of end groups E' and E" when determining the DP of each repeat unit.

P-1 (0.2 g, Example 4), trimethylene carbonate (TMC, 0.060 g, 0.588 mmol) and dichloromethane (DCM, 0.2 g) were added to an oven dried 4 mL glass vial equipped with a magnetic stir bar. The reaction mixture was stirred until the macroinitiator and TMC were completely dissolved in DCM, upon which 1,8-diazabicyclo[5.4.0]undec-7-ene (DBU, ~10 mg) was added. The reaction mixture was stirred at room temperature (r.t.) for 1 hour in a glove box. The reaction was stopped by bringing the reaction vial out of the glove box and by adding DCM (0.5 ml), triethylamine (TEA, 0.27 g, 2.72 mmol) and acetyl chloride (~60 mg, 0.764 mmol). The reaction was further stirred for two hours at room temperature. The resulting polymer was isolated by precipitating the reaction mixture in methanol. The product was collected in a frit funnel by removing methanol under vacuum and the resulting solids were redissolved in THF to form a 20 wt % solution and reprecipitated in methanol for two more times. The solids were collected in a frit funnel and dried under vacuum at 40° C. for two hours to obtain random graft copolymer G1-1, where the Sty:TMC mole ratio x':y'a'=73:27 was determined by $^1$H NMR. The average value of a' was calculated as follows:

x'/y'=50.5/3.5 (DP ratio of the P-1 macroinitiator),
x'/(y'a')=73/27 (Sty:TMC mole ratio of G1-1 by $^1$H NMR),
rearranging, x'/y'=73a'/27
substituting, 50.5/3.5=73a'/27, and
solving, a'=5.33.

Therefore, G1-1 has a side chain polycarbonate having an average number of carbonate repeat units a'=5.33, based on the Mn of G1-1.

Examples 6-15

Preparation of underlayer random graft copolymers G1-2 to G1-11 for orientation control. These polymers were prepared using the general procedure of Example 5 and macroinitiator P-1 (Example 4) at various Sty:TMC molar ratios. G1-2 to G1-11 differ from G1-1 by a', the average number of repeat units of TMC in the side chain.

Table 3 summarizes the preparation of Examples 5-15.

TABLE 3

| Ex. | Random Graft Polymer Name | TMC (g) | DCM (g) | DBU (mg) | P-1 Initiator (g) | Temp | Time (hours) | GPC Mn | Mw | PDI | Sty:TMC Mole Ratio | a'[1] | Monomer % Conversion. |
|---|---|---|---|---|---|---|---|---|---|---|---|---|---|
| 5 | G1-1 | 0.06 | 0.2 | ~10 | 0.2 | r.t. | 1 | — | — | — | 73:27 | 5.3 | >99 |
| 6 | G1-2 | 0.1 | 0.32 | ~10 | 0.2 | r.t. | 1.5 | — | — | — | 60:40 | 9.6 | >99 |
| 7 | G1-3 | 0.46 | 1.50 | ~10 | 0.2 | r.t. | 2 | 23600 | 44000 | 1.87 | 24:76 | 45.7 | >99 |
| 8 | G1-4 | 0.035 | 0.52 | ~10 | 0.2 | r.t. | 0.45 | — | — | — | 88:12 | 2.0 | >99 |
| 9 | G1-5 | 0.06 | 0.37 | ~13 | 0.2 | r.t. | 1 | 9300 | 13500 | 1.44 | 73:27 | 5.3 | >99 |
| 10 | G1-6 | 0.1 | 0.45 | ~10 | 0.2 | r.t. | 1.5 | 11400 | 18000 | 1.57 | 59:41 | 10.0 | >99 |
| 11 | G1-7 | 0.06 | 0.72 | ~10 | 0.2 | r.t. | 1 | — | — | — | 73:27 | 5.3 | >99 |
| 12 | G1-8 | 0.1 | 0.9 | ~10 | 0.2 | r.t. | 1.4 | — | — | — | 66:34 | 7.4 | ~90 |
| 13 | G1-9 | 0.15 | 0.9 | ~16 | 0.2 | r.t. | 1 | 12100 | 15900 | 1.31 | 62:38 | 8.8 | ~50 |
| 14 | G1-10 | 0.15 | 0.9 | ~14 | 0.2 | r.t. | 0.75 | — | — | — | 62:38 | 8.8 | ~50 |
| 15 | G1-11 | 0.15 | 0.9 | ~14 | 0.2 | r.t. | 1.4 | — | — | — | 43:57 | 19.1 | ~65 |

[1] a' is based on Mn of the random graft copolymer, without correcting for end groups Synthesis of underlayers based on styrene, AcEMA, and GMA These random copolymers (Examples 16-22) have the prefix "GHS" in the name and have the general structure

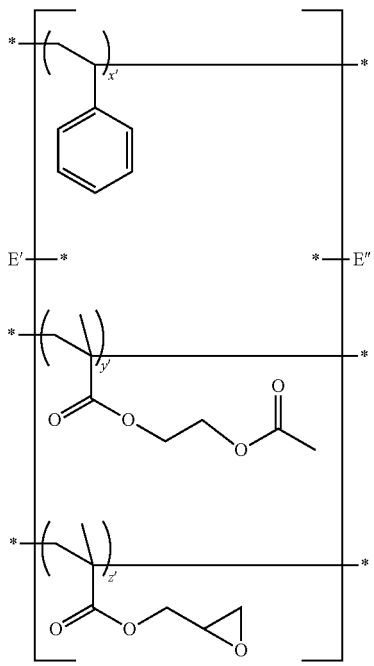

where average numbers of repeat units x', y' and z' are greater than 0. End groups E' and E" are not shown.

Example 16

Synthesis of poly(styrene-r-acetoxyethyl methacrylate-r-glycidyl methacrylate) underlayer GHS-1, x:y:z=77:19:4 (mole ratio), DP ratio x':y':z'=48.5:12.1:2.6.

Styrene (Sty, 4.0 g, 38.4 mmol, MW 104.2), acetoxyethyl methacrylate (AcEMA, 1.21 g, 7.02 mmol, MW 172.2), glycidyl methacrylate (GMA, 0.20 g, 1.40 mmol, MW 142.2), THF (22 g), and azobisisobutyronitrile (AIBN, 0.31 g, 1.87 mmol, 4 mol % based on total moles of vinyl monomers) were combined in a 250 mL round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in MeOH, and was dried under vacuum at 50° C. for 24 hours to give GHS-1. Mn=7500, Mw=10,100, PDI=1.34. The product mole ratio of Sty:AcEMA:GMA was calculated by $^{13}$C inverse gated NMR as x:y:z=77:19:4 (mole ratio). Based on Mn and without adjusting for end groups E' and E", the degree of polymerization ratio of Sty:AcEMA:GMA was x':y':z'=48.5:12.1:2.6, or 48:12:3 when rounded to zero decimal places.

Examples 17-22

Preparation of random graft copolymers GHS-2 to GHS-7 for underlayer orientation control. These polymers were prepared using the general procedure of Example 16 at various Sty:AcEMA:GMA molar ratios.

Table 4 summarizes the preparations of Examples 16-22.

TABLE 4

| Examples | Random Graft Polymer Name | Sty (g, mmol) | AcEMA (g, mmol) | GMA (g, mmol) | AIBN (g, mmol) | THF (g) | Temp (° C.) | Time (hours) | Feed Mole Ratio Sty:AcEMA:GMA |
|---|---|---|---|---|---|---|---|---|---|
| 16 | GHS-1 | 4.0, 38.4 | 1.21, 7.02 | 0.20, 1.40 | 0.31, 1.87 | 22 | 70 | 18 | 82:15:3 |
| 17 | GHS-2 | 1.40, 13.33 | 1.61, 9.38 | 0.1, 0.70 | 0.154, 0.94 | 10 | 70 | 18 | 57:40:3 |
| 18 | GHS-3 | 0.66, 6.33 | 2.82, 16.41 | 0.10, 0.70 | 0.154, 0.94 | 11 | 70 | 18 | 27:70:3 |
| 19 | GHS-4 | 1.27, 12.20 | 1.82, 10.55 | 0.10, 0.70 | 0.154, 0.94 | 10 | 70 | 18 | 52:45:3 |
| 20 | GHS-5 | 1.20, 11.5 | 1.94, 11.25 | 0.1, 0.70 | 0.154, 0.94 | 10 | 70 | 18 | 49:48:3 |
| 21 | GHS-6 | 0.55, 5.2 | 1.05, 6.1 | 0.05, 0.35 | 0.077, 0.47 | 5 | 70 | 18 | 42:52:3 |
| 22 | GHS-7 | 0.66, 6.32 | 0.87, 5.04 | 0.05, 0.35 | 0.077, 0.47 | 5 | 70 | 18 | 54:43:3 |

| Examples | Product Mole Ratio Sty:AcEMA:GMA | Product Sty:AcEMA:GMA DP ratio | GPC Mn | Mw | PDI |
|---|---|---|---|---|---|
| 16 | 77:19:4 | 49:12:3 | 7500 | 10100 | 1.34 |
| 17 | 55:42:2 | 29:22:1 | 6900 | 12100 | 1.74 |
| 18 | 29:68:3 | 15:36:2 | 8100 | 14600 | 1.79 |
| 19 | 50:47:3 | | 7200 | 11870 | 1.64 |
| 20 | 48:49:3 | | 7570 | 12860 | 1.69 |
| 21 | 45:50:4 | 27:30:2 | 8400 | 13700 | 1.63 |
| 22 | 53:44:3 | 31:26:2 | 7900 | 12900 | 1.62 |

Synthesis of surface active polymer additives (SAP)

Example 23

Synthesis of PSAP1-40, a protected random copolymer of pentafluorostyrene (PFS) and acetoxystyrene (Ac-Sty).

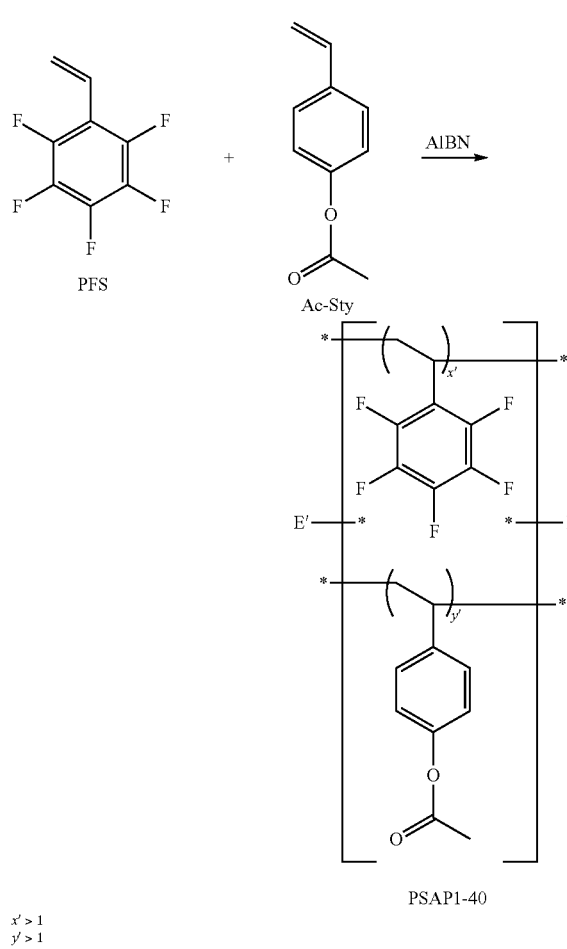

Example 27

Synthesis of PSAP2-60.

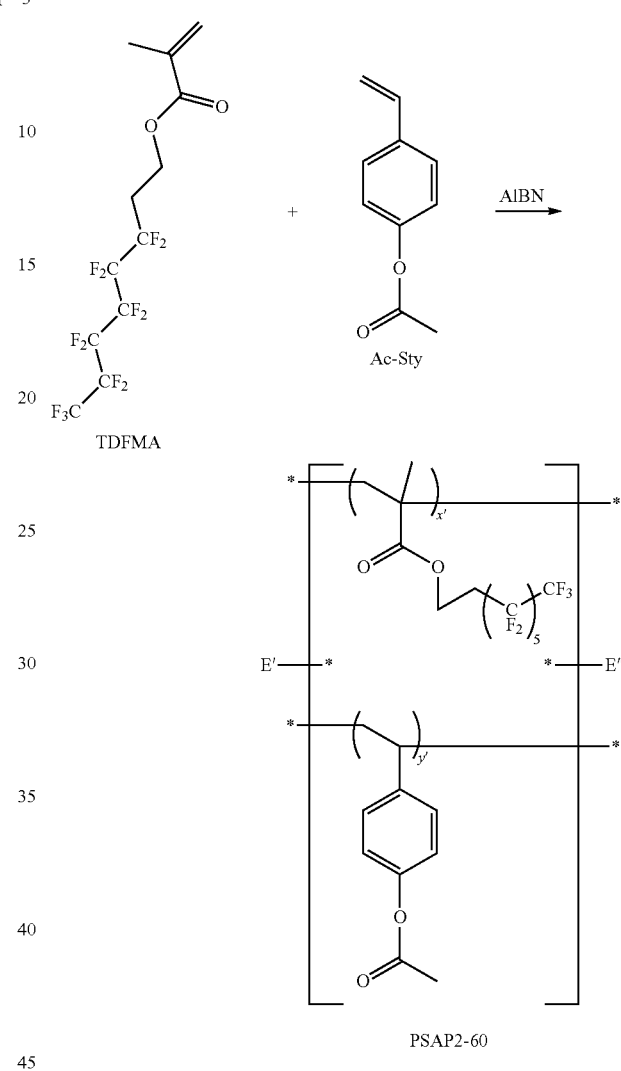

Pentafluorostyrene (PFS, 3.0 g, 15.45 mmol, MW 194), acetoxystyrene (Ac-Sty, 3.75 g, 23.18 mmol, MW 162.19), tetrahydrofuran (THF, 20 g), and azobisisobutyronitrile (AIBN, 0.25 g, 1.54 mmol, 4 mol % based on total moles of vinyl monomers) were combined in a 100 mL round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in hexanes, and was dried under vacuum at 50° C. for 24 hours. The resulting polymer was used directly for deprotection as described below (Example 28) and was not further characterized.

Examples 24-26

Synthesis of PSAP1-60, PSAP1-80, and PSAP1-90, respectively. These random copolymers of PFS and Ac-Sty were prepared using the general procedure of Example 23 at various molar ratios of PFS and Ac-Sty.

Tridecafluoro methacrylate (TDFMA, 1.50 g, 3.47 mmol, MW 432), acetoxystyrene (Ac-Sty, 0.375 g, 2.31 mmol, MW 162.19), THF (7.50 g), and azobisisobutyronitrile (AIBN, 38 mg, 0.23 mmol, 4 mol % based on total moles of vinyl monomers) were combined in a 100 mL round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in methanol, and was dried under vacuum at 50° C. for 24 hours. The polymer was not further characterized and was used directly for deprotection as described below.

Table 5 summarizes the preparations of protected surface active polymer Examples 23-27 prepared by free radical polymerization using AIBN initiator.

TABLE 5

| PSAP Ex. | additive name | Monomer 1 Name | Monomer 1 (g, mmol) | Monomer 1 Feed Mole % | Monomer 2 Name | Monomer 2 (g, mmol) | Monomer 2 Feed Mole % | AIBN (g, mmol) | THF (g) | Temp | Time (hours) |
|---|---|---|---|---|---|---|---|---|---|---|---|
| 23 | PSAP1-40 | PFS | 3.0, 15.45 | 40 | Ac-Sty | 3.75, 23.18 | 60 | 0.25, 0.1.54 | 20 | 70 | 18 |
| 24 | PSAP1-60 | PFS | 4.50, 23.18 | 60 | Ac-Sty | 2.52, 15.44 | 40 | 0.25, 0.1.54 | 20 | 70 | 18 |
| 25 | PSAP1-80 | PFS | 6.01, 30.97 | 80 | Ac-Sty | 1.25, 7.74 | 20 | 0.25, 0.1.54 | 20 | 70 | 18 |
| 26 | PSAP1-90 | PFS | 6.63, 34.89 | 90 | Ac-Sty | 0.63, 3.87 | 10 | 0.25, 0.1.54 | 20 | 70 | 18 |
| 27 | PSAP2-60 | TFDMA | 1.50, 3.47 | 60 | Ac-Sty | 0.375, 2.31 | 40 | 0.038, 0.23 | 7.5 | 70 | 18 |

Example 28

Deprotection of PSAP1-40 of Example 23 to form SAP1-40

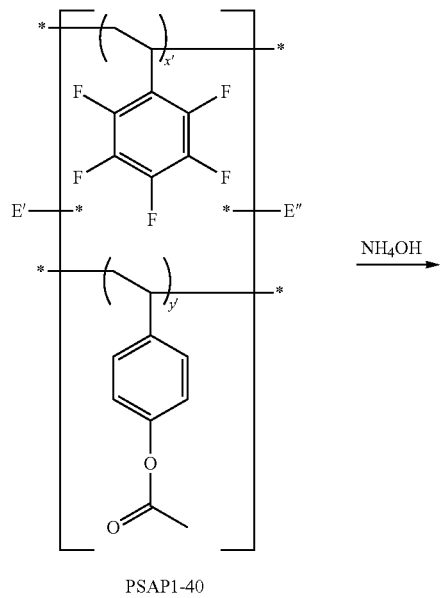

To a 100 ml round bottom flask equipped with a magnetic stir bar and a reflux condenser, PSAP1-40 (1.50 g, Example 23) was added. To this flask, methanol (20 ml) was added to create a suspension of the polymer. Ammonium hydroxide solution (2.1 g, 28.0-30.0 wt % solution in water) was added to the vessel and the reaction was heated at 70° C. for 18 hours. The resulting polymer was precipitated in 1000 ml of water spiked with 2-3 ml of acetic acid. The solids were collected and redissolved in THF followed by re-precipitation in water. The resulting solid was dried under vacuum at 80° C. for 24 hours. Mn=16000, Mw=26000, PDI=1.65. The product PFS:hydroxystyrene x:y mole ratio was calculated by $^{13}$C inverse gated NMR as x:y=44:56 (mole ratio). Based on Mn and excluding end groups E' and E", the DP ratio x':y'=46:59.

Examples 29-32

Deprotection of PSAP1-60, PSAP1-80, PSAP1-90 and PSAP2-60, respectively. These random copolymers were deprotected using the general procedure of Example 28. The perfluorinated ester of PSAP2-60 was stable to the hydrolysis conditions.

Example 33

Synthesis of SAP3-80

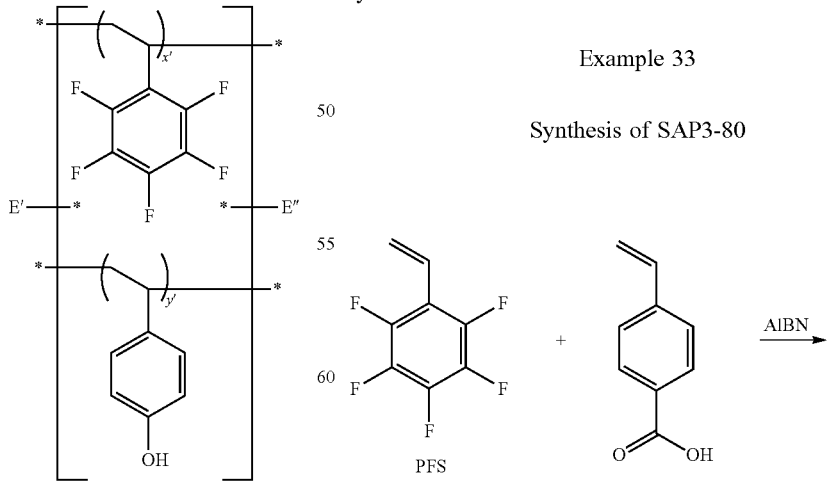

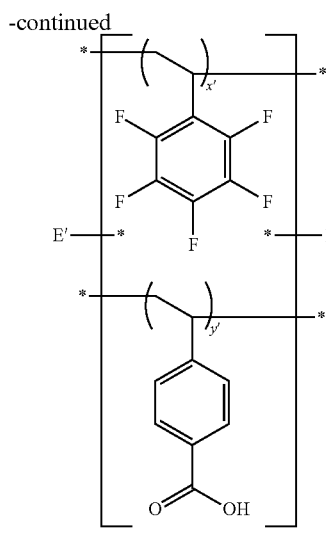

SAP3-80

Pentafluorostyrene (PFS, 1.50 g, 15.45 mmol, MW 194), 4-vinyl benzoic acid (4-VBA, 0.286 g, 23 mmol, MW 162.19), THF (20 g), and azobisisobutyronitrile (AIBN, 0.25 g, 1.54 mmol, 4 mol % based on total moles of vinyl monomers) were combined in a 100 mL round bottom flask (RBF) equipped with a magnetic stir-bar and an overhead condenser. The reaction mixture was stirred at 70° C. for 18 hours and was stopped by cooling the reaction to room temperature. The resulting polymer was isolated by two precipitations in hexanes, and was dried under vacuum at 50° C. for 24 hours. Mn=11000, Mw=14900, PDI=1.35. The product PFS:4VBA x:y mole ratio was calculated by $^{13}$C inverse gated NMR as x:y=84:16 (mole ratio). Based on Mn and excluding end groups E' and E", the DP ratio x':y'=49.5:9.4.

Table 6 summarizes the NMR and GPC analyses of surface active polymer Examples 28-33.

linking of a thin film of the random graft copolymer on the silicon wafer substrate when baked (annealed). The solutions were passed through a 0.2 mm polytetrafluoroethylene (PTFE) filter prior to spin coating the solution on a silicon wafer at 2000 rpm spin rate. After forming the thin film, the coated wafer was baked at 200° C. for 3 minutes and cooled to room temperature. The initial baked thin film (underlayer) had a thickness of 20 nm, measured with a Nanospec Reflectometer. The underlayer was then given a solvent rinse by casting PGMEA on top of the coated wafer, letting the solvent puddle for 30 seconds, and spin drying the treated wafer at 2000 rpm for 30 seconds. The rinse was intended to remove any excess random graft copolymer that was not crosslinked or grafted to the wafer surface. The final film thickness of the underlayer was 10 nm after the solvent rinse. Table 7 summarizes the underlayer films UL-1 to UL-5 and UL-13 to UL-14 prepared with the random copolymers having a "G1" prefix in the name.

TABLE 7

| | | | | DP[1] | | |
|---|---|---|---|---|---|---|
| Example | UL Name | Random Copolymer | Sty:TMC mole ratio | Sty (x') | HEMA (y') | TMC (a') |
| 34 | UL-1 | G1-3 | 24:76 | 50.5 | 3.5 | 45.7 |
| 35 | UL-2 | G1-2 | 60:40 | 50.5 | 3.5 | 9.6 |
| 36 | UL-3 | G1-10 | 62:38 | 50.5 | 3.5 | 8.8 |
| 37 | UL-4 | G1-8 | 66:34 | 50.5 | 3.5 | 7.4 |
| 38 | UL-5 | G1-7 | 73:27 | 50.5 | 3.5 | 5.3 |
| 39 | UL-13 | G1-11 | 43:57 | 50.5 | 3.5 | 8.8 |
| 40 | UL-14 | G1-4 | 88:12 | 50.5 | 3.5 | 19.1 |

[1]x', y', and a' are based on Mn of the random graft copolymer

Examples 41-47

Thin film preparation of underlayers (ULs) using random copolymers GHS-1 to GHS-7 (see above Table 4).

The following general procedure was used to prepare a thin film underlayer on a silicon wafer. A solution was

TABLE 6

| | | | | SAP | SAP | | | |
|---|---|---|---|---|---|---|---|---|
| | SAP additive | Monomer 1 | Monomer 2 | Monomer 1:Monomer 2 | Monomer 1:Monomer 2 | GPC | | |
| Ex. | name | Name | Name | Mole Ratio | DP Ratio | Mn | Mw | PDI |
| 28 | SAP1-40 | PFS | HOST | 44:56 | 46:59 | 16.0k | 26.0k | 1.65 |
| 29 | SAP1-60 | PFS | HOST | 57:43 | | 16.1k | 24.7k | 1.52 |
| 30 | SAP1-80 | PFS | HOST | 80:20 | | 8.7k | 14.2k | 1.62 |
| 31 | SAP1-90 | PFS | HOST | 89:11 | | 11.0k | 15.6k | 1.45 |
| 32 | SAP2-60 | TFDMA | HOST | | | | | |
| 33 | SAP3-80 | PFS | 4-VBA | 84:16 | 49.5:9.4 | 11.0k | 14.9k | 1.35 |

HOST = repeat unit formed from deprotection of acetoxystyrene ("hydroxystyrene").

Underlayer and Composite Layer Film Preparations

Examples 34-40

Thin film preparation of underlayers (ULs) with random graft copolymers G1-2, G1-3, G1-7, G1-8 and G1-10 (see above Table 3).

The following general procedure was used to prepare a thin film underlayer on a silicon wafer. A solution was prepared by dissolving the random graft copolymer (95 parts by weight) and p-nitrobenzyl tosylate (p-NBT, 5 parts by weight) in propylene glycol monomethyl ether acetate (PGMEA, 10,000 parts by weight) to form a 1.0 wt % solution based on total dry solids. p-NBT is a thermal acid generator and was added to promote the grafting and partial cross-prepared by dissolving the random graft copolymer (95 parts by weight) and p-nitrobenzyl tosylate (p-NBT, 5 parts by weight) in propylene glycol monomethyl ether acetate (PGMEA, 10,000 parts by weight) to form a 1.0 wt % solution based on total dry solids. The solutions were passed through a 0.2 mm polytetrafluoroethylene (PTFE) filter prior to spin coating the solution on a silicon wafer at 2000 rpm spin rate. After forming the thin film, the coated wafer was baked at 190° C. for 3 minutes and cooled to room temperature. The initial baked thin film (underlayer) had a thickness of 20 nm, measured with a Nanospec Reflectometer. The underlayer was then given a solvent rinse by casting PGMEA on top of the coated wafer, letting the solvent puddle for 30 seconds, and spin drying the treated wafer at 2000 rpm for 30 seconds. The rinse was intended to remove any excess random graft copolymer that was not crosslinked or grafted to the wafer surface. The final film thickness of the underlayer was 10 nm after the solvent rinse. Table 8 summarizes the underlayer films UL-6 to UL-12 prepared with GHS-1 to GHS-7, respectively.

TABLE 8

| Example | UL Name | Random Copolymer | Sty:AcEMA:GMA mole ratio | Sty:AcEMA:GMA DP ratio |
|---|---|---|---|---|
| 41 | UL-6 | GHS-1 | 77:19:4 | 49:12:3 |
| 42 | UL-7 | GHS-2 | 55:43:2 | 29:22:1 |
| 43 | UL-8 | GHS-3 | 29:68:3 | 15:36:2 |
| 44 | UL-9 | GHS-4 | 50:47:3 | |
| 45 | UL-10 | GHS-5 | 48:49:3 | |
| 46 | UL-11 | GHS-6 | 45:50:4 | 27:30:2 |
| 47 | UL-12 | GHS-7 | 53:44:3 | 31:26:2 |

Examples 48-52

Thin film preparation of underlayers (ULs) using P(Sty-r-MMA)-OH random copolymer brushes obtained from AZ Electronic Materials.

The following general procedure was used to prepare a thin film underlayer on a silicon wafer. P(Sty-r-MMA)-OH, a hydroxy-terminated poly(styrene-r-methyl methacrylate) random copolymer brush material, was received from AZ Electronic Materials in the form of a solution in PGMEA (solution code NLD-303). The solution was used as received. The polymer solution was spin coated with 2000 rpm on a silicon wafer. The coated wafer was baked at 250° C. for 2 minutes prior to a solvent rinse to form UL-15. Table 9 summarizes the underlayer films UL-15 to UL-19 prepared with P(Sty-r-MMA)-OH random copolymer brush materials, where Sty=styrene and MMA=methyl methacrylate.

TABLE 9

| Example | UL Name | P(Sty-r-MMA)-OH Name | Sty:MMA mol % |
|---|---|---|---|
| 48 | UL-15 | NLD-303 | 0:100 |
| 49 | UL-16 | NLD-328J | 20:80 |
| 50 | UL-17 | NLD-320 | 30:70 |
| 51 | UL-18 | NLD-321 | 40:60 |
| 52 | UL-19 | NLD-322 | 47:53 |

Formulation of block copolymer and SAP additives

Examples 53-65

Preparation of coating formulations for self-assembly using block copolymers of Examples 1-3 and surface active polymers (SAP) of Examples 28-33.

The following general procedure is representative. Separate block copolymer solutions were prepared for one coating. The block copolymer (0.01 g) for self-assembly was dissolved in PGMEA (0.823 g) to form a 1.2 wt % solution of the block copolymer. Surface active polymer (0.1 g, one of SAP Examples 28-33) was dissolved in PGMEA (8.23 g) to form a 1.2 wt % stock solution of the SAP polymer based on total weight of the solution. The SAP solution was filtered through 0.2 micrometer PTFE filter. A portion of the SAP stock solution was then added to the entire block copolymer solution containing to form a coating composition containing the desired SAP concentration. This solution was stirred at room temperature to form a homogeneous mixture upon which it was filtered through a 0.2 micrometer PTFE filter. Table 10 summarizes the prepared block copolymer coating formulations containing SAP additives.

TABLE 10

| | | | | | | | Coating Formulation | | | | | |
|---|---|---|---|---|---|---|---|---|---|---|---|---|
| Example | BCP Ex. | BPC Name | BCP Type | Each Block Mn (NMR) (k = x1000) | SAP Name | SAP Example | BCP Stock Sol'n (g) | SAP Stock Sol'n (g) | SAP (mg) | BCP (g) | PGMEA (g) | SAP wt % of total solids |
| 53 | 1 | DBP1 | Diblock | 6.2k-7.7k | SAP1-40 | 28 | 0.833 | 0.042 | 0.504 | 0.01 | 0.865 | 5 |
| 54 | 1 | DBP1 | Diblock | 6.2k-7.7k | SAP1-60 | 29 | 0.833 | 0.042 | 0.504 | 0.01 | 0.865 | 5 |
| 55 | 1 | DBP1 | Diblock | 6.2k-7.7k | SAP1-80 | 30 | 0.833 | 0.042 | 0.504 | 0.01 | 0.865 | 5 |
| 56 | 1 | DBP1 | Diblock | 6.2k-7.7k | SAP1-90 | 31 | 0.833 | 0.042 | 0.504 | 0.01 | 0.865 | 5 |
| 57 | 1 | DBP1 | Diblock | 6.2k-7.7k | SAP1-80 | 30 | 0.833 | 0.025 | 0.300 | 0.01 | 0.848 | 3 |
| 58 | 1 | DBP1 | Diblock | 6.2k-7.7k | SAP1-80 | 30 | 0.833 | 0.083 | 0.996 | 0.01 | 0.905 | 10 |
| 59 | 1 | DBP1 | Diblock | 6.2k-7.7k | SAP1-90 | 31 | 0.833 | 0.025 | 0.300 | 0.01 | 0.848 | 3 |
| 60 | 1 | DBP1 | Diblock | 6.2k-7.7k | SAP1-90 | 31 | 0.833 | 0.083 | 0.996 | 0.01 | 0.905 | 10 |
| 61 | 2 | DBP2 | Diblock | 10.0k-14.3k | SAP1-80 | 30 | 0.833 | 0.012 | 0.144 | 0.01 | 0.865 | 1.5 |
| 62 | 3 | TBP1 | Triblock | 7.05k-11.5k-7.05k | SAP1-80 | 30 | 0.833 | 0.008 | 0.096 | 0.01 | 0.831 | 1 |
| 63 | 3 | TBP1 | Triblock | 7.05k-11.5k-7.05k | SAP1-80 | 30 | 0.833 | 0.025 | 0.300 | 0.01 | 0.848 | 3 |
| 64 | 3 | TBP1 | Triblock | 7.05k-11.5k-7.05k | SAP2-60 | 32 | 0.833 | 0.025 | 0.300 | 0.01 | 0.848 | 3 |
| 65 | 3 | TBP1 | Triblock | 7.05k-11.5k-7.05k | SAP3-80 | 33 | 0.833 | 0.042 | 0.504 | 0.01 | 0.865 | 5 |

Thin film self-assembly of formulated block copolymer compositions on UL-1 to UL-14.

Examples 66-78

The following general procedure was used to prepare thin films of formulated block copolymers on UL-1 to UL-14 substrates. A selected coating formulation prepared in Examples 53-65 was spin coated on a selected underlayer coated substrate of Examples 34-47 at a spin rate of 2000 rpm. The coated wafer was then baked (annealed) at a temperature of 140° C. or 170° C. for 5 minutes and immediately cooled to room temperature. The formulated block copolymer films were characterized by atomic force microscopy (AFM) using a Digital Instruments 3100 AFM with a 1 N/m spring constant silicon nitride cantilever operated in a tapping mode. Scan size and speed were set at 2 micrometer×2 micrometer area and 1 Hz respectively.

Table 11 summarizes the coating and annealing conditions of the films prepared in Examples 66-78.

TABLE 11

| | | | BCP Thin Film layer for Self-Assembly | | | | Coating/Annealing Conditions | | |
|---|---|---|---|---|---|---|---|---|---|
| Film Example | Underlayer Name | Formulation Example | BCP Name | BCP Mn of each block (k = x1000) | SAP name | SAP wt % of dry solids | Spin Speed RPM | Spin time Sec | Annealing Temp ° C. | Annealing Time (min) |
| 66 | UL-2 | 53 | DBP1 | 6.2k-7.7k | SAP1-40 | 5 | 2000 | 30 | 170 | 5 |
| 67 | UL-2 | 54 | DBP1 | 6.2k-7.7k | SAP1-60 | 5 | 2000 | 30 | 170 | 5 |
| 68 | UL-2 | 55 | DBP1 | 6.2k-7.7k | SAP1-80 | 5 | 2000 | 30 | 170 | 5 |
| 69 | UL-2 | 56 | DBP1 | 6.2k-7.7k | SAP1-90 | 5 | 2000 | 30 | 170 | 5 |
| 70 | UL-2 | 57 | DBP1 | 6.2k-7.7k | SAP1-80 | 3 | 2000 | 30 | 170 | 5 |
| 71 | UL-2 | 58 | DBP1 | 6.2k-7.7k | SAP1-80 | 10 | 2000 | 30 | 170 | 5 |
| 72 | UL-2 | 59 | DBP1 | 6.2k-7.7k | SAP1-90 | 3 | 2000 | 30 | 140 | 5 |
| 73 | UL-2 | 60 | DBP1 | 6.2k-7.7k | SAP1-90 | 10 | 2000 | 30 | 140 | 5 |
| 74 | UL-16 | 61 | DBP2 | 10k-14.2k | SAP1-80 | 1.5 | 2000 | 30 | 170 | 5 |
| 75 | UL-2 | 62 | TBP1 | 7.05k-11.5k-7.05k | SAP1-80 | 1 | 2000 | 30 | 140 | 5 |
| 76 | UL-2 | 63 | TBP1 | 7.05k-11.5k-7.05k | SAP1-80 | 3 | 2000 | 30 | 140 | 5 |
| 77 | UL-2 | 64 | TBP1 | 7.05k-11.5k-7.05k | SAP2-60 | 3 | 2000 | 30 | 140 | 5 |
| 78 | UL-2 | 65 | TBP1 | 7.05k-11.5k-7.05k | SAP3-80 | 5 | 2000 | 30 | 140 | 5 |

Table 12 summarizes the atomic force microscopy height images obtained with the self-assembled films prepared on various underlayers and the morphologies obtained by self-assembly. "I/H" means islands/holes (not desirable). "Partially ⊥ lamellae" means about 20% to less than 70% of the regions of the film contained perpendicular lamellae (not desirable). "⊥ lamellae" means 95% to 100% of the regions of the film contained perpendicular lamellae (most desirable). "Flat" means there was no discernible structure in the film.

TABLE 12

| | | | | Self-Assembled Thin Film Layer | | | | |
|---|---|---|---|---|---|---|---|---|
| Example | Underlayer Name | Underlayer Polymer | Formulation Example | BCP Name | BCP Each Block Mn (k = x1000) | SAP Name | SAP wt % of dry solids | Thin Film Morphology |
| 66 | UL-2 | G1-2 | 53 | DBP1 | 6.2k-7.7k | SAP1-40 | 5 | I/H |
| 67 | UL-2 | G1-2 | 54 | DBP1 | 6.2k-7.7k | SAP1-60 | 5 | I/H |
| 68 | UL-2 | G1-2 | 55 | DBP1 | 6.2k-7.7k | SAP1-80 | 5 | ⊥ lamellae |
| 69 | UL-2 | G1-2 | 56 | DBP1 | 6.2k-7.7k | SAP1-90 | 5 | Partially ⊥ lamellae |
| 70 | UL-2 | G1-2 | 57 | DBP1 | 6.2k-7.7k | SAP1-80 | 3 | Partially ⊥ lamellae |
| 71 | UL-2 | G1-2 | 58 | DBP1 | 6.2k-7.7k | SAP1-80 | 10 | I/H |
| 72 | UL-2 | G1-2 | 59 | DBP1 | 6.2k-7.7k | SAP1-90 | 3 | I/H |
| 73 | UL-2 | G1-2 | 60 | DBP1 | 6.2k-7.7k | SAP1-90 | 10 | ⊥ lamellae |
| 74 | UL-16 | NLD-328J | 61 | DBP-2 | 10k-14.2k | SAP1-80 | 1.5 | ⊥ lamellae |
| 75 | UL-2 | G1-2 | 62 | TBP1 | 7.05k-11.5k-7.05k | SAP1-80 | 1 | Partially ⊥ lamellae |
| 76 | UL-2 | G1-2 | 63 | TBP1 | 7.05k-11.5k-7.05k | SAP1-80 | 3 | ⊥ lamellae |
| 77 | UL-2 | G1-2 | 64 | TBP1 | 7.05k-11.5k-7.05k | SAP2-60 | 3 | ⊥ lamellae |
| 78 | UL-2 | G1-2 | 65 | TBP1 | 7.05k-11.5k-7.05k | SAP3-80 | 5 | ⊥ lamellae |

FIGS. 3-15 are atomic force microscopy (AFM) images of the self-assembled block copolymer films of Examples 66-78, respectively. Film layers containing SAP1-80, SAP1-90, SAP2-60 and SAP3-80 produced perpendicular lamellae at SAP concentration of 1.5 wt % to 10 wt % based on total dry solids of the formulation used to prepare the SA layer. SAP1-80 was effective in producing perpendicular lamellae when used in amounts of 1.5 wt % with diblock copolymer DBP2 on underlayer UL-16. SAP1-80, SAP2-60, and SAP3-80 were effective in producing perpendicular lamellae when used in amounts of 3 wt % with triblock copolymer TBP1 on underlayer UL-2.

Graphoepitaxy Directed Self-Assembly (DSA)

Example 79

In this example, a topographic pre-pattern was formed on a neutral underlayer (UL-2) using a negative tone photoresist, followed by coating a thin film of formulated block copolymer onto the pre-pattern. The block copolymer was substantially confined to the trenches of the resist pre-pattern. The coated structure was then annealed, allowing the pre-pattern to direct self-assembly of the block copolymer.

An underlayer solution was prepared by dissolving the random graft copolymer G1-2 (0.095 g, 95 parts by weight) and p-nitrobenzyl tosylate (p-NBT, 0.005 g, 5 parts by weight) in propylene glycol monomethyl ether acetate (PGMEA, 9.90 g, 10,000 parts by weight) to form a 1.0 wt % solution based on total weight of the solution. The thermal acid generator p-NBT was added to promote the grafting and partial crosslinking of a thin film of the random graft copolymer on a silicon wafer substrate stack. The silicon wafer substrate stack comprised a silicon wafer bottom layer coated with ~30 nm thick amorphous carbon layer and 10 nm thick silicon nitride ($SiN_x$) layer. The underlayer solution was passed through a 0.2 micrometer polytetrafluoroethylene (PTFE) filter prior to spin coating the solution on the silicon wafer stack at 2000 rpm spin rate. After forming the thin film, the coated wafer was baked at 200° C. for 3 minutes and cooled to room temperature. The initial baked thin film (underlayer) had a thickness of 20 nm, measured with a Nanospec Reflectometer. The underlayer was then given a solvent rinse by casting PGMEA on top of the coated wafer, letting the solvent puddle for 30 seconds, and spin drying the treated wafer at 2000 rpm for 30 seconds. The rinse was intended to remove any excess random graft copolymer that was not crosslinked or grafted to the wafer surface. The final film thickness of the underlayer was 10 nm after the solvent rinse.

Next, a 60 nm thick layer of a commercial 193 nm negative-tone photoresist (JSR ARF7210JN-8) was disposed on this underlayer coated substrate followed by post application bake at 80° C. for 60 seconds. The photoresist layer was then exposed using a 193 nm immersion interference tool (IBM NEMO) with fixed dose of 4.67 mJ, baked at 95° C. for 60 sec, and developed for 60 seconds with 2-heptanone developer. The resulting 200 nm pitch patterned photoresist layer was then hard baked at 200° C. for 3 min prior to coating a block copolymer formulation.

The block copolymer formulation was prepared as follows. Diblock copolymer DBP1 (0.01 g) was dissolved in PGMEA (1.24 g, 10,000 parts by weight) to form a 0.8 wt % stock solution of the block copolymer based on total weight of the solution. The solution was passed through a 0.2 micrometer polytetrafluoroethylene (PTFE) filter. A separate stock solution was prepared by dissolving SAP1-80 additive (0.1 g) in PGMEA (12.4 g) at 0.8 wt % SAP based on total weight of the solution. The SAP solution was passed through a 0.2 micrometer PTFE filter. A desired amount of SAP stock solution (see Table 13) was added to the block copolymer solution and the mixture was stirred well to form a homogenous solution. The resulting solution containing block copolymer and SAP was spin coated on the patterned photoresist substrate described above. After spin coating, the coated wafer was baked at a 170° C. for 5 minutes, and immediately cooled to room temperature. The self-assembled domains of the block copolymer inside the guiding pre-pattern trenches were analyzed with top down and cross section SEM. The samples were etched with tetrafluoroethylene ($CF_4/H_2$) gas using RIE for 5 seconds on the top surface for top-down SEM and were subjected to perpendicular etch for 8 seconds at the cross section of the film for cross-section SEM. The samples were subjected to 20 seconds of Au sputtering with 20 mA current prior to SEM imaging.

Table 12 summarizes the block copolymer formulation of Example 79.

TABLE 13

| | | | | | | Coating Formulation | | | | |
| | | | | | | SAP Stock Sol'n 0.8 wt % | | SAP Sol'n | | | SAP wt % |
| | | BCP Solution | | | | | | | | | |
| Example | UL Name | BCP Example. | BCP Name | SAP Ex. | SAP Name | Sol'n (g) | Amount (g) | BCP (g) | SAP (mg) | PGMEA (g) | of dry solids |
|---|---|---|---|---|---|---|---|---|---|---|---|
| 79 | UL-2 | 1 | DBP1 | 27 | SAP1-80 | 1.250 | 0.1075 | 0.01 | 0.860 | 1.347 | 8.6 |

Figure 16:
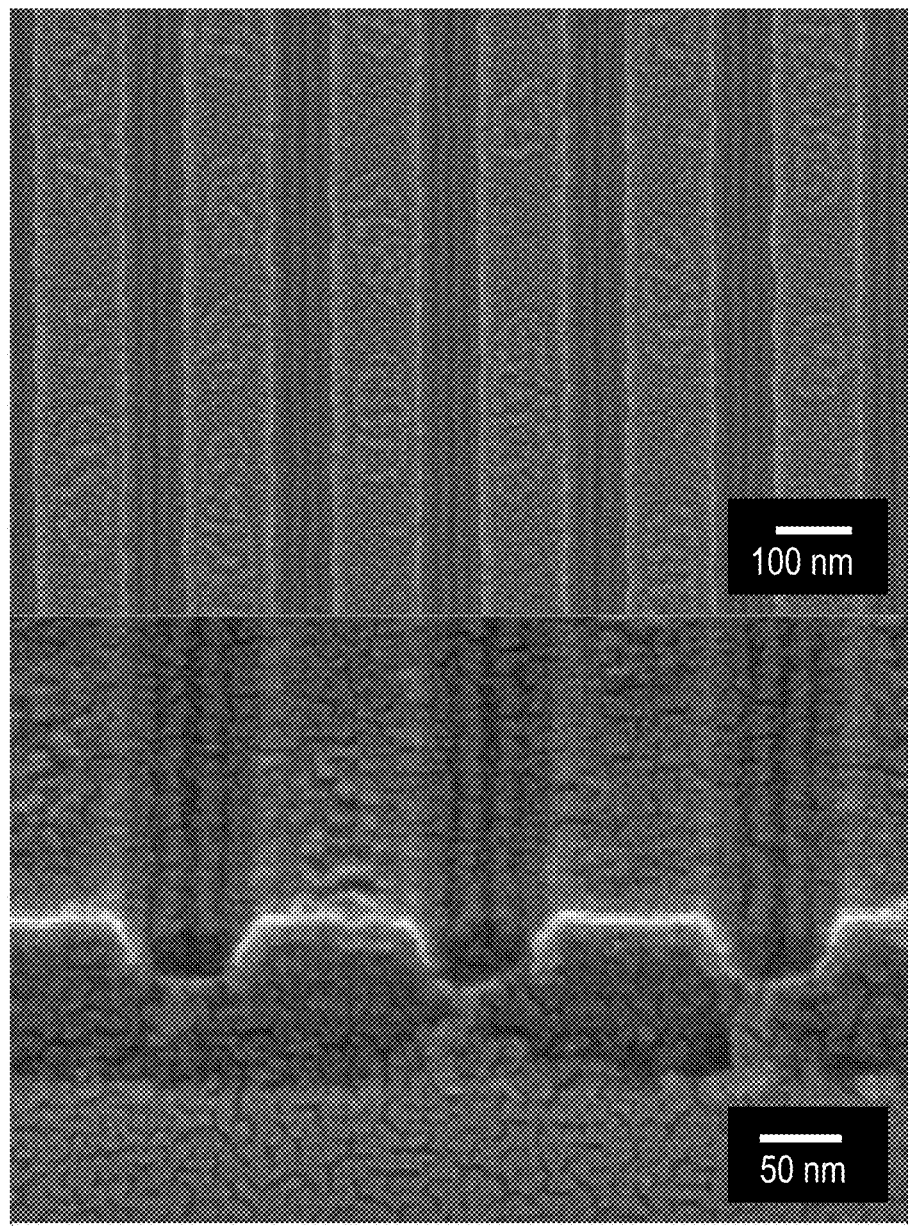
FIG. 16 is a set of AFM height images at two magnifications of the self-assembled block copolymer film of Example 79.

FIG. 16 is a set atomic force microscopy (AFM) images at two magnifications of the self-assembled block copolymer film of Example 79, showing perpendicular lamellae were formed in the trench areas of the resist pattern.

Block copolymer formulations without SAP additives

Examples 80-82 (Comparative)

Coating formulations using the block copolymers of Examples 1-3 were prepared without SAP additives. The following general procedure is representative. A 1.2 wt % solution of block copolymer in PGMEA was prepared as described above, and the resulting solution was filtered through a 0.2 micrometer PTFE filter.

Table 14 summarizes the block copolymer formulations of Examples 80-82 prepared without SAP additive.

TABLE 14

| Example | BCP Example | BCP Name | BCP amount (g) | PGMEA (g) | Coating Formulation wt % BCP |
|---|---|---|---|---|---|
| 80 | 1 | DBP1 | 0.01 | 0.83 | 1.2 |
| 81 | 2 | DBP-2 | 0.01 | 0.83 | 1.2 |
| 82 | 3 | TBP1 | 0.01 | 0.83 | 1.2 |

Thin-film self-assembly of block copolymers formulations without SAP additives

Examples 83-85 (Comparative)

The following general procedure was used to prepare thin films of block copolymer formulation Examples 80-82 lacking the SAP additive on various underlayer coated substrates. The coating formulation solution was spin coated on the underlayer coated substrates at the desired spin rate (Table 15). After forming the thin film, the coated wafer was baked at the specified time and temperatures and immediately cooled to room temperature. The block copolymer films were characterized by atomic force microscopy (AFM) using a Digital Instruments 3100 AFM with a 1 N/m spring constant silicon nitride cantilever operated in a tapping mode. Scan size and speed were set at 2 micrometers×2 micrometers area and 1 Hz respectively.

Table 15 summarizes the coating and annealing conditions used in Examples 83-85 and the resulting morphologies of the block copolymer thin film after self-assembly.

TABLE 15

| | | | | Coating and BCP Annealing conditions | | | | |
|---|---|---|---|---|---|---|---|---|
| Example | Underlayer | BCP Formulation Example | BCP Name | Spin speed RPM | Spin time (Sec) | Annealing temp (° C.) | Annealing time (min) | BCP Morphology |
| 83 | UL-2 | 80 | DBP1 | 2000 | 30 | 170 | 5 | I/H |
| 84 | UL-16 | 81 | DBP2 | 2000 | 30 | 170 | 5 | I/H |
| 85 | UL-2 | 82 | TBP1 | 2000 | 30 | 170 | 5 | Flat |

Figure 17:
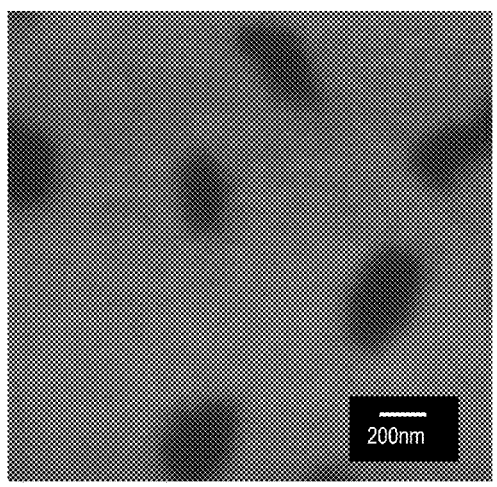
FIG. 17 is an AFM height image of the self-assembled block copolymer film of Example 83.
Figure 18:
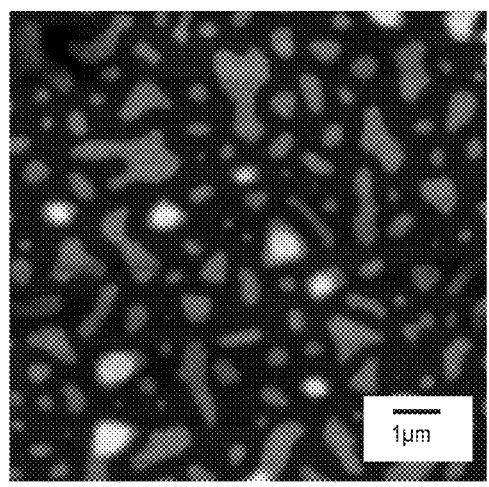
FIG. 18 is an AFM height image of the self-assembled block copolymer film of Example 84.
Figure 19:
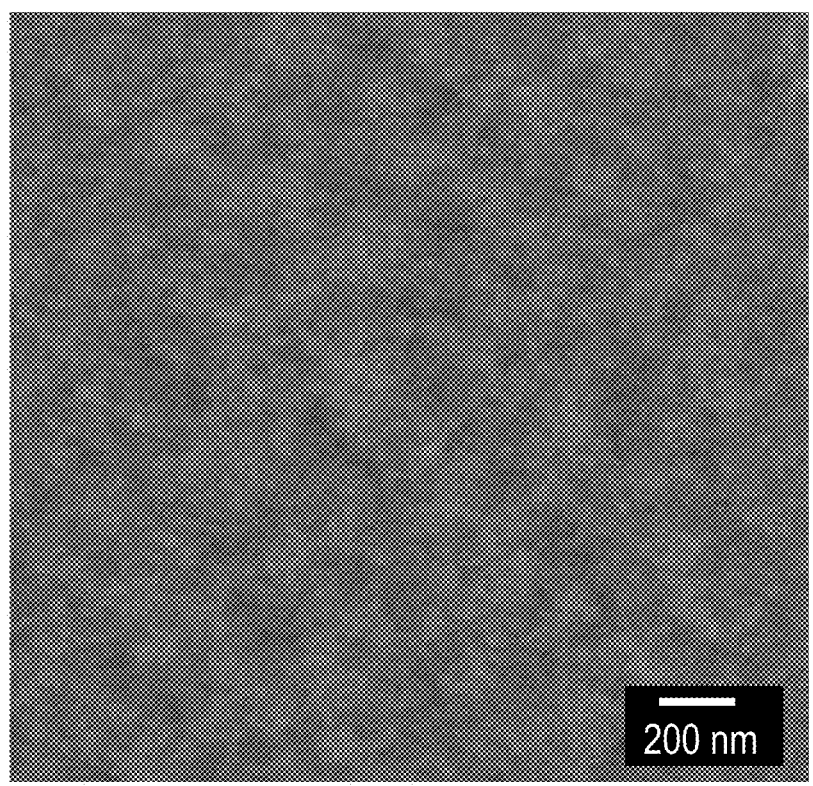
FIG. 19 is an AFM height image of the self-assembled block copolymer film of Example 85.
Figure 20:
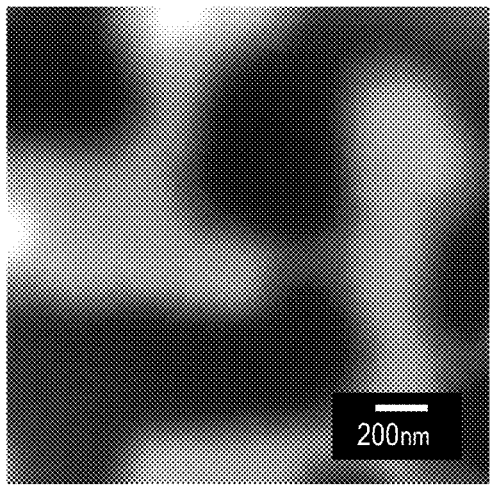
FIG. 20 is an AFM height image of the self-assembled block copolymer film of Example 86.
Figure 21:
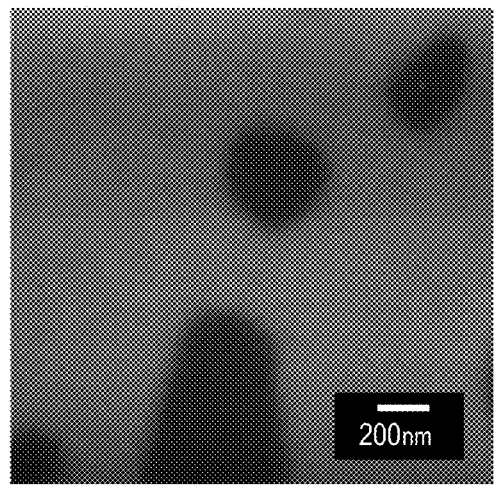
FIG. 21 is an AFM height image of the self-assembled block copolymer film of Example 87.
Figure 22:
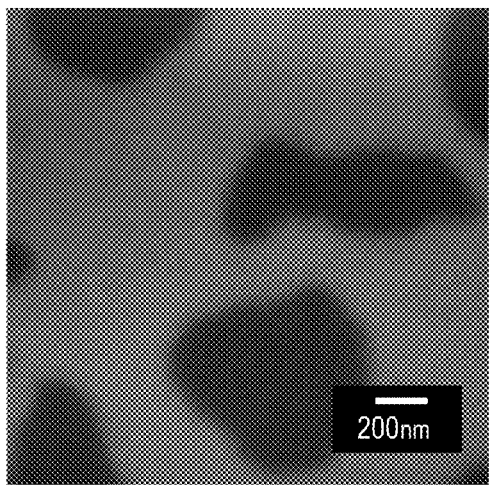
FIG. 22 is an AFM height image of the self-assembled block copolymer film of Example 88.
Figure 23:
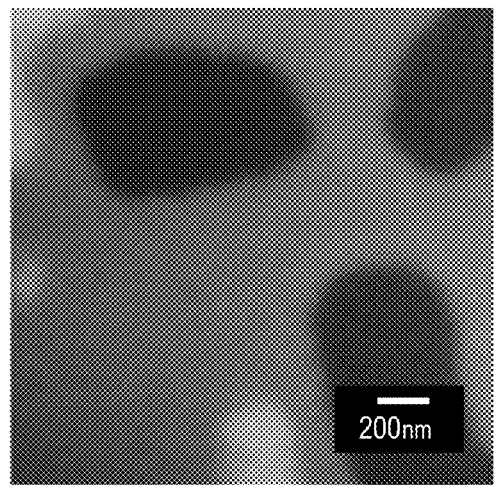
FIG. 23 is an AFM height image of the self-assembled block copolymer film of Example 89.
Figures 24, 25, 26:
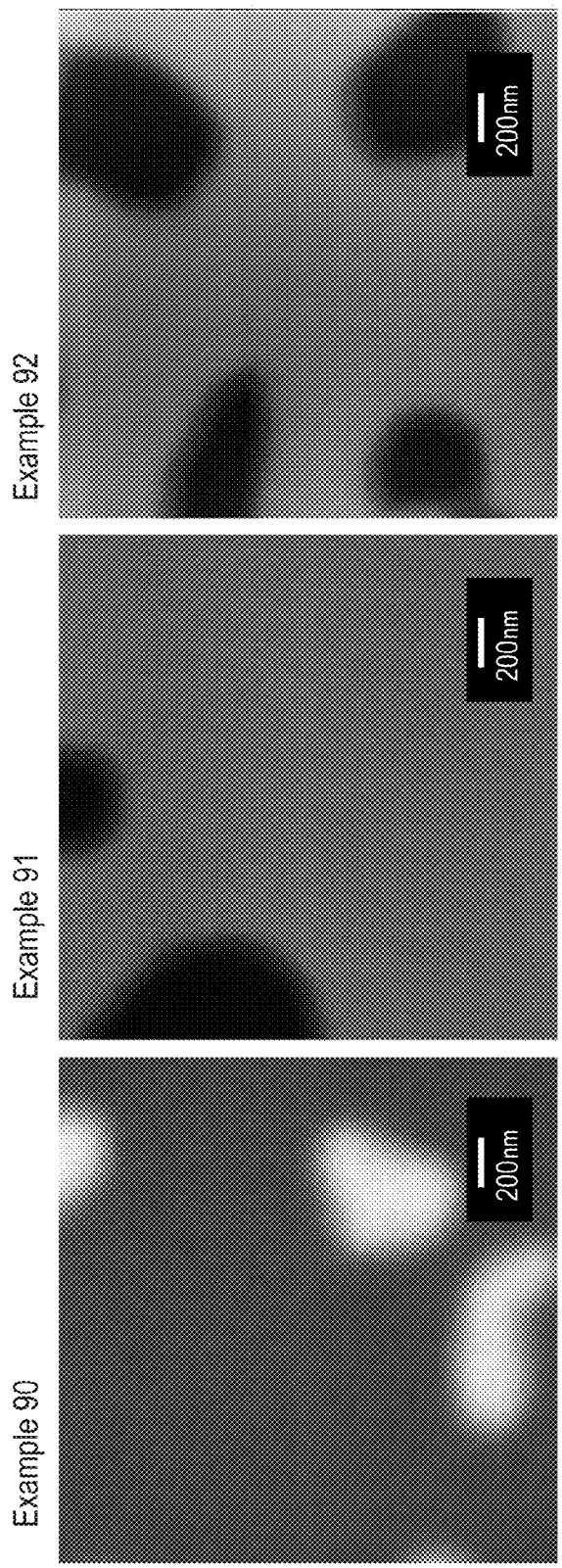
FIG. 24 is an AFM height image of the self-assembled block copolymer film of Example 90.
FIG. 25 is an AFM height image of the self-assembled block copolymer film of Example 91.
FIG. 26 is an AFM height image of the self-assembled block copolymer film of Example 92.
Figure 27:
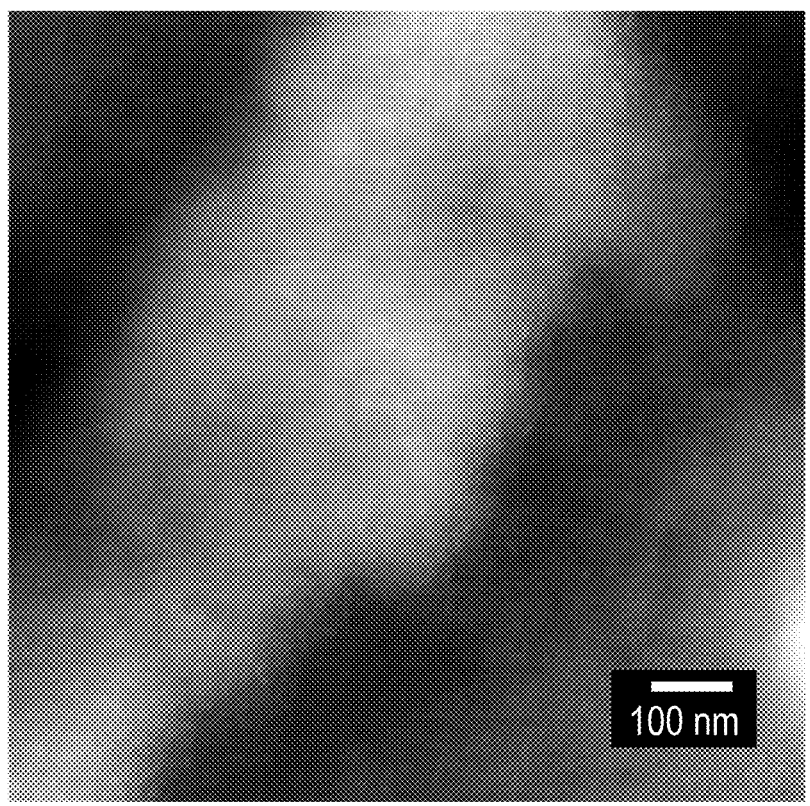
FIG. 27 is an AFM height image of the self-assembled block copolymer film of Example 93.

Each of the films of Table 15 displayed island/hole or parallel cylinder morphology (undesirable). FIGS. 17-19 are AFM height images of Examples 83-85, respectively.

Oleic Acid as Surface Active Material

Examples 86-93 (Comparative)

Thin film preparation and characterization of formulated block copolymer compositions with oleic acid or decafluorosuberic acid (DFS) as additives on substrates having underlayer UL-3.

The following general procedure was used to prepare thin films of formulated diblock copolymer DBP1 (Example 1) with oleic acid or decafluorosuberic acid (DFS) on UL-2 substrates. A solution of DBP1 was prepared by dissolving the block copolymer (0.01 g) in PGMEA (0.823 g) to form a 1.2 wt % solution based on total dry solids. The solutions were passed through a 0.2 micrometer polytetrafluoroethylene (PTFE) filter. A desired amount of oleic acid or decafluorosuberic acid (DFS) was added to the block copolymer solutions made above and the mixture was stirred well to form a homogenous solution prior to spin coating the formulated block copolymer solution on the underlayer coated substrates at the desired spin rate. After forming the thin film, the coated wafer was baked at a specified time and temperature (Table 16) and immediately cooled to room temperature. The formulated block copolymer films were characterized by atomic force microscopy (AFM) using a Digital Instruments 3100 AFM with a 1 N/m spring constant silicon nitride cantilever operated in a tapping mode. Scan size and speed were set at 2 micrometer×2 micrometer area and 1 Hz respectively.

Table 16 summarizes the formulated block copolymer thin film self-assembly on UL-2 and the obtained morphologies. All the samples of Table 16 showed island/hole (I/H) morphology. FIGS. 20-27 are AFM height images of Examples 86-93, respectively.

TABLE 16

| | | Block | | | | Annealing Conditions | | | | |
|---|---|---|---|---|---|---|---|---|---|---|
| Example | UL Name | Block Copolymer | Copolymer Conc. (wt %) | Additive Name | Additive wt % of dry solids | Spin Speed RPM | Spin time (Sec) | Annealing Temp ° C. | Annealing Time (min) | Thin Film Morphology |
| 86 | UL-3 | DBP1 | 1.2 | Oleic Acid | 1 | 2000 | 30 | 140 | 5 | I/H |

TABLE 16-continued

| Example | UL Name | Block Copolymer | Block Copolymer Conc. (wt %) | Additive Name | Additive wt % of dry solids | Spin Speed RPM | Spin time (Sec) | Annealing Temp ° C. | Annealing Time (min) | Thin Film Morphology |
|---|---|---|---|---|---|---|---|---|---|---|
| 87 | UL-3 | DBP1 | 1.2 | Oleic Acid | 5 | 2000 | 30 | 140 | 5 | I/H |
| 88 | UL-3 | DBP1 | 1.2 | Oleic Acid | 10 | 2000 | 30 | 140 | 5 | I/H |
| 89 | UL-3 | DBP1 | 1.2 | Oleic Acid | 20 | 2000 | 30 | 140 | 5 | I/H |
| 90 | UL-3 | DBP1 | 1.2 | DFS | 5 | 2000 | 30 | 140 | 5 | I/H |
| 91 | UL-3 | DBP1 | 1.2 | DFS | 10 | 2000 | 30 | 140 | 5 | I/H |
| 92 | UL-3 | DBP1 | 1.2 | DFS | 20 | 2000 | 30 | 140 | 5 | I/H |
| 93 | UL-3 | TBP1 | 1.2 | Oleic Acid | 5 | 2000 | 30 | 170 | 5 | I/H |

These results indicate that the surface active non-fluorinated carboxylic acid (oleic acid) and the fluorinated carboxylic acid (DFS) were not effective additives in forming perpendicular oriented lamellae.

Examples 94-95 (Comparative)

Thin film preparation using SAP additives having only non-fluorinated hydrogen-bond donating groups (Example 94) or only fluorinated non-hydrogen-bond donating groups (Example 95). The substrates utilized underlayer UL-2.

Figure 28:
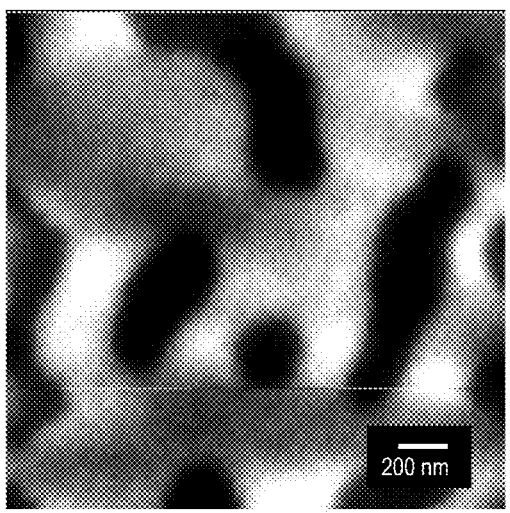
FIG. 28 is an AFM height image of the self-assembled block copolymer film of Example 94.
Figure 29:
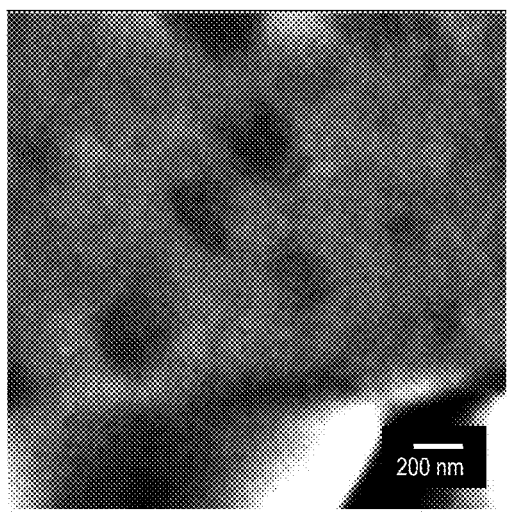
FIG. 29 is an AFM height image of the self-assembled block copolymer film of Example 95.

A solution of DBP1 was prepared by dissolving the block copolymer (0.01 g) in PGMEA (0.823 g) to form a 1.2 wt % solution based on total dry solids. The solutions were passed through a 0.2 micrometer polytetrafluoroethylene (PTFE) filter. A desired amount of poly(4-hydroxystyrene) (PHOST, Nippon Soda Company Ltd., Mn=5480, PDI=1.08) or PSAP1-80 from Example 25 (before deprotection) was added to the block copolymer solutions made above and the mixture was stirred well to form a homogenous solution prior to spin coating the formulated block copolymer solution on the underlayer coated substrates at the desired spin rate. After forming the thin film, the coated wafer was baked at the desired time and temperatures and immediately cooled to room temperature. The formulated block copolymer films were characterized by atomic force microscopy (AFM) using a Digital Instruments 3100 AFM with a 1 N/m spring constant silicon nitride cantilever operated in a tapping mode. Scan size and speed were set at 2 micrometer×2 micrometer area and 1 Hz respectively. Table 17 summarizes the formulated block copolymer thin film self-assembly on UL-2 and the obtained morphologies. The samples of Table 17 showed either island/hole or partially perpendicular lamellae morphology. FIGS. 28-29 are AFM height images of Examples 94-95, respectively.

TABLE 17

| Example | UL Name | Block Copolymer | Block Copolymer Conc. (wt %) | Additive Name | Additive wt % of dry solids | Spin Speed RPM | Spin time Sec | Annealing Temp ° C. | Annealing Time (min) | Thin Film Morphology |
|---|---|---|---|---|---|---|---|---|---|---|
| 94 | UL-2 | DBP1 | 1.2 | PHOST | 5 | 2000 | 30 | 140 | 5 | I/H |
| 95 | UL-2 | DBP1 | 1.2 | PSAP1-80 Example 25 | 5 | 2000 | 30 | 140 | 5 | Partially ⊥ lamellae |

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. When a range is used to express a possible value using two numerical limits X and Y (e.g., a concentration of X ppm to Y ppm), unless otherwise stated the value can be X, Y, or any number between X and Y.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and their practical application, and to enable others of ordinary skill in the art to understand the invention.

What is claimed is:

1. A composition, comprising:
   i) a solvent;
   ii) a block copolymer comprising:
      a) a first block comprising a repeat unit of formula (B-1):

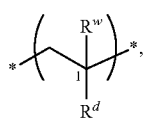

(B-1)

wherein I) $R^w$ is a monovalent radical selected from the group consisting of H, methyl, ethyl, and trifluoromethyl (*—$CF_3$) and II) $R^d$ is a monovalent radical comprising an aromatic ring linked to carbon 1, and
      b) an aliphatic polycarbonate second block (polycarbonate block) linked to the first block; and
   iii) a surface active polymer (SAP), comprising:
      about 40 mol % to about 90 mol %, based on total moles of monomers used to prepare the SAP, of a fluorinated repeat unit (first repeat unit), wherein the first repeat unit has a chemical structure having no functionality capable of donating a hydrogen to form a hydrogen bond,
      about 10 mol % to about 60 mol %, based on total moles of monomers used to prepare the SAP, of a non-fluorinated second repeat unit comprising a functional group selected from the group consisting of alcohols, carboxylic acids, phosphonic acids, and sulfonic acids;
   wherein
      the block copolymer and the SAP are dissolved in the solvent.

2. The composition of claim 1, wherein the composition is suitable for forming a layer for self-assembly (SA layer) disposed on an underlayer of a substrate,
wherein
   the SA layer comprises the block copolymer and the SAP in non-covalent association,
   the SA layer has a top surface in contact with an atmosphere,
   the underlayer is neutral wetting to the block copolymer,
   the block copolymer of the SA layer is capable of self-assembly to form a phase separated domain pattern having a characteristic pitch Lo,
   the domain pattern comprises alternating domains comprising respective chemically distinct blocks of the block copolymer,
   each of the domains has contact with the underlayer and the atmosphere, and
   a domain comprising the polycarbonate block (polycarbonate domain) has a higher concentration of the SAP compared to a domain comprising the first block of the block copolymer.

3. The composition of claim 2, wherein the polycarbonate domain has lower surface energy compared to an otherwise identical polycarbonate domain lacking the SAP.

4. The composition of claim 2, wherein the domain pattern comprises lamellar domains, and each of the lamellar domains has a perpendicular orientation to the underlayer.

5. The composition of claim 2, wherein the domain pattern comprises cylindrical domains, and each of the cylindrical domains has a central axis oriented perpendicular to the underlayer.

6. The composition of claim 1, wherein the SAP is a random copolymer.

7. The composition of claim 1, wherein the first repeat unit of the SAP is selected from the group consisting of

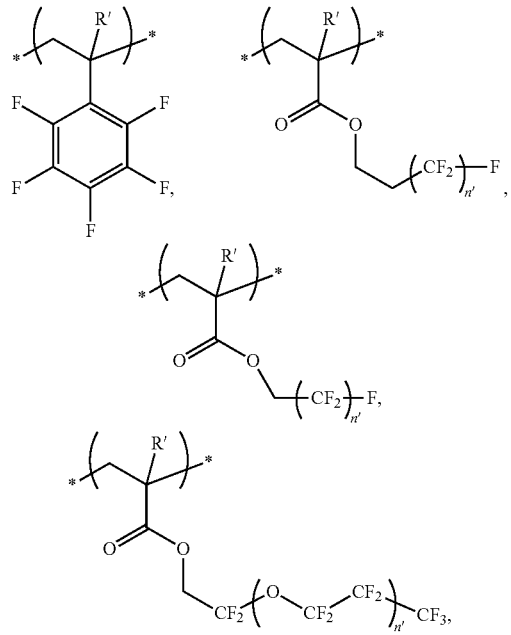

and combinations thereof, wherein each R' is independently selected from the group consisting of *—H, *-Me, *-Et, and *—$CF_3$, and each n' is an independent integer having a value of 1 to 12.

8. The composition of claim 1, wherein the second repeat unit is selected from the group consisting of:

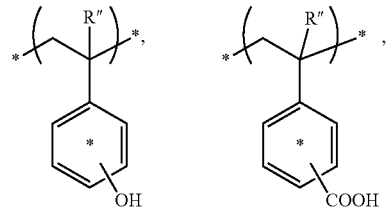

and combinations thereof, wherein each R" is independently selected from the group consisting of *—H, *-Me, *-Et.

9. The composition of claim 1, wherein the polycarbonate block of the block copolymer comprises a trimethylene carbonate repeat unit of structure:

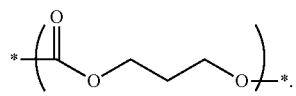

10. The composition of claim 9, wherein the polycarbonate block of the block copolymer is a homopolymer of the trimethylene carbonate repeat unit.

11. The composition of claim 1, wherein the polycarbonate block of the block copolymer comprises an ester bearing carbonate repeat unit formula (B-3):

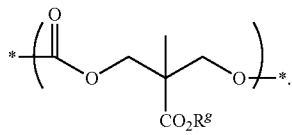

(B-3)

wherein $R^g$ is a monovalent hydrocarbon group comprising 1-20 carbons.

12. The composition of claim 11, wherein $R^g$ is selected from the group consisting of methyl, ethyl, propyl, and benzyl.

13. The composition of claim 11, wherein the polycarbonate block of the block copolymer is a homopolymer of the ester bearing carbonate repeat unit.

14. The composition of claim 1, wherein the first block of the block copolymer comprises repeat units of structure:

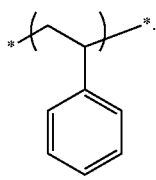

15. The composition of claim 1, wherein the first block of the block copolymer is poly(styrene) (PS) and the second block of the block copolymer is poly(trimethylene carbonate) (PTMC).

16. The composition of claim 1, wherein the block copolymer is a triblock copolymer.

17. The composition of claim 15, wherein the triblock copolymer comprises a divalent central poly(styrene) (PS) block linked at each end to two poly(trimethylene carbonate) (PTMC) blocks.

18. The composition of claim 1, wherein the composition comprises the SAP in an amount of more than 0 wt %, and up to about 10 wt % based on a total dry solids weight of the composition.

19. The composition of claim 1, wherein the composition comprises the SAP in an amount of 0.1 wt % to about 5 wt % based on total dry solids of the composition.

20. A method, comprising:
providing a first layered structure comprising a top layer (underlayer);
disposing the composition of claim 1 on the underlayer and removing any solvent, thereby forming a second layered structure comprising a film layer disposed on the underlayer, wherein the film layer comprises the block copolymer and the SAP in non-covalent association, and the film layer has a top surface in contact with an atmosphere; and
allowing or inducing the block copolymer of the film layer to self-assemble, thereby forming a third layered structure comprising a phase separated domain pattern having a characteristic pitch Lo, the domain pattern comprising alternating domains comprising respective chemically distinct blocks of the block copolymer;
wherein
each of the domains has contact with the underlayer and the atmosphere, and
a domain comprising the polycarbonate block has a higher concentration of the SAP compared to a domain comprising the first block of the block copolymer.

21. The method of claim 20, comprising selectively etching one of the domains, thereby forming a fourth layered structure comprising an etched domain pattern comprising one or more remaining domains.

22. The method of claim 20, wherein the underlayer is neutral wetting to the domains of the self-assembled block copolymer.

23. The method of claim 20, comprising transferring the etched domain pattern to the substrate using a wet and/or dry etch process.

24. The composition of claim 20, wherein the domain pattern is a lamellar domain pattern, and lamellae of each of the domains are oriented perpendicular to a main plane of the underlayer.

25. The method of claim 20, wherein the domain pattern is a cylindrical domain pattern comprising cylindrical domains having a central axis oriented perpendicular to a main plane of the underlayer.

26. The method of claim 20, wherein the underlayer comprises a poly(styrene-r-methyl methacrylate) random copolymer.

27. The method of claim 20, wherein the underlayer comprises a random copolymer comprising:

a first repeat of structure:

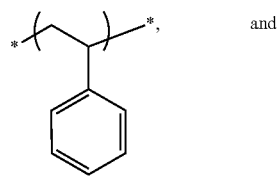 and a second repeat unit of structure

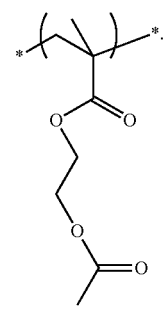

28. The method of claim 20, wherein the underlayer comprises a random copolymer comprising:

a first repeat of structure:

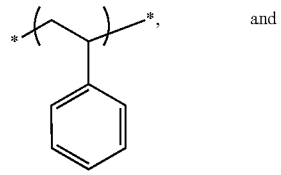 and a second repeat unit of structure

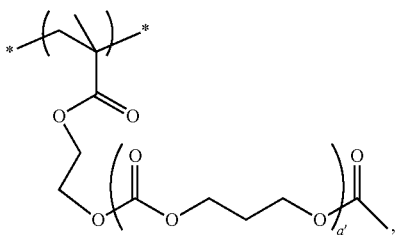

wherein a' has a value greater than or equal to 1.

29. The method of claim 20, comprising baking the film layer at a temperature of about 80° C. to about 220° C. for a period of time, thereby inducing the block copolymer to self-assemble.

30. The method of claim 20, wherein a domain comprising the first block of the block copolymer has a top surface in contact with the atmosphere and the top surface is essentially free of the SAP.

31. The method of claim 20, wherein the method comprises forming a topographic resist pattern disposed on the underlayer before said disposing the composition of claim 1, wherein the film layer comprising the block copolymer for self-assembly is substantially confined to recessed regions of the topographic resist pattern.

32. A method, comprising:
providing a first layered structure comprising a top layer (underlayer);
forming a topographical resist pattern disposed on the underlayer, the resist pattern comprising features having recessed regions, the recessed regions having a bottom surface which is a portion of a surface of the underlayer;
disposing the composition of claim 1 substantially in the recessed regions of the resist pattern and removing any solvent, thereby forming a second layered structure comprising a film layer, the film layer comprising the block copolymer and the SAP, wherein the film layer is in contact with the bottom surface, the bottom surface is neutral wetting to the block copolymer, and the film layer has a top surface in contact with an atmosphere; and
allowing or inducing the block copolymer to self-assemble, thereby forming a third layered structure comprising a pattern of phase separated domains (domain pattern) of the block copolymer in the recessed regions, wherein each of the domains is in contact with the bottom surface and the atmosphere, and each of domains is oriented perpendicular to a main plane of the underlayer.

33. The method of claim 32, comprising selectively removing the resist pattern and/or one of the domains, thereby forming a fourth layered structure comprising an etched domain pattern, the etched domain pattern comprising one or more remaining domains.

34. The method of claim 32, wherein the resist pattern is formed using a negative tone resist.

* * * * *